US012660451B2

(12) United States Patent 
Lee et al.

(10) Patent No.: US 12,660,451 B2 
(45) Date of Patent: Jun. 16, 2026

(54) DISPLAY APPARATUS

(71) Applicant: Samsung Display Co., LTD., Yongin-si (KR)

(72) Inventors: Sunhwa Lee, Yongin-si (KR); Hyeongseok Kim, Yongin-si (KR); Heejean Park, Yongin-si (KR); Mukyung Jeon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/910,486

(22) Filed: Oct. 9, 2024

(65) Prior Publication Data

US 2025/0126997 A1 Apr. 17, 2025

(30) Foreign Application Priority Data

Oct. 11, 2023 (KR) ........................ 10-2023-0135409

(51) Int. Cl. 
*G09G 3/00* (2006.01) 
*G09G 3/3233* (2016.01) 
(Continued)

(52) U.S. Cl. 
CPC ........... *H10K 59/131* (2023.02); *G09G 3/035* (2020.08); *G09G 3/3233* (2013.01); 
(Continued)

(58) Field of Classification Search 
CPC ........... H10K 59/131; H10K 2102/311; H10K 77/111; G09G 3/035; G09G 3/3233; 
(Continued)

(56) References Cited

U.S. PATENT DOCUMENTS 10,235,934 B2 3/2019 Woo et al. 
11,108,005 B2 8/2021 Sun et al. 
(Continued)

FOREIGN PATENT DOCUMENTS

CN 109119039 A 1/2019 
CN 111341813 A * 6/2020 ........... H10H 29/142 
(Continued)

OTHER PUBLICATIONS

English Translation, CN 111341813 A), Jun. 26, 2020.*

(Continued)

*Primary Examiner* — Ricardo Osorio 
(74) *Attorney, Agent, or Firm* — CANTOR COLBURN LLP

(57) ABSTRACT

A display apparatus includes: a substrate including a display area and a non-display area surrounding the display area; a peripheral island portion located in the non-display area, and including a driver island portion and a wiring island portion, which are spaced apart from each other; a peripheral bridge portion located in the non-display area and connecting the driver island portion to the wiring island portion; a gate driving circuit located in the driver island portion and including a plurality of stages; a plurality of input lines located in the wiring island portion; and a plurality of output wirings connected to the gate driving circuit and extending toward the display area, wherein the number of output wirings of the plurality of output wirings and located on the peripheral bridge portion gradually increases as the output wirings of the plurality of output wirings is closer to the display area.

35 Claims, 43 Drawing Sheets

(51) Int. Cl.
    *H10K 59/131*       (2023.01)
    *H10K 102/00*      (2023.01)

(52) U.S. Cl.
    CPC .............. *G09G 2300/0819* (2013.01); *G09G 2300/0842* (2013.01); *G09G 2300/0861* (2013.01); *G09G 2320/0223* (2013.01); *G09G 2320/0233* (2013.01); *H10K 2102/311* (2023.02)

(58) Field of Classification Search
    CPC ... G09G 2300/0819; G09G 2300/0842; G09G 2320/0223; G09G 2320/0233; G09G 2300/0861; G09G 3/32; G09G 2310/0267; G09F 9/301
    See application file for complete search history.

(56) References Cited

U.S. PATENT DOCUMENTS

| | | | |
|---|---|---|---|
| 11,645,994 B2 | 5/2023 | Huang | |
| 2008/0018636 A1* | 1/2008 | Chang | G09G 3/3685 |
| | | | 345/204 |
| 2017/0309227 A1 | 10/2017 | Ebisuno et al. | |

| | | | |
|---|---|---|---|
| 2018/0085069 A1* | 3/2018 | Murali | A61B 5/318 |
| 2021/0376267 A1* | 12/2021 | Zhang | G06F 1/3215 |
| 2022/0140264 A1* | 5/2022 | Park | H10K 59/131 |
| | | | 257/770 |
| 2023/0232678 A1 | 7/2023 | Cho et al. | |
| 2023/0247879 A1 | 8/2023 | Cho et al. | |
| 2025/0008784 A1* | 1/2025 | Zhang | H10D 86/60 |

FOREIGN PATENT DOCUMENTS

| | | | | | |
|---|---|---|---|---|---|
| CN | 111386495 A | * | 7/2020 | ............. | G09G 3/007 |
| CN | 111341813 B | | 11/2022 | | |
| JP | 2008026900 A | * | 2/2008 | .......... | G09G 3/3685 |
| KR | 1020180078480 A | | 7/2018 | | |
| KR | 20230103640 A | * | 7/2023 | .......... | H10H 29/142 |
| KR | 1020230103640 A | | 7/2023 | | |
| KR | 1020230111703 A | | 7/2023 | | |
| KR | 1020230117011 A | | 8/2023 | | |

OTHER PUBLICATIONS

English Translation, CN 111386495, Jul. 7, 2020.*
Search Report mailed Jan. 7, 2025 in PCT Patent Application No. PCT/KR2024/015284, 8 pages.

* cited by examiner

FIG. 9

DISPLAY APPARATUS

This application claims priority to Korean Patent Application No. 10-2023-0135409, filed on Oct. 11, 2023, and all the benefits accruing therefrom under 35 U.S.C. § 119, the content of which in its entirety is herein incorporated by reference.

BACKGROUND

1. Field

One or more embodiments relate to a structure of a display apparatus, and more particularly, to a flexible display apparatus or a stretchable display apparatus.

2. Description of the Related Art

As display apparatuses that visually display electrical signals have been developed, various display apparatuses having excellent characteristics such as thin design, light weight, and low power consumption have been introduced. For example, flexible display apparatuses that may be folded or rolled up have been introduced. Recently, research and development on stretchable display apparatuses that may be changed into various shapes have been actively conducted.

SUMMARY

One or more embodiments include a display apparatus that may be stretched while minimizing a load on an output wiring. However, the embodiments are examples, and do not limit the scope of the disclosure.

Additional aspects will be set forth in part in the description which follows and, in part, will be apparent from the description, or may be learned by practice of the presented embodiments.

According to one or more embodiments, a display apparatus includes: a substrate including a display area and a non-display area surrounding the display area; a peripheral island portion located in the non-display area and including a driver island portion and a wiring island portion, which are spaced apart from each other; a peripheral bridge portion located in the non-display area and connecting the driver island portion to the wiring island portion; a gate driving circuit located in the driver island portion and including a plurality of stages; a plurality of first input lines located in the wiring island portion; and a plurality of output wirings connected to the gate driving circuit and extending toward the display area, where the number of output wirings of the plurality of output wirings and located on the peripheral bridge portion gradually increases as the output wirings of the plurality of output wirings is closer to the display area.

A width of each of the output wirings of the plurality of output wirings may gradually decrease as the output wirings of the plurality of output wirings is closer to the display area.

A width of the peripheral bridge portion in the non-display area may be constant, and the output wirings of the plurality of output wirings may be spaced apart from each other and may each have a maximum width in the peripheral bridge portion.

The driver island portion and the wiring island portion may be alternately arranged along the same row in a first direction.

The output wirings located on the peripheral bridge portion may include output wirings electrically connected to stages of the plurality of stages located in the driver island portion located in the same row as the peripheral bridge portion but farther from the display area DA than the peripheral bridge portion.

The gate driving circuit may include a first gate driving circuit to an $n^{th}$ gate driving circuit (where n is a natural number of 2 or more) sequentially arranged along the first direction, and the first gate driving circuit is an outermost gate driving circuit from among the first gate driving circuit to the $n^{th}$ gate driving circuit, and the $n^{th}$ gate driving circuit may be located closer to the display area than an $n-1^{th}$ gate driving circuit.

The driver island portion may include a first driver island portion in which the first gate driving circuit is located to an $n^{th}$ driver island portion in which the $n^{th}$ gate driving circuit is located, and the peripheral bridge portion includes a first peripheral bridge portion connected to the first driver island portion to an $n^{th}$ peripheral bridge portion connected to the $n^{th}$ driver island portion, and the first driver island, the first peripheral bridge portion, the $n^{th}$ driver island, and the $n^{th}$ peripheral bridge portion may be arranged along the same row.

In the first peripheral bridge portion, the same number of output wirings, of the plurality of output wirings, as the number of stages of the plurality of stages and located in the first driver island portion may be located.

In the $n^{th}$ peripheral bridge portion, the same number of output wirings, of the plurality of output wirings, as the number of stages of the plurality of stages and located in the first driver island portion to the $n^{th}$ driver island portion may be located.

A width of an output wiring of the plurality of output wirings and located in the $n^{th}$ peripheral bridge portion may be less than a width of an output wiring of the plurality of output wirings and located in the $n-1^{th}$ peripheral bridge portion.

In the $n^{th}$ driver island portion, pre-output wirings of the plurality of output wirings and connected to stages of the plurality of stages and located in the first driver island portion to an $n-1^{th}$ driver island portion may be located.

In the $n^{th}$ peripheral bridge portion, the pre-output wirings, and an output wiring of the plurality of output wirings and connected to a stage located in the $n^{th}$ driver island portion may be located.

The pre-output wiring located in the $n^{th}$ driver island portion may extend around an outer circumference of a stage of the plurality of stages and located in the $n^{th}$ driver island portion.

An output wiring of the plurality of output wirings and connected to the stage located in the $n^{th}$ driver island portion may be located at a center of the $n^{th}$ peripheral bridge portion, and the pre-output wirings may be located on an outer side of the $n^{th}$ peripheral bridge portion.

The pre-output wiring located in the $n^{th}$ driver island portion may extend to pass through a space defined by stages of the plurality of stages and located in the $n^{th}$ driver island portion and spaced apart from each other.

Output wirings of the plurality of output wirings connected to the stages located in the $n^{th}$ driver island portion may be located on an outer side of the $n^{th}$ peripheral bridge portion, and the pre-output wirings may be located at a center of the $n^{th}$ peripheral bridge portion.

The gate driving circuit may include at least one of an emission control driving circuit, a bypass driving circuit, an initialization driving circuit, and a data write driving circuit.

The plurality of output wirings may include at least one of an emission control output wiring configured to transmit an output signal of the emission control driving circuit, a bypass output wiring configured to transmit an output signal of the bypass driving circuit, an initialization output wiring configured to transmit an output signal of the initialization driving circuit, and a data write output wiring configured to transmit an output signal of the data write driving circuit.

In the gate driving circuit, the emission control driving circuit, the bypass driving circuit, the initialization driving circuit, and the data write driving circuit may be sequentially arranged in this order from an outer side of the display apparatus toward the display area.

The peripheral bridge portion may be provided in plurality, and in a peripheral bridge portion extending toward the display area from among the plurality of peripheral bridge portions and connected to the driver island portion in which the emission control driving circuit is located, the emission control output wiring may be located.

In a peripheral bridge portion extending toward the display area from among the plurality of peripheral bridge portions and connected to the driver island portion in which the bypass driving circuit is located, the emission control output wiring and the bypass output wiring may be located.

In a peripheral bridge portion extending toward the display area from among the plurality of peripheral bridge portions and connected to the driver island portion in which the initialization driving circuit is located, the emission control output wiring, the bypass output wiring, and the initialization output wiring may be located.

In a peripheral bridge portion extending toward the display area from among the plurality of peripheral bridge portions and connected to the driver island portion in which the data write driving circuit is located, the emission control output wiring, the bypass output wiring, the initialization output wiring, and the data write output wiring may be located.

A width of the emission control output wiring may gradually decrease in an order of a driver island portion in which the bypass driving circuit is located, a driver island portion in which the initialization driving circuit is located, and a driver island portion in which the data write driving circuit is located.

Two stages of the initialization driving circuit and two stages of the data write driving circuit may be located in the driver island portion, and one stage of the emission control driving circuit and one stage of the bypass driving circuit may be located in the driver island portion.

One stage of the initialization driving circuit and one stage of the data write driving circuit may each be located in one driver island portion, and one stage of the emission control driving circuit and one stage of the bypass driving circuit may each be located in two driver island portions.

A stage of the initialization driving circuit and a stage of the data write driving circuit may be located in one driver island portion.

The stage of the initialization driving circuit and the stage of the data write driving circuit may be configured as one stage.

The display apparatus may further include a plurality of main island portions spaced apart from each other in the display area, and a main bridge portion connecting main island portions arranged adjacent to each other from among the plurality of main island portions.

A planar area of the peripheral island portion may be greater than a planar area of one of the plurality of main island portions.

The peripheral bridge portion may extend from a center of a side of the peripheral island portion.

At least one of the plurality of stages may be located in the driver island portion.

A planar area of the peripheral island portion may be the same as a planar area of one of the plurality of main island portions.

The peripheral bridge portion may extend from a corner of the peripheral island portion.

One of the plurality of stages may be located in the driver island portion.

BRIEF DESCRIPTION OF THE DRAWINGS

The above and other aspects, features, and advantages of certain embodiments will be more apparent from the following description taken in conjunction with the accompanying drawings, in which:

FIG. 9 is a schematic diagram illustrating a configuration of a display apparatus, according to an embodiment;

DETAILED DESCRIPTION

Figure 1:
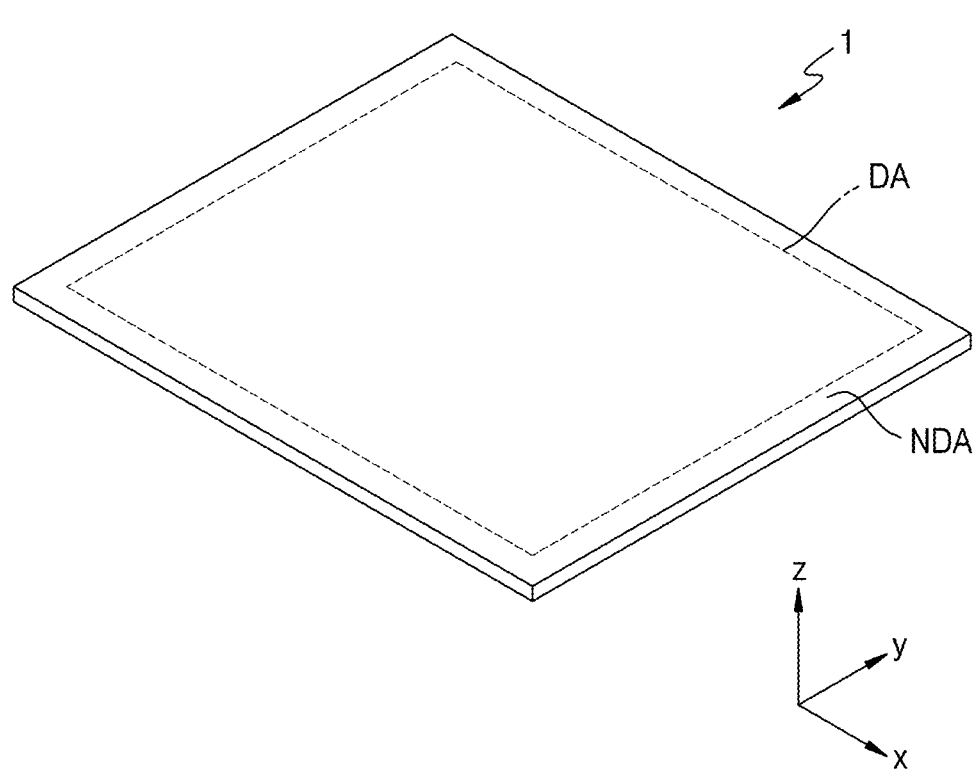
FIG. 1 is a perspective view schematically illustrating a display apparatus, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

As the disclosure allows for various changes and numerous embodiments, certain embodiments will be illustrated in the drawings and described in the detailed description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described in detail with reference to the accompanying drawings, wherein the same or corresponding elements are denoted by the same reference numerals throughout and a repeated description thereof is omitted.

Although the terms "first," "second," etc. may be used to describe various elements, these elements should not be limited by these terms. These terms are only used to distinguish one element from another.

As used herein, the singular forms "a," "an," and "the" are intended to include the plural forms as well, unless the context clearly indicates otherwise.

It will be understood that the terms "including," and "having," are intended to indicate the existence of the features or elements described in the specification, and are not intended to preclude the possibility that one or more other features or elements may exist or may be added.

It will be further understood that, when a layer, region, or component is referred to as being "on" another layer, region, or component, it may be directly on the other layer, region, or component, or may be indirectly on the other layer, region, or component with intervening layers, regions, or components therebetween.

Sizes of components in the drawings may be exaggerated or reduced for convenience of explanation. For example, because sizes and thicknesses of elements in the drawings are arbitrarily illustrated for convenience of explanation, the disclosure is not limited thereto.

When a certain embodiment may be implemented differently, a specific process order may be different from the described order. For example, two consecutively described processes may be performed substantially at the same time or may be performed in an order opposite to the described order.

"A and/or B" is used herein to select only A, select only B, or select both A and B. "At least one of A or B" is used to select only A, select only B, or select both A and B.

It will be understood that when a layer, a region, or a component is referred to as being "connected" to another layer, region, or component, it may be "directly connected" to the other layer, region, or component and/or may be "indirectly connected" to the other layer, region, or component with other layers, regions, or components interposed therebetween. For example, when a layer, a region, or a component is referred to as being "electrically connected," it may be directly electrically connected, and/or may be indirectly electrically connected with intervening layers, regions, or components therebetween.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 2A:
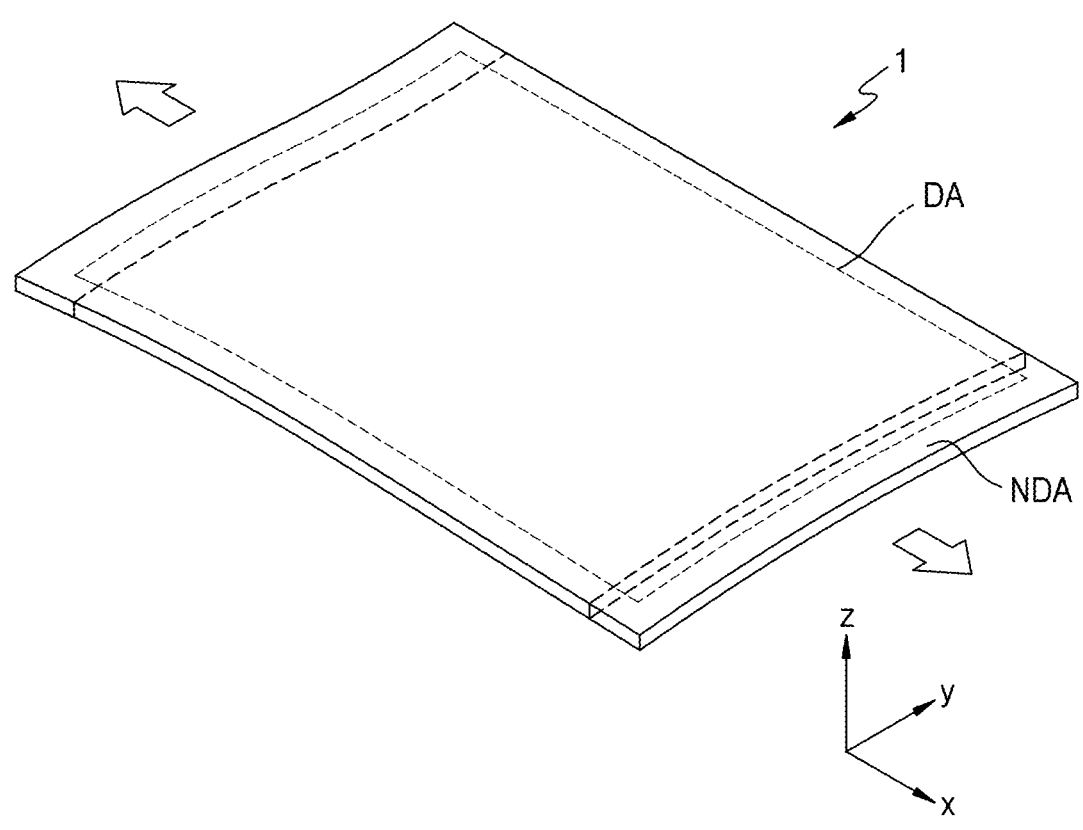
FIGS. 2A and 2B are perspective views illustrating a state where the display apparatus of FIG. 1 is stretched in a first direction.
Figure 2B:
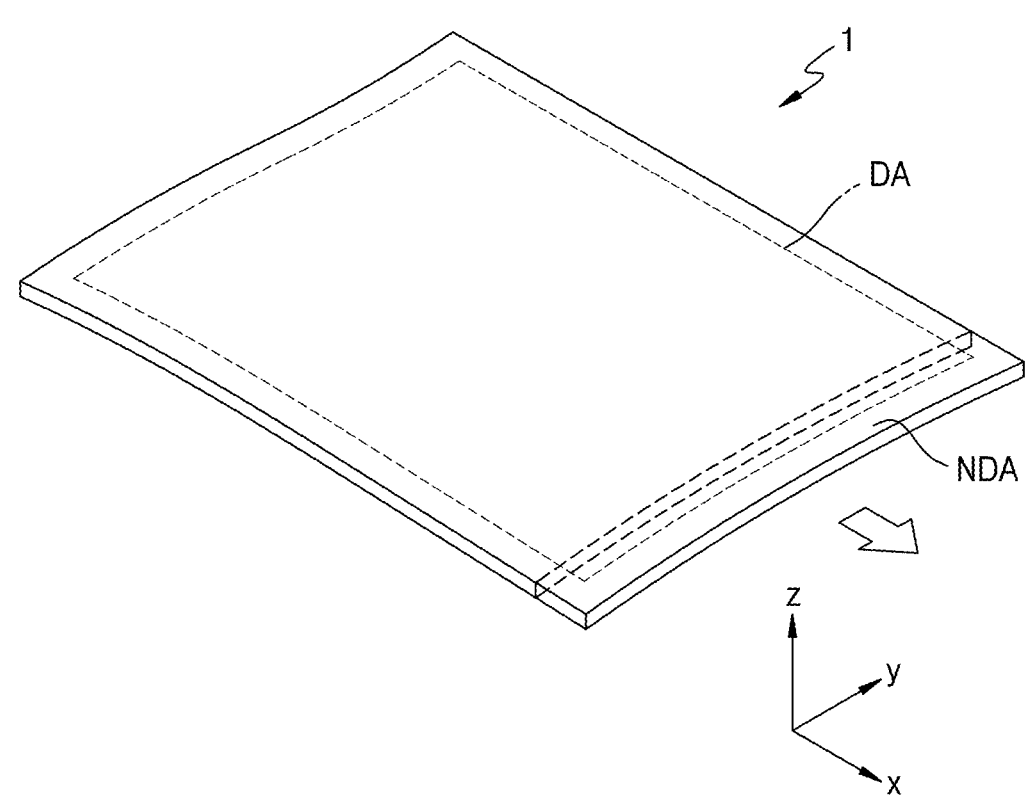
Figure 2C:
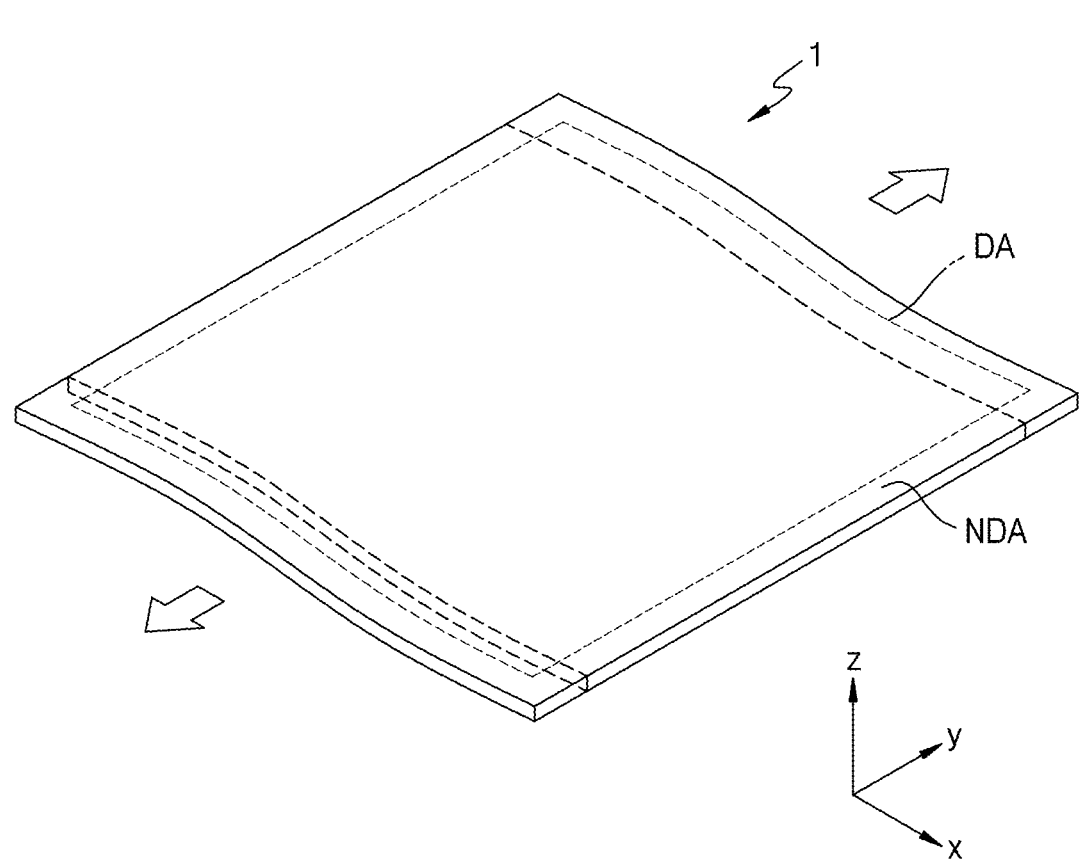
FIG. 2C is a perspective view illustrating a state where the display apparatus of FIG. 1 is stretched in a second direction.
Figure 2D:
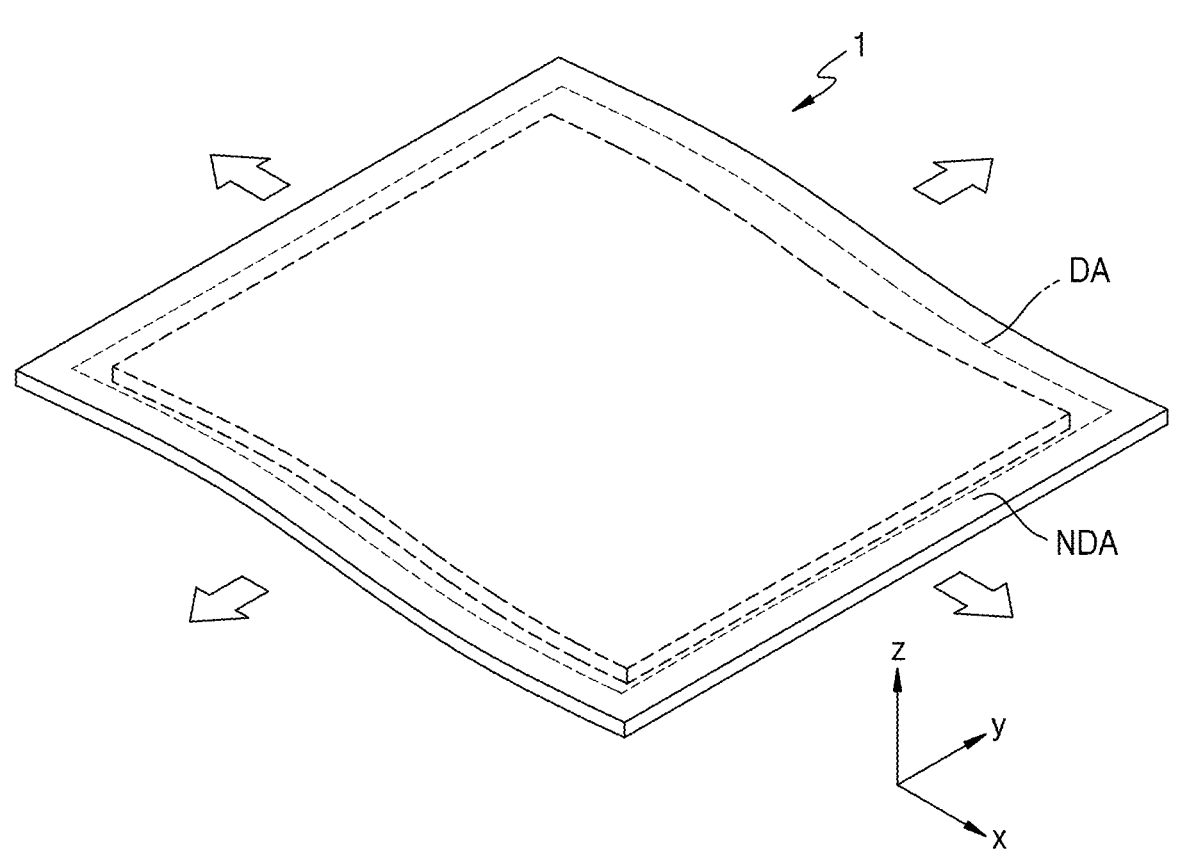
FIG. 2D is a perspective view illustrating a state where the display apparatus of FIG. 1 is stretched in the first direction and the second direction.
Figure 2E:
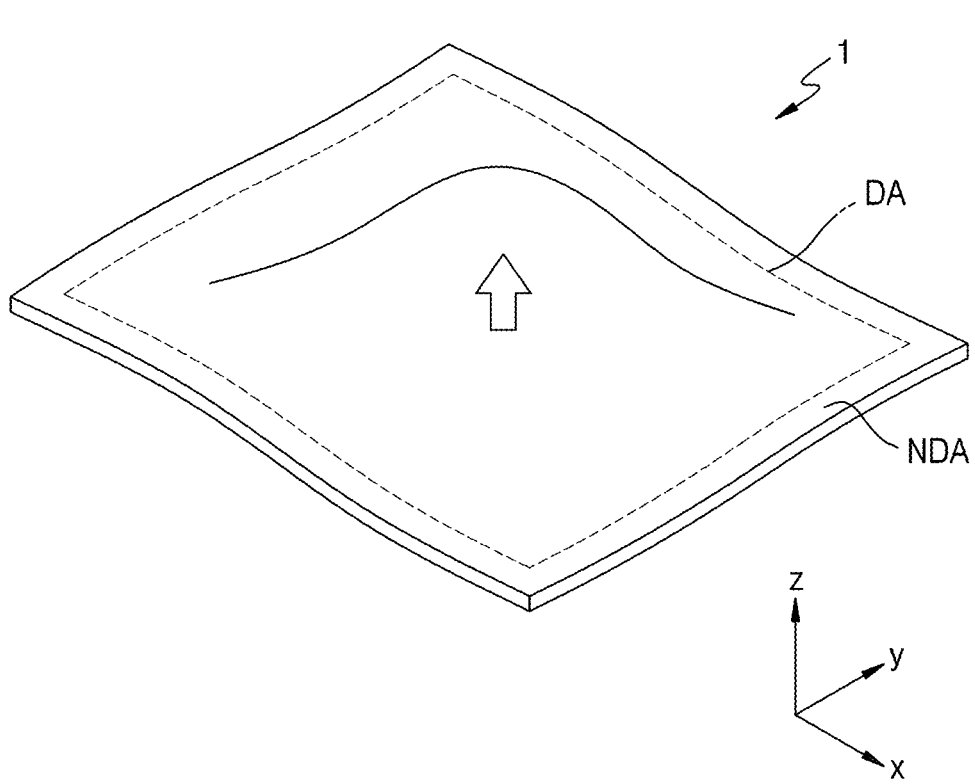
FIG. 2E is a perspective view illustrating a state where the display apparatus of FIG. 1 is stretched in a third direction.

FIG. 1 is a perspective view schematically illustrating a display apparatus 1, according to an embodiment. FIGS. 2A and 2B are perspective views illustrating a state where the display apparatus 1 of FIG. 1 is stretched in a first direction. FIG. 2C is a perspective view illustrating a state where the display apparatus 1 of FIG. 1 is stretched in a second direction. FIG. 2D is a perspective view illustrating a state where the display apparatus of FIG. 1 is stretched in the first direction and the second direction. FIG. 2E is a perspective view illustrating a state where the display apparatus 1 of FIG. 1 is stretched in a third direction.

Referring to FIG. 1, the display apparatus 1 may include a display area DA and a non-display area NDA. The display area DA may include a plurality of pixels. The display apparatus 1 may provide a certain image by using light emitted from the plurality of pixels. The non-display area NDA may be located outside the display area DA. The non-display area NDA may surround the entirety of the display area DA.

The display apparatus 1 may be stretched or compressed in various directions. The display apparatus 1 may be stretched in a first direction (e.g., an x direction and/or a −x direction) by an external force applied by a user or an external object. In an embodiment, as shown in FIGS. 2A and 2B, the display area DA and/or the non-display area NDA of the display apparatus 1 may be stretched in the first direction (e.g., the x direction and/or the −x direction). For example, the display area Da and/or the non-display area NDA of the display apparatus 1 may be stretched along the x direction and the −x direction as shown in FIG. 2A, or may be stretched along the x direction with one side fixed as shown in FIG. 2B.

The display apparatus 1 may be stretched in a second direction (e.g., a y direction and/or a −y direction) by an external force applied by a user or an external object. In an embodiment, the display area DA and/or the non-display area NDA of the display apparatus 1 may be stretched in the y direction and the −y direction as shown in FIG. 2C. In another embodiment, the display area DA and/or the non-display area NDA of the display apparatus 1 may be stretched in the y direction or the −y direction with one side fixed.

The display apparatus 1 may be stretched in a plurality of directions, for example, in the first direction (e.g., the x direction and/or the −x direction) and the second direction (e.g., the y direction and/or the −y direction) by an external force applied by a user or an external object. The display area DA and/or the non-display area NDA of the display apparatus 1 may be stretched in the ±x direction and the ±y direction as shown in FIG. 2D.

The display apparatus 1 may be stretched in a third direction (e.g., a z direction or a −z direction) by an external force applied by a person's body part or an external object. In an embodiment, in FIG. 2E, a part of the display apparatus 1, for example, a portion of the display area DA, protrudes in the z direction. In another embodiment, a part of the display apparatus 1, for example, a portion of the display area DA, may protrude along the z direction (or recessed along the −z direction).

Although the display apparatus 1 is stretched in the first direction, the second direction, and/or the third direction in FIGS. 2A to 2E, the disclosure is not limited thereto. In another embodiment, the display apparatus 1 may be deformed, for example, bent or twisted, into various irregular shapes along two or more axes.

Figure 3:
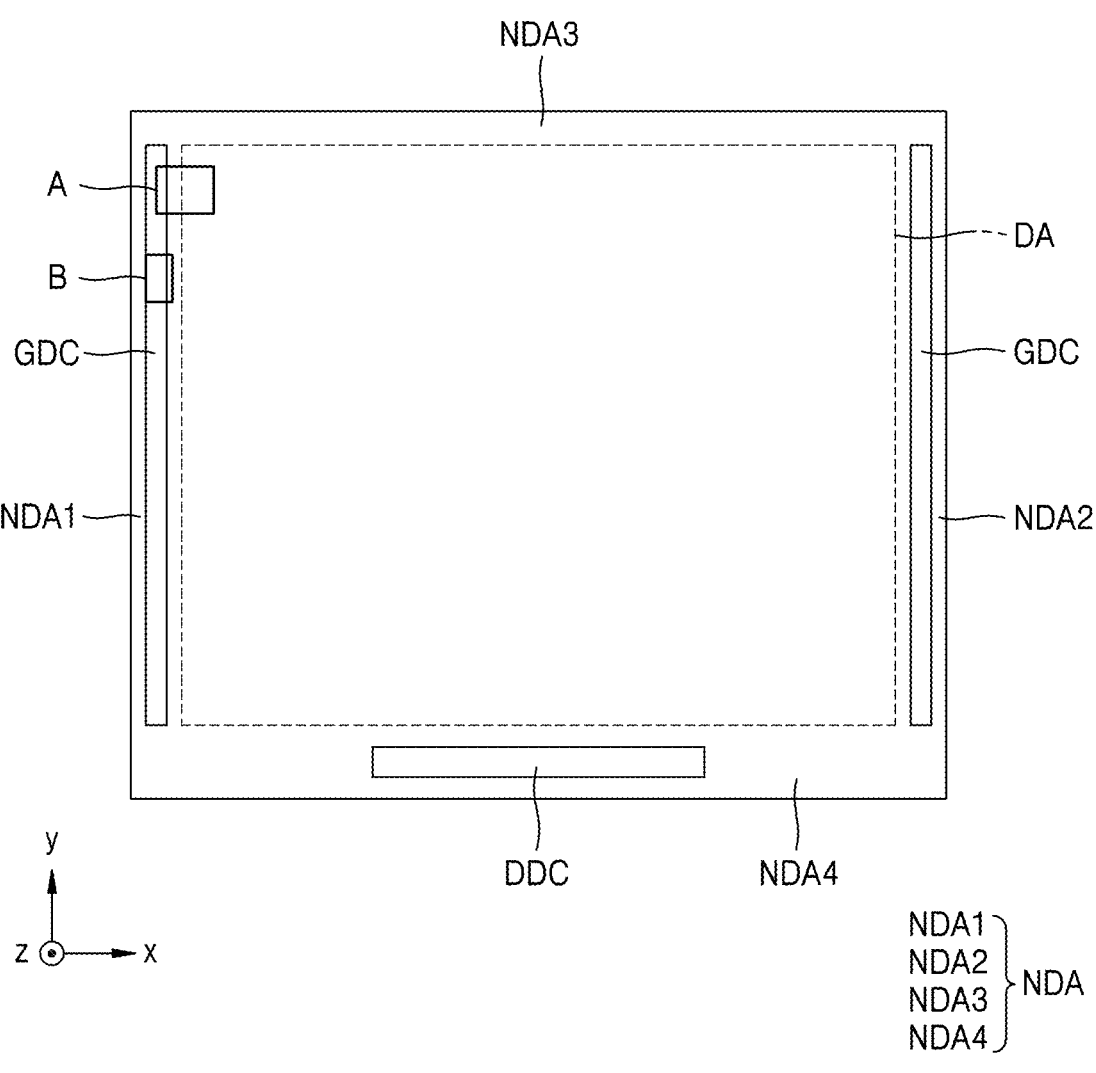
FIG. 3 is a plan view schematically illustrating a display apparatus, according to an embodiment.

FIG. 3 is a plan view schematically illustrating the display apparatus 1, according to an embodiment. As used herein, the "plan view" is a view in a height direction (e.g., the z direction) of the substrate 100.

A plurality of pixels may be arranged in the display area DA of the display apparatus 1. Each pixel may include sub-pixels emitting light of different colors. A light-emitting element corresponding to each sub-pixel may be located in the display area DA. A circuit for applying electrical signals to the light-emitting elements located in the display area DA and transistors electrically connected to the light-emitting elements may be located in the non-display area NDA around the display area DA. A gate driving circuit GDC may be located in a first non-display area NDA1 and a second non-display area NDA2 located on opposite sides of the display area DA. The gate driving circuit GDC may include drivers for applying electrical signals to gate electrodes of the transistors electrically connected to the light-emitting elements. Although the gate driving circuit GDC is located in each of the first non-display area NDA1 and the second non-display area NDA2 in FIG. 3, the disclosure is not limited thereto. In another embodiment, the gate driving circuit GDC may be located in any one of the first non-display area NDA1 and the second non-display area NDA2.

A data driving circuit DDC may be located in a third non-display area NDA3 and/or a fourth non-display area NDA4 connecting the first non-display area NDA1 to the second non-display area NDA2. In an embodiment, in FIG. 3, the data driving circuit DDC is located in the fourth non-display area NDA4. In another embodiment, the data driving circuit DDC may be located in each of the third non-display area NDA3 and the fourth non-display area NDA4.

Although the data driving circuit DDC is located in the fourth non-display area NDA4 of the display apparatus 1 in FIG. 3, the disclosure is not limited thereto. In another embodiment, the display apparatus 1 may further include a flexible circuit board (not shown) electrically connected through a terminal unit (not shown) located in the fourth non-display area NDA4, and the data driving circuit DDC may be located on the flexible circuit board.

In some embodiments, an elongation rate of the non-display area NDA may be equal to or less than an elongation rate of the display area DA. In an embodiment, an elongation rate of the non-display area NDA may be different for each area. For example, the first non-display area NDA1, the second non-display area NDA2, and the third non-display area NDA3 may have substantially the same elongation rate. However, a modification may be made. For example, an elongation rate of the fourth non-display area NDA4 may be less than an elongation rate of each of the first non-display area NDA1, the second non-display area NDA2, and the third non-display area NDA3.

Figure 4:
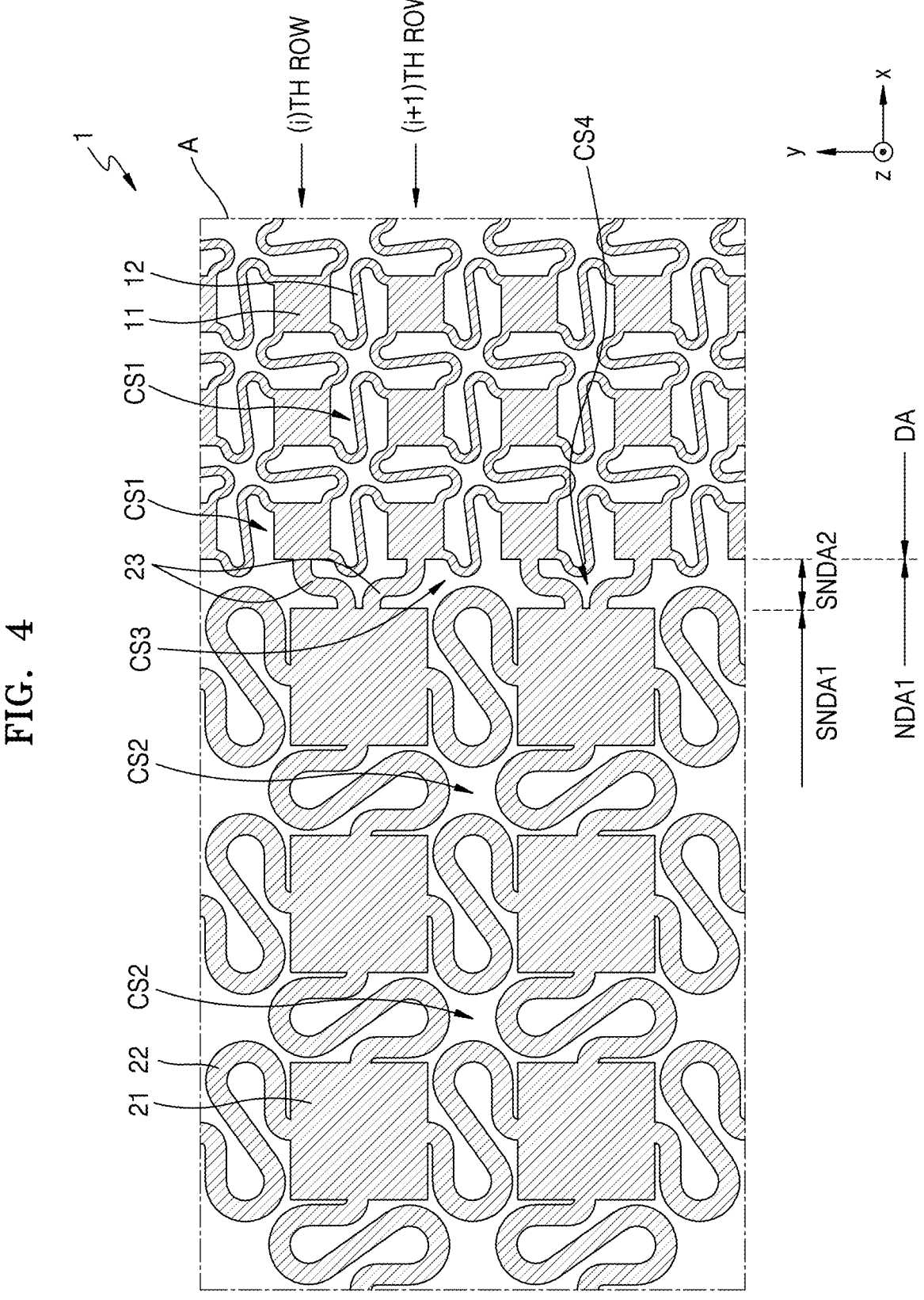
FIG. 4 is an enlarged plan view illustrating a portion A of the display apparatus of FIG. 3, according to an embodiment.

FIG. 4 is an enlarged plan view illustrating a portion A of the display apparatus 1 of FIG. 3, according to an embodiment.

Referring to FIG. 4, the display apparatus 1 may include main island portions 11 that are spaced apart from each other in the first direction (e.g., the x direction or the −x direction) and the second direction (e.g., the y direction or the −y direction) and main bridge portions 12 connecting adjacent main island portions 11 in the display area DA.

The main bridge portions 12 may be spaced apart from each other by a first opening CS1 located between the main bridge portions 12. The main bridge portion 12 may be a serpentine shape. For example, as shown in FIG. 4, the main bridge portion 12 may have a substantially 'alphabet S' shape.

Each main island portion 11 may be connected to a plurality of main bridge portions 12. For example, each main island portion 11 may be connected to four main bridge portions 12. Two main bridge portions 12 may be located on opposite sides of the main island portion 11 along the first direction (e.g., the x direction or the −x direction), and the remaining two main bridge portions 12 may be located on opposite sides of the main island portion 11 along the second direction (e.g., the y direction or the −y direction). The four main bridge portions 12 may be connected to four sides of the main island portion 11, respectively. Each of the four main bridge portions 12 may be adjacent to each of corners of the main island portion 11.

The display apparatus 1 may include peripheral island portions 21 spaced apart from each other in the first direction (e.g., the x direction or the −x direction) and the second direction (e.g., the y direction or the −y direction) and peripheral bridge portions 22 connecting adjacent peripheral island portions 21 in the first non-display area NDA1 of FIG. 4.

The peripheral bridge portions 22 may be spaced apart from each other by a second opening CS2 located between the peripheral bridge portions 22. The peripheral bridge portion 22 may have a serpentine shape. For example, as shown in FIG. 4, the peripheral bridge portion 22 may have a substantially 'alphabet S' shape. A size and/or a width of the peripheral bridge portion 22 may be different from a size and/or a width of the main bridge portion 12. For example, a size and/or a width of the peripheral bridge portion 22 may be greater than a size and/or a width of the main bridge portion 12. A radius of curvature of a rounded portion of the peripheral bridge portion 22 may be different from a radius of curvature of a rounded portion of the main bridge portion 12. For example, a radius of curvature of a rounded portion of the peripheral bridge portion 22 may be greater than a radius of curvature of a rounded portion of the main bridge portion 12.

Each peripheral island portion 21 may be connected to a plurality of peripheral bridge portions 22. A size and/or a width of each peripheral island portion 21 may be different from a size and/or a width of the main island portion 11. For example, a planar area of the peripheral island portion 21 may be greater than a planar area of the main island portion 11. As used herein, the "planar area" of a portion means an area of the portion in a plan view. Each peripheral island portion 21 may be connected to four peripheral bridge portions 22. Two peripheral bridge portions 22 may be located on opposite sides of the peripheral island portion 21 along the first direction (e.g., the x direction or the −x direction), and the remaining two peripheral bridge portions 22 may be located on opposite sides of the peripheral island portion 21 along the second direction (e.g., the y direction or the −y direction). In an embodiment, the four peripheral bridge portions 22 may be connected to four sides of the peripheral island portion 21, respectively. Each peripheral bridge portion 22 may be connected to a central portion of each side of the peripheral island portion 21.

The peripheral island portions 21 of any one row arranged in the first non-display area NDA1 may correspond to the main island portions 11 of a plurality of rows arranged in the display area DA. For example, the peripheral island portions 21 of any one row arranged in the first non-display area NDA1 may correspond to the main island portions 11 arranged in an (i)$^{th}$ row and the main island portions 11 arranged in an (i+1)$^{th}$ row of the display area DA (where i is a positive number greater than 0). In another embodiment, the peripheral island portions 21 of any one row may correspond to the main island portions 11 of n rows (where n is a positive number of 3 or more).

The non-display area, for example, the first non-display area NDA1, may include a first sub-non-display area SNDA1 in which the peripheral island portions 21 and the peripheral bridge portions 22 are located, and a second sub-non-display area SNDA2 between the first sub-non-display area SNDA1 and the display area DA. In the second sub-non-display area SNDA2, sub-bridge portions 23 for connecting the display area DA to the first sub-non-display area SNDA1 may be located. One end of the sub-bridge portion 23 may be connected to the peripheral island portion 21, and the other end of the sub-bridge portion 23 may be connected to the main island portion 11. For example, one end of the sub-bridge portion 23 may be connected to a central portion of one side of the peripheral island portion 21, and the other end of the sub-bridge portion 23 may be connected to a central portion of one side of the main island portion 11.

The sub-bridge portion 23 may have a serpentine shape. In an embodiment, a shape of the sub-bridge portion 23 may be different from a shape of each of the main bridge portion 12 and the peripheral bridge portion 22. A width of the sub-bridge portion 23 may be different from a width of the main bridge portion 12 and a width of the peripheral bridge portion 22. A width of the sub-bridge portion 23 may be greater than a width of the main bridge portion 12, and may be less than a width of the peripheral bridge portion 22. A third opening CS3 and a fourth opening CS4 having different shapes may be alternately located between the sub-bridge portions 23 in the second direction (e.g., the y direction or the −y direction).

Figure 5:
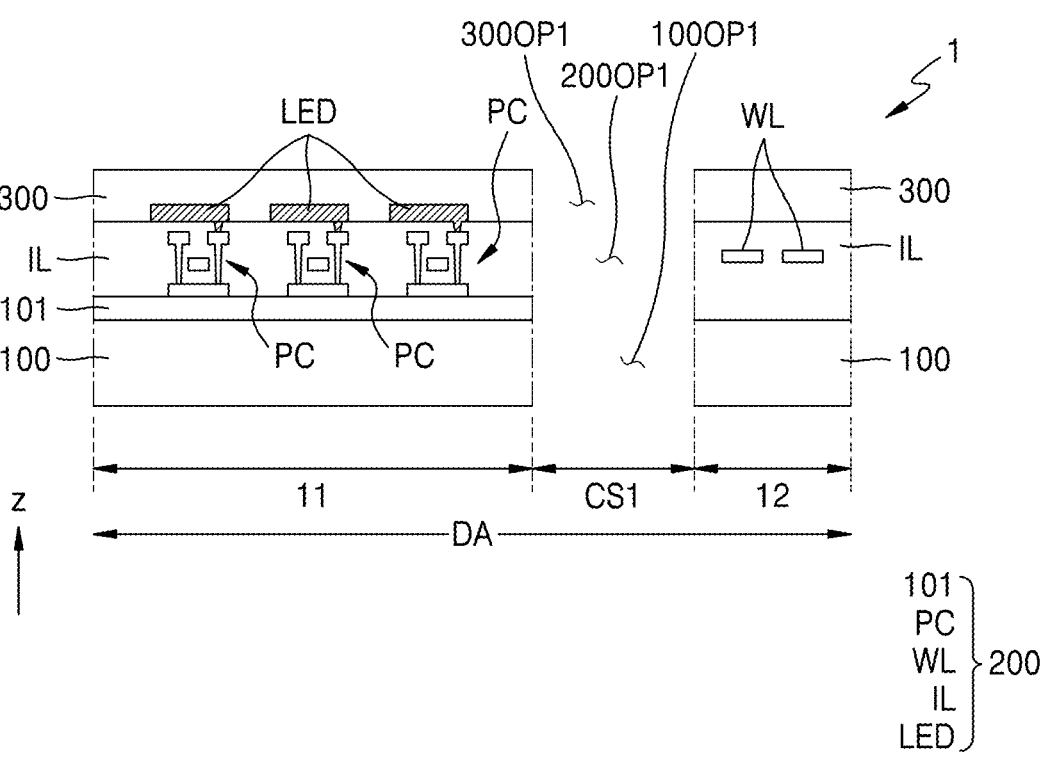
FIG. 5 is a cross-sectional view schematically illustrating a main island portion and a main bridge portion located in a display area of a display apparatus, according to an embodiment.

FIG. 5 is a cross-sectional view schematically illustrating the main island portion 11 and the main bridge portion 12 located in the display area DA of the display apparatus 1, according to an embodiment.

Referring to FIG. 5, the main island portion 11 and the main bridge portion 12 located in the display area DA may be spaced apart from each other with the first opening CS1 therebetween. The main island portion 11 may include light-emitting elements LED and a circuit, for example, a pixel driving circuit unit PC, electrically connected to each of the light-emitting elements LED to drive each of the light-emitting elements LED, and the main bridge portion 12 may include a wiring WL electrically connected to the pixel driving circuit units PC located in adjacent main island portions 11.

Regarding the main island portion 11, a buffer layer 101 including an inorganic insulating material may be located on a substrate 100, and the pixel driving circuit unit PC may be located on the buffer layer 101. An insulating layer IL including an inorganic insulating material and/or an organic insulating material may be located between the pixel driving circuit unit PC and the light-emitting element LED. The light-emitting element LED may be located on the insulating layer IL and may be electrically connected to the corresponding pixel driving circuit unit PC. The light-emitting elements LED may emit light of different colors or light of the same color. In an embodiment, the light-emitting elements LED may emit red light, green light, and blue light. In some embodiments, the light-emitting elements LED may emit white light. In another embodiment, the light-emitting elements LED emit red light, green light, blue light, and white light, respectively.

The substrate 100 may include a polymer resin such as polyethersulfone, polyarylate, polyether imide, polyethylene naphthalate, polyethylene terephthalate, polyphenylene sulfide, polyimide, polycarbonate, cellulose triacetate, or cellulose acetate propionate. In an embodiment, the substrate 100 may have a single-layer structure including a polymer resin. In another embodiment, the substrate 100 may have a multi-layer structure including a base layer including a polymer resin and a barrier layer including an inorganic insulating material. The substrate 100 including the polymer resin may be flexible, rollable, or bendable.

In an embodiment, although three pixel driving circuit units PC are located in each main island portion 11 and three light-emitting elements LED are connected to the pixel driving circuit units PC in FIG. 5, respectively, the disclosure is not limited thereto. In another embodiment, the number of pixel driving circuit units PC and light-emitting elements LED located in the main island portion 11 may be one, two, or four or more.

An encapsulation layer 300 may be located on the light-emitting element LED, and may protect the light-emitting element LED from an external force and/or moisture penetration. The encapsulation layer 300 may include an inorganic encapsulation layer and/or an organic encapsulation layer. In some embodiments, the encapsulation layer 300 may have a structure in which an inorganic encapsulation layer including an inorganic insulating material, an organic encapsulation layer including an organic insulating material, and an inorganic encapsulation layer including an inorganic insulating material are stacked. In another embodiment, the encapsulation layer 300 may include an organic material such as resin. In some embodiments, the encapsulation layer 300 may include urethane epoxy acrylate. The encapsulation layer 300 may include a photosensitive material, such as a photoresist.

Regarding the main bridge portion 12, the insulating layer IL including an organic insulating material may be located on the substrate 100. The main bridge portion 12 that is relatively highly deformed when the display apparatus 1 is stretched may not include a layer including an inorganic insulating material that is prone to cracks, unlike the main island portion 11.

In an embodiment, the substrate 100 corresponding to the main bridge portion 12 may have the same stacked structure as the substrate 100 corresponding to the main island portion 11. In an embodiment, the substrate 100 corresponding to the main bridge portion 12 and the substrate 100 corresponding to the main island portion 11 may be polymer resin layers formed together in the same process. In another embodiment, the substrate 100 corresponding to the main bridge portion 12 may have a stacked structure different from the stacked structure of the substrate 100 corresponding to the main island portion 11. In some embodiments, the substrate 100 corresponding to the main island portion 11 may have a multi-layer structure including a base layer including a polymer resin and a barrier layer including an inorganic insulating material, and the substrate 100 corresponding to the main bridge portion 12 may have a structure including a polymer resin layer without a layer including an inorganic insulating material.

As described above, the wirings WL of the main bridge portion 12 may be signal lines (e.g., a gate line and a data line) for providing an electrical signal to a transistor included in the pixel driving circuit unit PC of the main island portion 11 or voltage lines (e.g., a driving voltage line and an initialization voltage line) for providing a voltage. The encapsulation layer 300 may also be located in the main bridge portion 12. In another embodiment, the encapsulation layer 300 may not be located in the main bridge portion 12.

Referring to FIGS. 4A to 4C and 5, the substrate 100 corresponding to the main island portion 11 and the substrate 100 corresponding to the main bridge portion 12 may be connected to each other. In other words, the plan view of FIGS. 4A to 4C may be substantially the same as the plan view of the substrate 100 of FIG. 5. In other words, the substrate 100 may include an area corresponding to the main island portion 11, an area corresponding to the main bridge portion 12, and an opening 100OP1 having the same shape as the shape of the first opening CS1.

Likewise, the encapsulation layer 300 corresponding to the main island portion 11 and the encapsulation layer 300 corresponding to the main bridge portion 12 may be connected to each other. For example, the plan view of FIGS. 4A to 4C may be substantially the same as the plan view of the encapsulation layer 300. In other words, the encapsulation layer 300 may include an area corresponding to the main island portion 11, an area corresponding to the main bridge portion 12, and an opening 300OP1 having the same shape as the shape of the first opening CS1.

A circuit-light-emitting element layer 200 between the substrate 100 and the encapsulation layer 300 may include the buffer layer 101, the pixel driving circuit unit PC, the wiring WL, the insulating layer IL, and the light-emitting element LED. Like the substrate 100, the plan view of FIGS. 4A to 4C may be substantially the same as the plan view of the circuit-light-emitting element layer 200. In other words, the circuit-light-emitting element layer 200 may define an opening 200OP1 having the same shape as the shape of the first opening CS1.

Figure 6A:
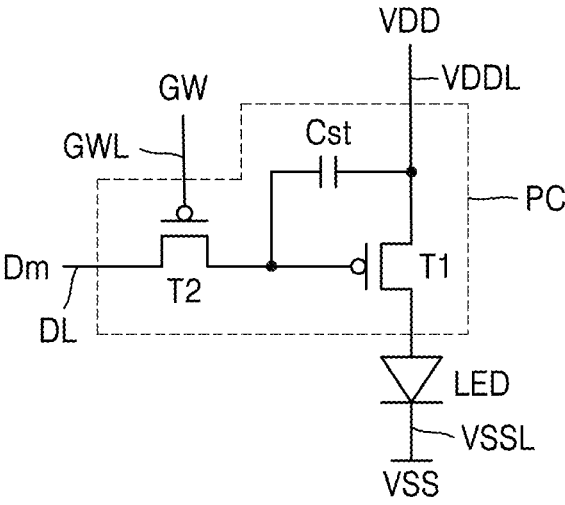
FIGS. 6A to 6C are equivalent circuit diagrams illustrating a sub-pixel of a display apparatus, according to an embodiment.
Figure 6B:
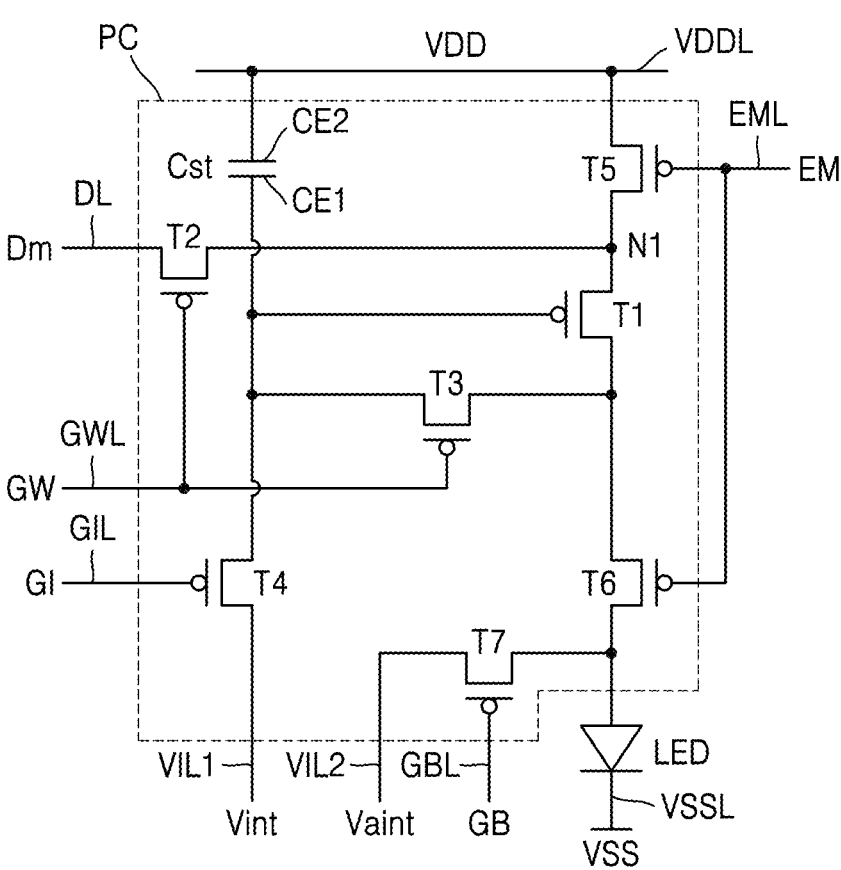
Figure 6C:
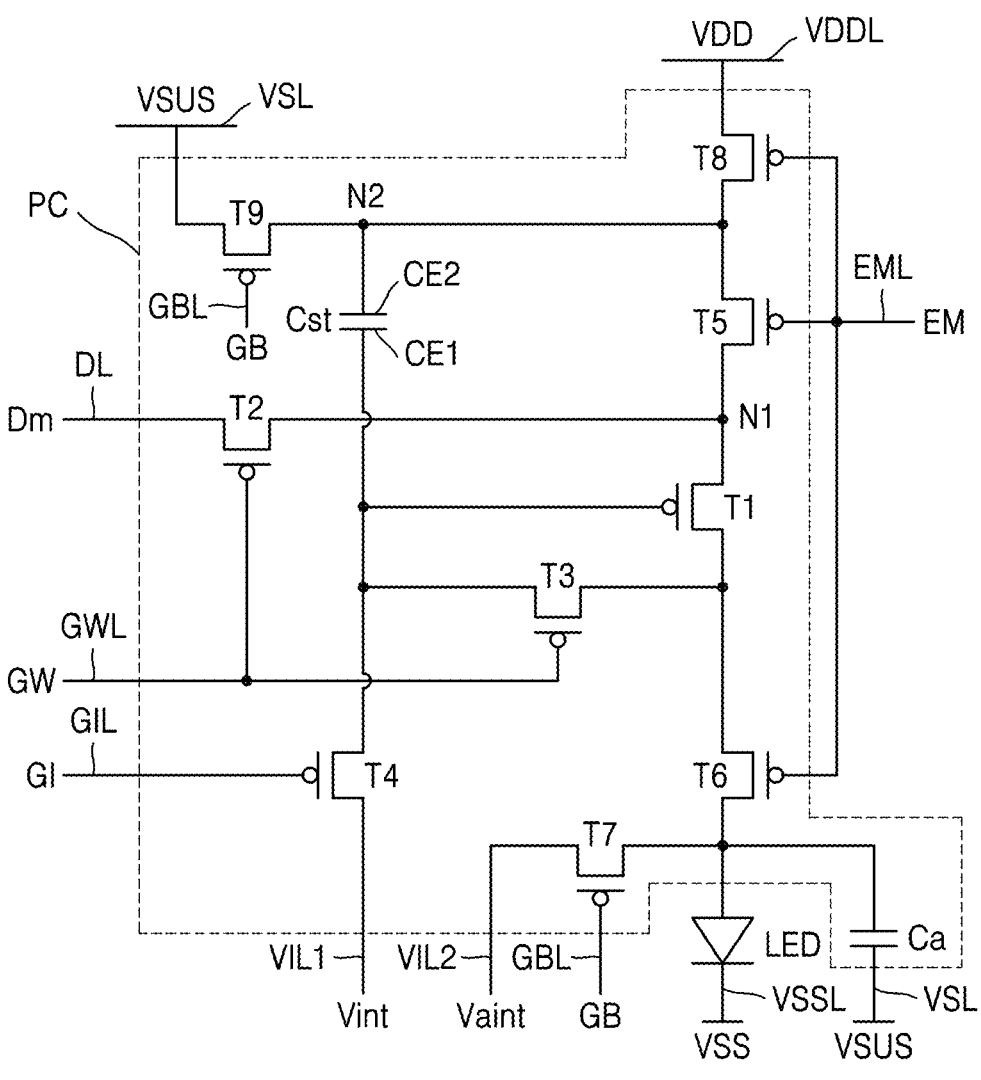

FIGS. 6A to 6C are equivalent circuit diagrams illustrating a sub-pixel of the display apparatus 1, according to an embodiment.

Referring to FIG. 6A, a light-emitting element LED corresponding to a sub-pixel may be electrically connected to a pixel driving circuit unit PC, and the pixel driving circuit unit PC may include a first transistor T1, a second transistor T2, and a storage capacitor Cst. The pixel driving circuit unit PC may be electrically connected to a signal line and a voltage line. The signal line may include a gate line such as a scan signal line GWL, and a data line DL, and the voltage line may include a first voltage line VDDL.

The second transistor T2 may be electrically connected to the scan signal line GWL and the data line DL. The scan signal line GWL may provide a scan signal GW to a gate electrode of the second transistor T2. The second transistor T2 may transmit a data signal Dm input from the data line DL to the first transistor T1 according to the scan signal GW input from the scan signal line GWL.

The storage capacitor Cst may be electrically connected to the second transistor T2 and the first voltage line VDDL, and may store a voltage corresponding to a difference between a voltage received from the second transistor T2 and a first power supply voltage VDD supplied by the first voltage line VDDL.

The first transistor T1 is a driving transistor and may control driving current flowing through the light-emitting element LED. The first transistor T1 may be connected to the first voltage line VDDL and the storage capacitor Cst. The first transistor T1 may control the driving current flowing through the light-emitting element LED from the first voltage line VDDL in response to a value of the voltage stored in the storage capacitor Cst. The light-emitting element LED may emit light having a certain luminance due to the driving current. A first electrode of the light-emitting element LED may be electrically connected to the first transistor T1, and a second electrode of the light-emitting element LED may be electrically connected to a second voltage line VSSL that supplies a second power supply voltage VSS.

Although the pixel driving circuit unit PC includes two transistors and one storage capacitor in FIG. 6A, in another embodiment, the pixel driving circuit unit PC may include three or more transistors.

Referring to FIG. 6B, a pixel driving circuit unit PC may include a first transistor T1, a second transistor T2, a third transistor T3, a fourth transistor T4, a fifth transistor T5, a sixth transistor T6, a seventh transistor T7, and a storage capacitor Cst.

The pixel driving circuit unit PC is electrically connected to signal lines and voltage lines. The signal lines may include gate lines such as a scan signal line GWL, a bypass control line GBL, an initialization control line GIL, and an emission control line EML, and a data line DL. The voltage lines may include first and second initialization voltage lines VIL1 and VIL2, and a first voltage line VDDL.

The first voltage line VDDL may transmit a first power supply voltage VDD to the first transistor T1. The first initialization voltage line VIL1 may transmit a first initialization voltage Vint for initializing the first transistor T1 to the pixel driving circuit unit PC. The second initialization voltage line VIL2 may transmit a second initialization voltage Vaint for initializing a first electrode of a light-emitting element LED to the pixel driving circuit unit PC.

The first transistor T1 may be electrically connected to the first voltage line VDDL via the fifth transistor T5, and may be electrically connected to the light-emitting element LED via the sixth transistor T6. The first transistor T1 functions as a driving transistor, and receives a data signal Dm according to a switching operation of the second transistor T2 and supplies driving current to the light-emitting element LED.

The second transistor T2 is a data write transistor and is electrically connected to the scan signal line GWL and the data line DL. The second transistor T2 is electrically connected to the first voltage line VDDL via the fifth transistor T5. The second transistor T2 is turned on according to a scan signal GW received through the scan signal line GWL to perform a switching operation of transmitting the data signal Dm transmitted through the data line DL to a first node N1.

The third transistor T3 is electrically connected to the scan signal line GWL and is electrically connected to the light-emitting element LED via the sixth transistor T6. The third transistor T3 is turned on according to the scan signal GW received through the scan signal line GWL to diode-connect the first transistor T1.

The fourth transistor T4 is a first initialization transistor and is electrically connected to the first initialization control line GIL and the first initialization voltage line VIL1. The fourth transistor T4 is turned on according to an initialization control signal GI received through the initialization control line GIL to initialize a voltage of a gate electrode of the first transistor T1 by transmitting the first initialization voltage Vint from the first initialization voltage line VIL1 to the gate electrode of the first transistor T1. The initialization control signal GI may correspond to a scan signal of another pixel driving circuit unit located in a previous row with respect to the pixel driving circuit unit PC.

The fifth transistor T5 may be an operation control transistor, and the sixth transistor T6 may be an emission control transistor. The fifth transistor T5 and the sixth transistor T6 are electrically connected to the emission control line EML, and are simultaneously turned on according to an emission control signal EM received through the emission control line EML to form a current path through which the driving current may flow from the first voltage line VDDL to the light-emitting element LED.

The seventh transistor T7 is a second initialization transistor and may be electrically connected to the bypass control line GBL, the second initialization voltage line VIL2, and the sixth transistor T6. The seventh transistor T7 may be turned on according to a bypass control signal GB received through the bypass control line GBL to initialize the first electrode of the light-emitting element LED by transmitting the second initialization voltage Vaint from the second initialization voltage line VIL2 to the first electrode of the light-emitting element LED.

The storage capacitor Cst includes a first electrode CE1 and a second electrode CE2. The first electrode CE1 is electrically connected to the gate electrode of the first transistor T1, and the second electrode CE2 is electrically connected to the first voltage line VDDL. The storage capacitor Cst may maintain a voltage applied to the gate electrode of the first transistor T1 by storing and maintaining a voltage corresponding to a voltage difference between the first voltage line VDDL and the gate electrode of the first transistor T1.

Referring to FIG. 6C, a pixel driving circuit unit PC may include a first transistor T1, a second transistor T2, a third transistor T3, a fourth transistor T4, a fifth transistor T5, a sixth transistor T6, a seventh transistor T7, an eighth transistor T8, a ninth transistor T9, a storage capacitor Cst, and an auxiliary capacitor Ca.

The pixel driving circuit unit PC is electrically connected to signal lines and voltage lines. The signal lines may include gate lines such as a scan signal line GWL, a bypass control line GBL, an initialization control line GIL, and an emission control line EML, and a data line DL. The voltage lines may include first and second initialization voltage lines VIL1 and VIL2, a sustain voltage line VSL, and a first voltage line VDDL.

The first voltage line VDDL may transmit a first power supply voltage VDD to the first transistor T1. The first initialization voltage line VIL1 may transmit a first initialization voltage Vint for initializing the first transistor T1 to the pixel driving circuit unit PC. The second initialization voltage line VIL2 may transmit a second initialization voltage Vaint for initializing a first electrode of a light-emitting element LED to the pixel driving circuit unit PC. The sustain voltage line VSL may provide a sustain voltage VSUS to a second node N2, for example, a second electrode CE2 of the storage capacitor Cst, in an initialization period and a data write period.

The first transistor T1 may be electrically connected to the first voltage line VDDL via the fifth transistor T5 and the eighth transistor T8, and may be electrically connected to the light-emitting element LED via the sixth transistor T6. The first transistor T1 may function as a driving transistor, and may supply driving current to the light-emitting element LED by receiving a data signal Dm according to a switching operation of the second transistor T2.

The second transistor T2 is electrically connected to the scan signal line GWL and the data line DL, and is electrically connected to the first voltage line VDDL via the fifth transistor T5 and the eighth transistor T8. The second transistor T2 is turned on according to a scan signal GW received through the scan signal line GWL to perform a switching operation of transmitting the data signal Dm received through the data line DL to a first node N1.

The third transistor T3 is electrically connected to the scan signal line GWL, and is electrically connected to the light-emitting element LED via the sixth transistor T6. The third transistor T3 is turned on according to the scan signal GW received through the scan signal line GWL to compensate for a threshold voltage of the first transistor T1 by diode-connecting the first transistor T1.

The fourth transistor T4 is electrically connected to the initialization control line GIL and the first initialization voltage line VIL1, and is turned on according to an initialization control signal GI received through the initialization control line GIL to initialize a voltage of a gate electrode of the first transistor T1 by transmitting the first initialization voltage Vint from the initialization voltage line VIL1 to the gate electrode of the first transistor T1. The initialization control signal GI may correspond to a scan signal of another pixel driving circuit unit located in a previous row with respect to the pixel driving circuit unit PC.

The fifth transistor T5, the sixth transistor T6, and the eighth transistor T8 are electrically connected to the emission control line EML, and are simultaneously turned on according to an emission control signal EM received through the emission control line EML to form a current path through which the driving current may flow from the first voltage line VDDL to the light-emitting element LED.

The seventh transistor T7 is a second initialization transistor and may be electrically connected to the bypass control line GBL, the second initialization voltage line VIL2, and the sixth transistor T6. The seventh transistor T7 is turned on according to a bypass control signal GB received through the bypass control line GBL to initialize the first electrode of the light-emitting element LED by transmitting the second initialization voltage Vaint from the second initialization voltage line VIL2 to the first electrode of the light-emitting element LED.

The ninth transistor T9 may be electrically connected to the bypass control line GBL, the second electrode CE2 of the storage capacitor Cst, and the sustain voltage line VSL. The ninth transistor T9 may be turned on according to the bypass control signal GB received through the bypass control line GBL to transmit the sustain voltage VSUS to the second node N2, for example, the second electrode CE2 of the storage capacitor Cst, in the initialization period and the data write period.

The eighth transistor T8 and the ninth transistor T9 may be electrically connected to the second node N2, for example, the second electrode CE2 of the storage capacitor Cst. In some embodiments, the eight transistor T8 may be turned off and the ninth transistor T9 may be turned on in the initialization period and the data write period, and the eighth transistor T8 may be turned on and the ninth transistor T9 may be turned off in an emission period. Because the sustain voltage VSUS is transmitted to the second node N2 in the initialization period and the data write period, luminance uniformity (e.g., long-range uniformity (LRU)) of the display apparatus according to a voltage drop of the first voltage line VDDL may be improved.

The storage capacitor Cst includes a first electrode CE1 and the second electrode CE2. The first electrode CE1 is electrically connected to the gate electrode of the first transistor T1, and the second electrode CE2 is electrically connected to the eighth transistor T8 and the ninth transistor T9.

The auxiliary capacitor Ca may be electrically connected to the sixth transistor T6, the sustain voltage line VSL, and the first electrode of the light-emitting element LED. The auxiliary capacitor Ca may store and maintain a voltage corresponding to a voltage difference between the first electrode of the light-emitting element LED and the sustain voltage line VSL while the seventh transistor T7 and the ninth transistor T9 are turned on, thereby preventing an increase in black luminance when the sixth transistor T6 is turned off.

Figure 7A:
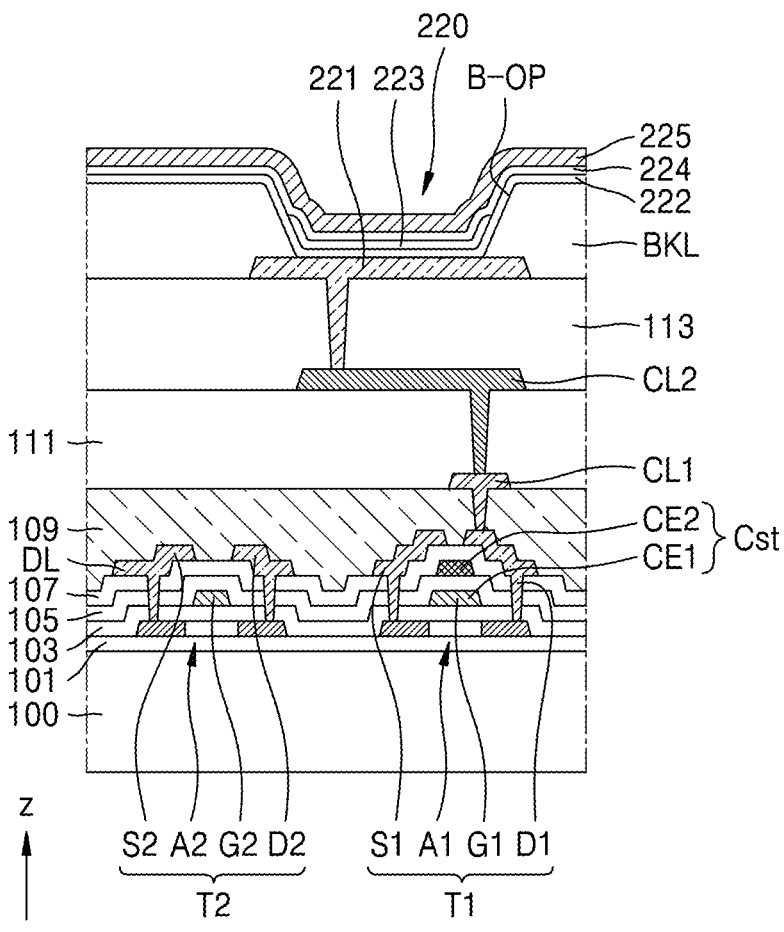
FIGS. 7A and 7B are cross-sectional views schematically illustrating a main island portion of a display apparatus, according to an embodiment.
Figure 7B:
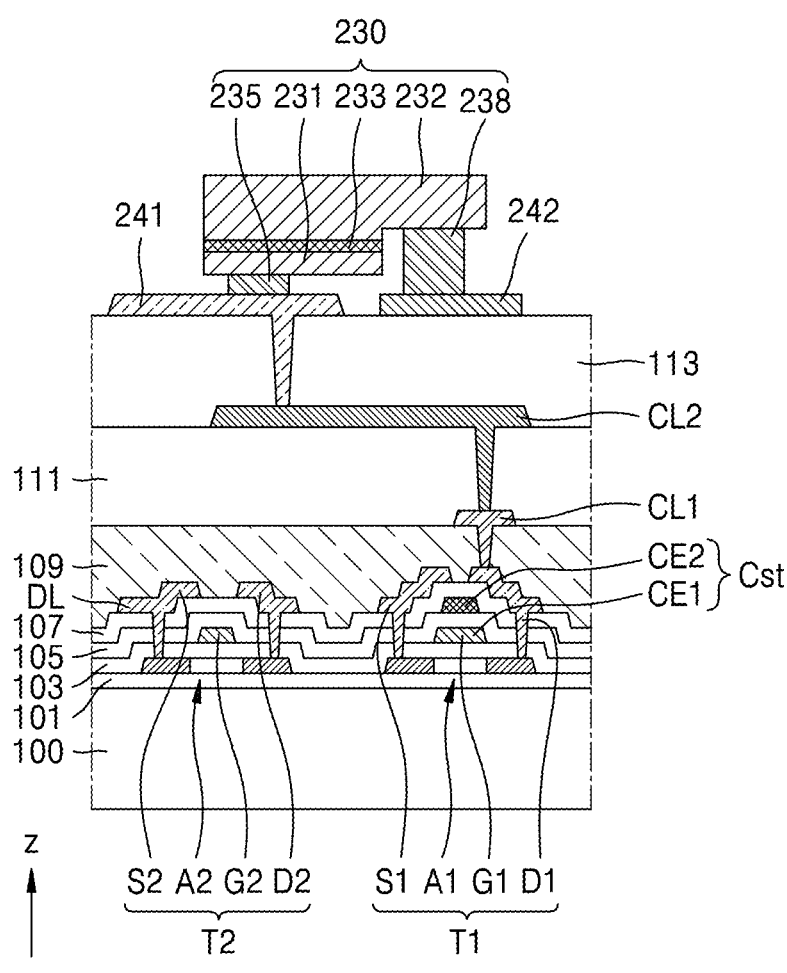

FIGS. 7A and 7B are cross-sectional views schematically illustrating a main island portion of a display apparatus, according to an embodiment.

Referring to FIGS. 7A and 7B, the main island portion 11 (see FIG. 4) of a display apparatus according to an embodiment may include a pixel driving circuit unit and a light-emitting element. In FIGS. 7A and 7B, for convenience of explanation, only the first transistor T1, the second transistor T2, and the storage capacitor Cst of the pixel driving circuit unit PC (see FIG. 6A) are shown. The pixel driving circuit unit of FIG. 7B may have the same structure as that in FIG.

7A, and thus, the same description as that made with reference to FIG. 7A will be omitted.

First, referring to FIG. 7A, the buffer layer 101 may be located on a top surface of the substrate 100. The buffer layer 101 may prevent penetration of impurities into a semiconductor layer of a transistor. The buffer layer 101 may include an inorganic insulating material such as silicon nitride, silicon oxynitride, or silicon oxide, and may have a single or multi-layer structure including the above inorganic insulating material.

The pixel driving circuit unit PC (see FIG. 6A) may be located on the buffer layer 101. The pixel driving circuit unit PC (see FIG. 6A) may include a plurality of transistors and a storage capacitor as shown in FIGS. 6A to 6C. In an embodiment, FIG. 7A illustrates the first transistor T1, the second transistor T2, and the storage capacitor Cst of the pixel driving circuit unit PC (see FIG. 6A).

The first transistor T1 may include a first semiconductor layer A1 on the buffer layer 101 and a first gate electrode G1 overlapping a channel region of the first semiconductor layer A1 in a plan view. The first semiconductor layer A1 may include a silicon-based semiconductor material, for example, polysilicon. The first semiconductor layer A1 may include the channel region and a first region and a second region located on opposite sides of the channel region. The first region and the second region are regions including impurities higher concentrations of impurities than the channel region, and one of the first region and the second region may correspond to a source region and the other may correspond to a drain region.

The second transistor T2 may include a second semiconductor layer A2 on the buffer layer 101 and a second gate electrode G2 overlapping a channel region of the second semiconductor layer A2 in a plan view. The second semiconductor layer A2 may include a silicon-based semiconductor material, for example, polysilicon. The second semiconductor layer A2 may include the channel region and a first region and a second region located on opposite sides of the channel region. The first region and the second region are regions having higher concentrations of impurities than the channel region, and one of the first region and the second region may correspond to a source region and the other may correspond to a drain region.

Each of the first gate electrode G1 and the second gate electrode G2 may include a conductive material including molybdenum (Mo), aluminum (Al), copper (Cu), or titanium (Ti), and may have a single or multi-layer structure including the above material.

A first gate insulating layer 103 for electrical insulation from the first semiconductor layer A1 and the second semiconductor layer A2 may be located under the first gate electrode G1 and the second gate electrode G2. The first gate insulating layer 103 may include an inorganic insulating material such as silicon nitride, silicon oxynitride, or silicon oxide, and may have a single or multi-layer structure including the above inorganic insulating material.

The storage capacitor Cst may include a lower electrode CE1 and an upper electrode CE2 overlapping each other in a plan view. In an embodiment, the lower electrode CE1 of the storage capacitor Cst may include the first gate electrode G1. In other words, the first gate electrode G1 may include the lower electrode CE1 of the storage capacitor Cst. For example, the first gate electrode G1 and the lower electrode CE1 of the storage capacitor Cst may be integrally formed with each other.

A first interlayer-insulating layer 105 may be located between the lower electrode CE1 and the upper electrode CE2 of the storage capacitor Cst. The first interlayer-insulating layer 105 may include an inorganic insulating material such as silicon oxide, silicon nitride, or silicon oxynitride, and may have a single or multi-layer structure including the above inorganic insulating material.

The upper electrode CE2 of the storage capacitor Cst may include a low-resistance conductive material such as molybdenum (Mo), aluminum (Al), copper (Cu), and/or titanium (Ti), and may have a single or multi-layer structure including the above material.

A second interlayer-insulating layer 107 may be located on the storage capacitor Cst. The second interlayer-insulating layer 107 may include an inorganic insulating material such as silicon oxide, silicon nitride, or silicon oxynitride, and may have a single or multi-layer structure including the above inorganic insulating material.

A source electrode S1 and/or a drain electrode D1 electrically connected to the first semiconductor layer A1 of the first transistor T1 may be located on the second interlayer-insulating layer 107. A source electrode S2 and/or a drain electrode D2 electrically connected to a second semiconductor layer A2 of a second transistor T2 may be located on the second interlayer-insulating layer 107. The source electrodes S1 and S2 and/or the drain electrodes D1 and D2 may include aluminum (Al), copper (Cu), and/or titanium (Ti), and may have a single or multi-layer structure including the above material.

A first organic insulating layer 109 may be located on the pixel driving circuit unit. The first organic insulating layer 109 may include an organic insulating material such as acryl, benzocyclobutene (BCB), polyimide, or hexamethyldisiloxane (HMDSO).

A first connection electrode CL1 may be located on the first organic insulating layer 109. The first connection electrode CL1 may include aluminum (Al), copper (Cu), and/or titanium (Ti), and may have a single or multi-layer structure including the above material.

A second organic insulating layer 111 may be located on the first connection electrode CL1. The second organic insulating layer 111 may include an organic insulating material such as acryl, benzocyclobutene (BCB), polyimide, or hexamethyldisiloxane (HMDSO).

A second connection electrode CL2 may be located on the second organic insulating layer 111. The second connection electrode CL2 may include aluminum (Al), copper (Cu), and/or titanium (Ti), and may have a single or multi-layer structure including the above material.

A third organic insulating layer 113 may be located on the second connection electrode CL2. The third organic insulating layer 113 may include an organic insulating material such as acryl, benzocyclobutene (BCB), polyimide, or hexamethyldisiloxane (HMDSO).

Although the pixel driving circuit unit and the light-emitting element are electrically connected through the first connection electrode CL1 and the second connection electrode CL2 in an embodiment described with reference to FIGS. 7A and 7B, in another embodiment, the first connection electrode CL1 and/or the second connection electrode CL2 may be omitted.

Referring to FIG. 7A, the light-emitting element according to an embodiment may include an organic light-emitting diode 220 including an organic material. The organic light-emitting diode 220 may include a first electrode 221 located on an insulating layer, a second electrode 225 facing the first electrode 221, and an emission layer 223 located between the first electrode 221 and the second electrode 225. A first functional layer 222 may be located between the first electrode 221 and the emission layer 223, and a second functional layer 224 may be located between the emission layer 223 and the second electrode 225.

An edge of the first electrode 221 may be covered by a bank layer BKL including an insulating material. The bank layer BKL may define an opening B-OP overlapping a central portion of the first electrode 221 in a plan view.

The first electrode 221 may include a conductive oxide such as indium tin oxide (ITO), indium zinc oxide (IZO), zinc oxide (ZnO), indium oxide (In$_2$O$_3$), indium gallium oxide (IGO), or aluminum zinc oxide (AZO). In another embodiment, the first electrode 221 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, the first electrode 221 may further include a layer formed of or including ITO, IZO, ZnO, AZO, or In$_2$O$_3$ over/under the reflective layer.

The emission layer 223 may include a high molecular weight organic material or a low molecular weight organic material that emits light of a certain color. The first functional layer 222 may include a hole transport layer (HTL) and/or a hole injection layer (HIL). The second functional layer 224 may include an electron transport layer (ETL) and/or an electron injection layer (EIL).

The second electrode 225 may be formed of or include a conductive material having a low work function. For example, the second electrode 225 may include a (semi-) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the second electrode 225 may further include a layer formed of or including ITO, IZO, ZnO, AZO, or In$_2$O$_3$ on the (semi-) transparent layer including the above material.

Referring to FIG. 7B, the light-emitting element according to an embodiment may include an inorganic light-emitting diode 230 including an inorganic material. The inorganic light-emitting diode 230 may include a first semiconductor layer 231, a second semiconductor layer 232, an intermediate layer 233 between the first semiconductor layer 231 and the second semiconductor layer 232, a first electrode 235 electrically connected to the first semiconductor layer 231, and a second electrode 238 electrically connected to the second semiconductor layer 232. The first electrode 235 and the second electrode 238 of the inorganic light-emitting diode 230 may be electrically connected to a first electrode pad 241 and a second electrode pad 242 located in the same layer.

In some embodiments, the first semiconductor layer 231 may include a p-type semiconductor layer. The p-type semiconductor layer may be formed of or include a semiconductor material having a composition formula of In$_x$Al$_y$Ga$_{1-x-y}$N ($0 \leq x \leq 1$, $0 \leq y \leq 1$, $0 \leq x+y \leq 1$) selected from among, for example, GaN, AlN, AlGaN, InGaN, InN, InAlGaN, and AlInN, and may be doped with a p-type dopant such as Mg, Zn, Ca, Sr, or Ba.

The second semiconductor layer 232 may include, for example, an n-type semiconductor layer. The n-type semiconductor layer may be formed of or include a semiconductor material having a composition formula of In$_x$Al$_y$Ga$_{1-x-y}$N ($0 \leq x \leq 1$, $0 \leq y \leq 1$, $0 \leq x+y \leq 1$), selected from among, for example, GaN, AlN, AlGaN, InGaN, InN, InAlGaN, and AlInN, and may be doped with an n-type dopant such as Si, Ge, or Sn.

The intermediate layer 233 may be an area where electrons and holes recombine to change to a lower energy level and generate light having a corresponding wavelength. The intermediate layer 233 may include a semiconductor material having a composition formula of $In_xAl_yGa_{1-x-y}N$ ($0 \leq x \leq 1$, $0 \leq y \leq 1$, $0 \leq x+y \leq 1$), and may have a single or multi-quantum well (MQW) structure. Also, the intermediate layer 233 may have a quantum wire structure or a quantum dot structure.

Although the first semiconductor layer 231 includes a p-type semiconductor layer and the second semiconductor layer 232 includes an n-type semiconductor layer in FIG. 7B, the disclosure is not limited thereto. In another embodiment, the first semiconductor layer 231 may include an n-type semiconductor layer, and the second semiconductor layer 232 may include a p-type semiconductor layer.

The display apparatus 1 according to the above embodiments may be used in various electronic devices capable of providing an image. The term "electronic device" refers to a device capable of providing a certain image by using electricity.

FIGS. 8A to 8G are perspective views schematically illustrating embodiments of an electronic device including a display apparatus, according to an embodiment.

Figure 8A:
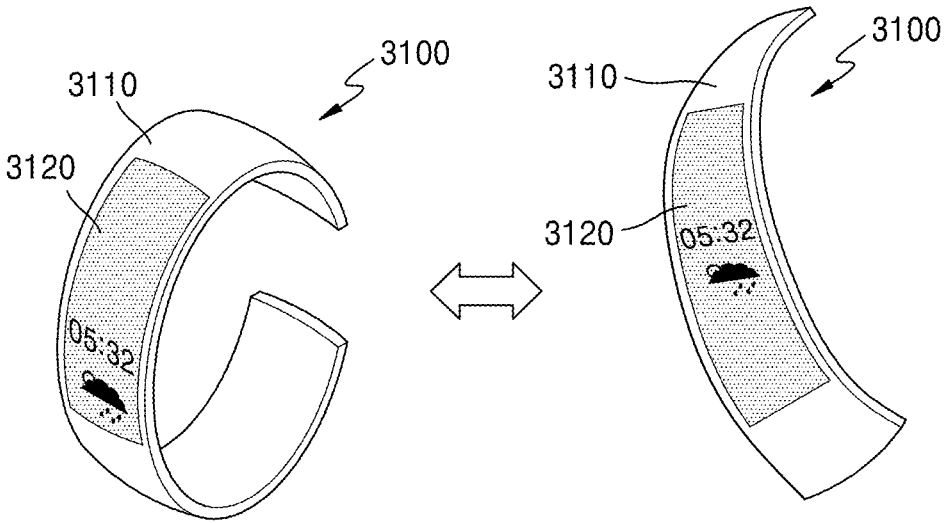
FIGS. 8A to 8G are perspective views schematically illustrating embodiments of an electronic device including a display apparatus, according to an embodiment.

Referring to FIG. 8A, a display apparatus according to an embodiment may be used in a wearable electronic device 3100 that may be worn on a user's body part. The wearable electronic device 3100 may include a body portion 3110 and a display unit 3120 provided on the body portion 3110. A display apparatus according to embodiments may be used as the display unit 3120 of the wearable electronic device 3100. As shown in FIG. 8A, the wearable electronic device 3100 may be deformable. In an embodiment, the wearable electronic device 3100 may be used as a smart watch or a smartphone according to a user's selection.

Figure 8B:
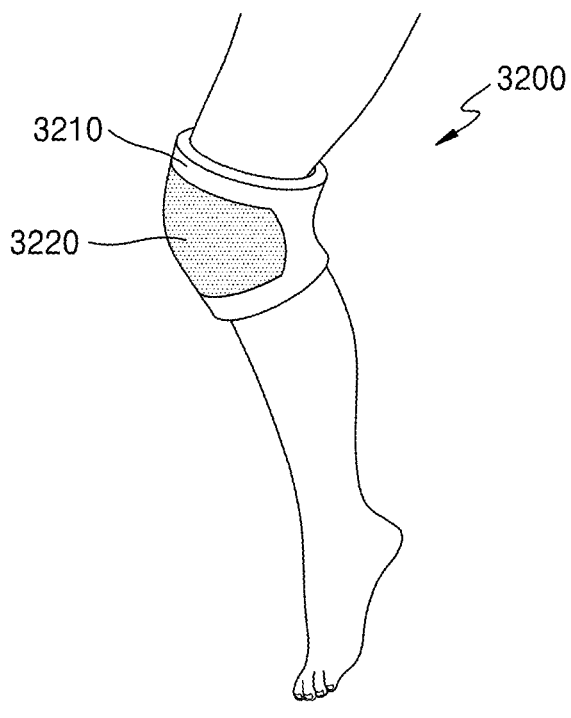

FIG. 8B illustrates a medical electronic device 3200. In an embodiment, the medical electronic device 3200 may include a body portion 3210 and a light-emitting unit 3220. A display apparatus according to embodiments may be used as the light-emitting unit 3220 of the medical electronic device 3200. The light-emitting unit 3220 may emit light of a certain wavelength band (e.g., infrared light or visible light) to a patient's body. In an embodiment, the body portion 3210 may include a stretchable fiber material, and may have a structure that may be worn on a user's body.

Figure 8C:
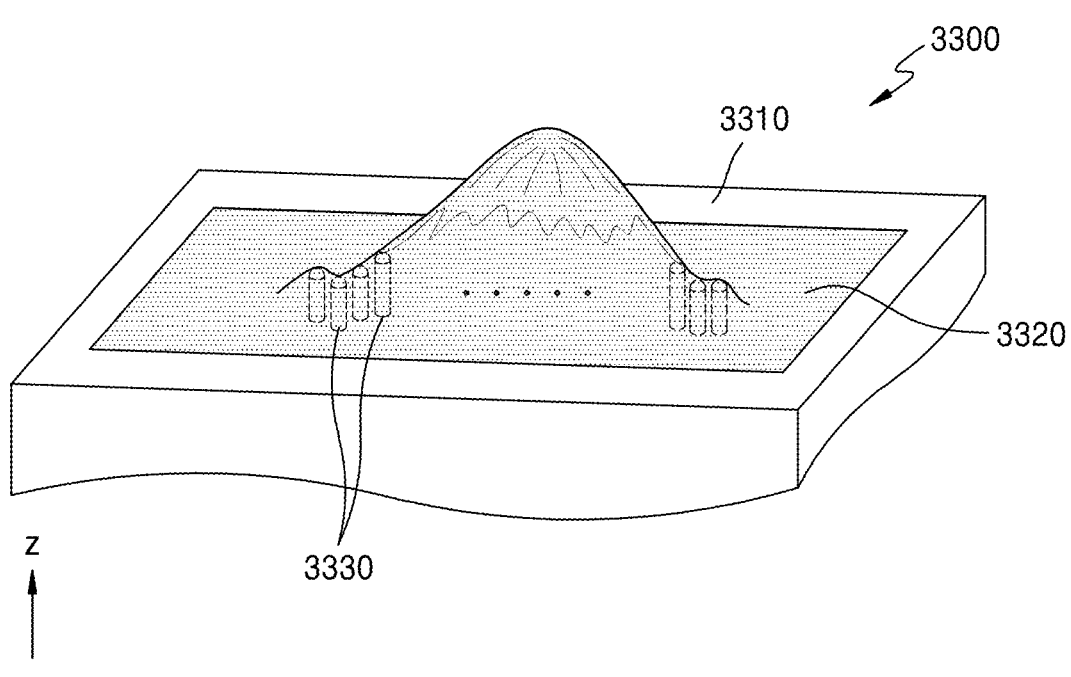

FIG. 8C illustrates an educational electronic device 3300. In an embodiment, the educational electronic device may include a display unit 3320 provided in a frame 3310.

The display unit 3320 may use a display apparatus according to embodiments. An image such as a sea with waves, a snow-covered mountain, or a volcano through which lava flows may be provided through the display unit 3320, and in this case, the display unit 3320 may be stretched in a height direction (e.g., the z direction) by reflecting the height of the waves, mountain, or volcano. In some embodiments, a part of the display unit 3320 may be sequentially changed in height along a direction in which the lava flows to three-dimensionally show the movement of the lava. The educational electronic device 3300 may include a plurality of pins (or stroke units 3330) located on a rear surface of the display unit 3320 so that the display unit 3320 is stretched in the height direction. As the pins 3330 move along the third direction (e.g., the z direction or the −z direction), an image displayed on the display unit 3320 may be implemented to have a three-dimensional height. Although the educational electronic device 3300 is described with reference to FIG. 8C, its use is not limited as long as certain image information is provided.

Although an electronic device as shown in FIGS. 8A to 8C is an electronic device whose shape is variable, the disclosure is not limited thereto. As in embodiments described below, a display apparatus according to embodiments may be used in an electronic device in which a portion for displaying an image (e.g., a screen) is fixed.

Figure 8D:
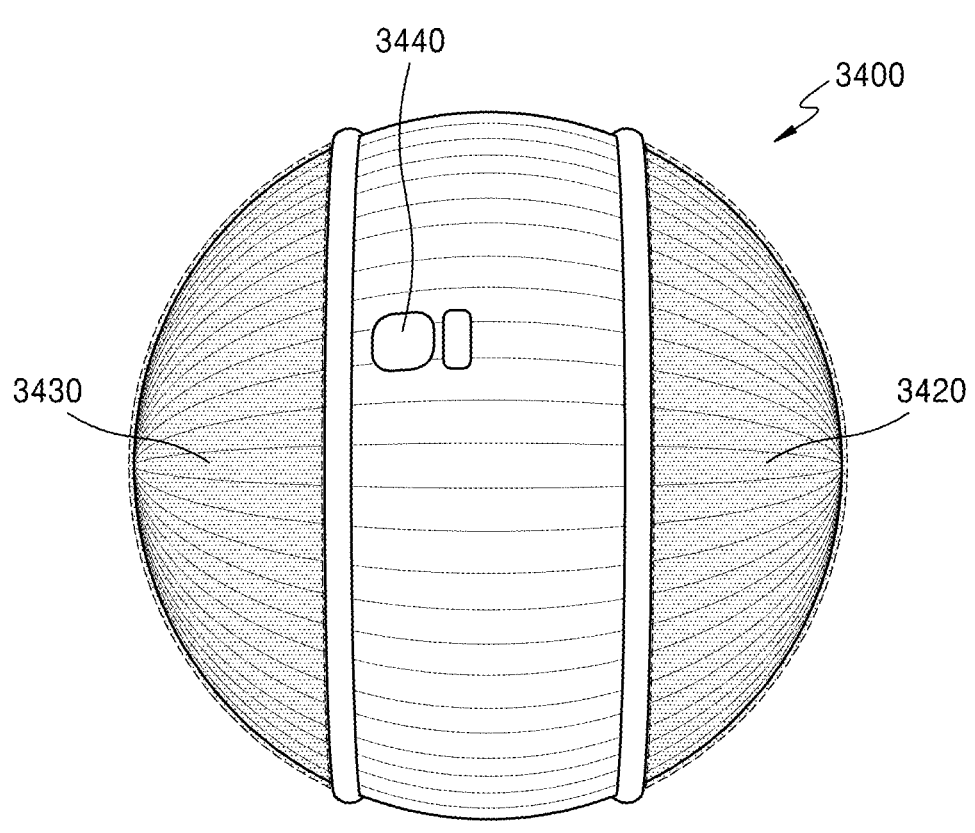

FIG. 8D illustrates a robot 3400 as an electronic device, according to an embodiment. The robot 3400 may recognize movement or an object by using a camera unit 3440, and may display a certain image to a user through display units 3420 and 3430. In some embodiments, because display apparatuses according to an embodiment may be stretched in various directions as described above, the display apparatuses may be assembled into a body frame having a hemispherical shape, and thus, the robot 3400 may include the display units 3420 and 3430 each having a hemispherical shape.

Figure 8E:
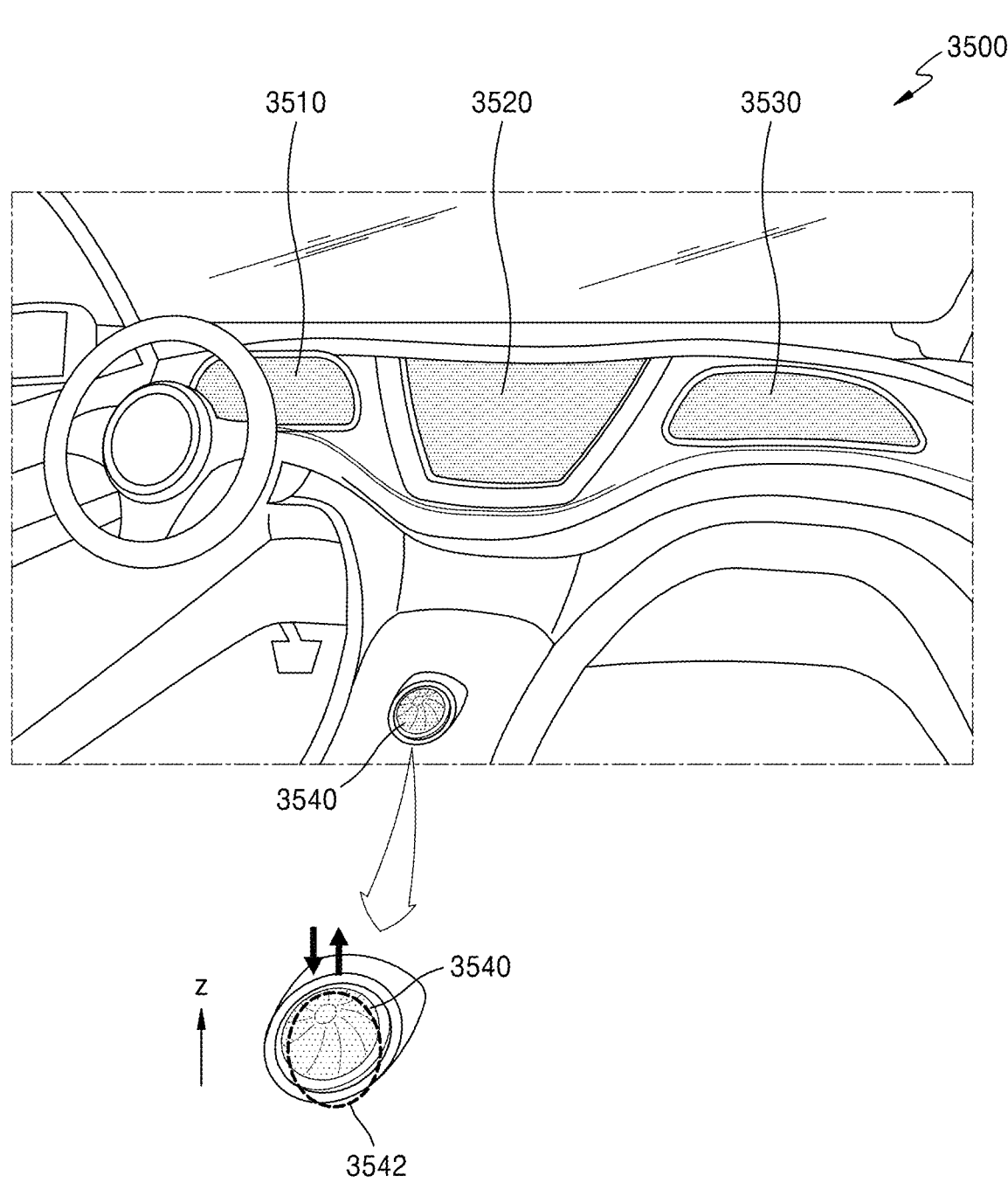

FIG. 8E illustrates a display device 3500 for a vehicle as an electronic device, according to an embodiment. The display device 3500 for a vehicle may include a cluster 3510, a center information display (CID) 3520, and/or a passenger display (co-driver display). Because a display apparatus according to an embodiment may be stretched in various directions, the display apparatus may be used in the cluster 3510, the CID 3520, and/or the co-driver display regardless of a shape of an internal frame of a vehicle.

Although the cluster 3510, the CID 3520, and/or the co-driver display are separated from each other in FIG. 8E, the disclosure is not limited thereto. In another embodiment, two or more selected from the cluster 3510, the CID 3520, and the co-driver display may be integrally connected.

In some embodiments, the display device 3500 for a vehicle may include a button 3540 for displaying a certain image. Referring to an enlarged view of FIG. 8E, the button 3540 having a hemispherical shape may include an object 3542 that provides a feeling of using the button while moving in the z direction or the −z direction, and a display apparatus located on the object 3542. In some embodiments, when the object 3542 has a three-dimensionally rounded surface, the display apparatus may also have a three-dimensionally rounded surface.

Figure 8F:
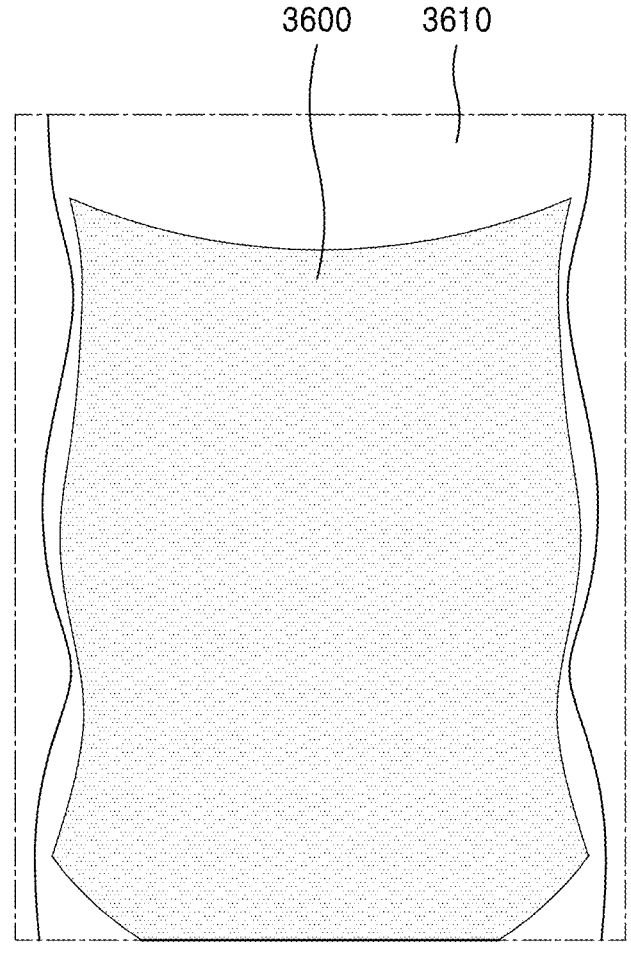

FIG. 8F illustrates an electronic device 3600 for advertisement or exhibition as an electronic device, according to an embodiment. In some embodiments, the electronic device 3600 for advertisement or exhibition may be installed on a fixed structure 3610 such as a wall or a pillar. When the structure 3610 includes an uneven surface as shown in FIG. 8F, the electronic device 3600 for advertisement or exhibition may be located along the uneven surface of the structure 3610. In some embodiments, the electronic device 3600 for advertisement or exhibition may be installed on the structure 3610 by using a heat shrink film or the like.

Figure 8G:
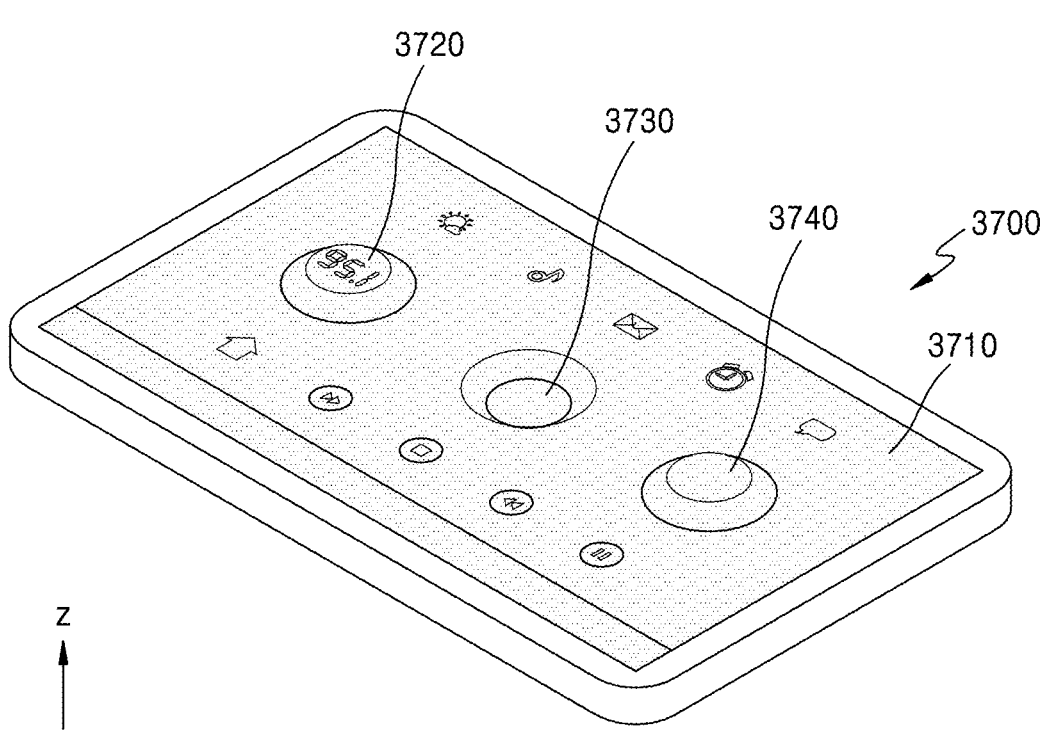

FIG. 8G illustrates a controller 3700 as an electronic device, according to an embodiment. The controller 3700 may include an image-type button. For example, a display unit 3710 of the controller 3700 may include first to third button areas 3720, 3730, and 3740 protruding in the z direction or protruding in the −z direction (or recessed in the z direction). In some embodiments, the first and third button areas 3720 and 3740 may protrude in the z direction, and the second button area 3730 may protrude in the −z direction (or be recessed in the z direction).

Figure 9:
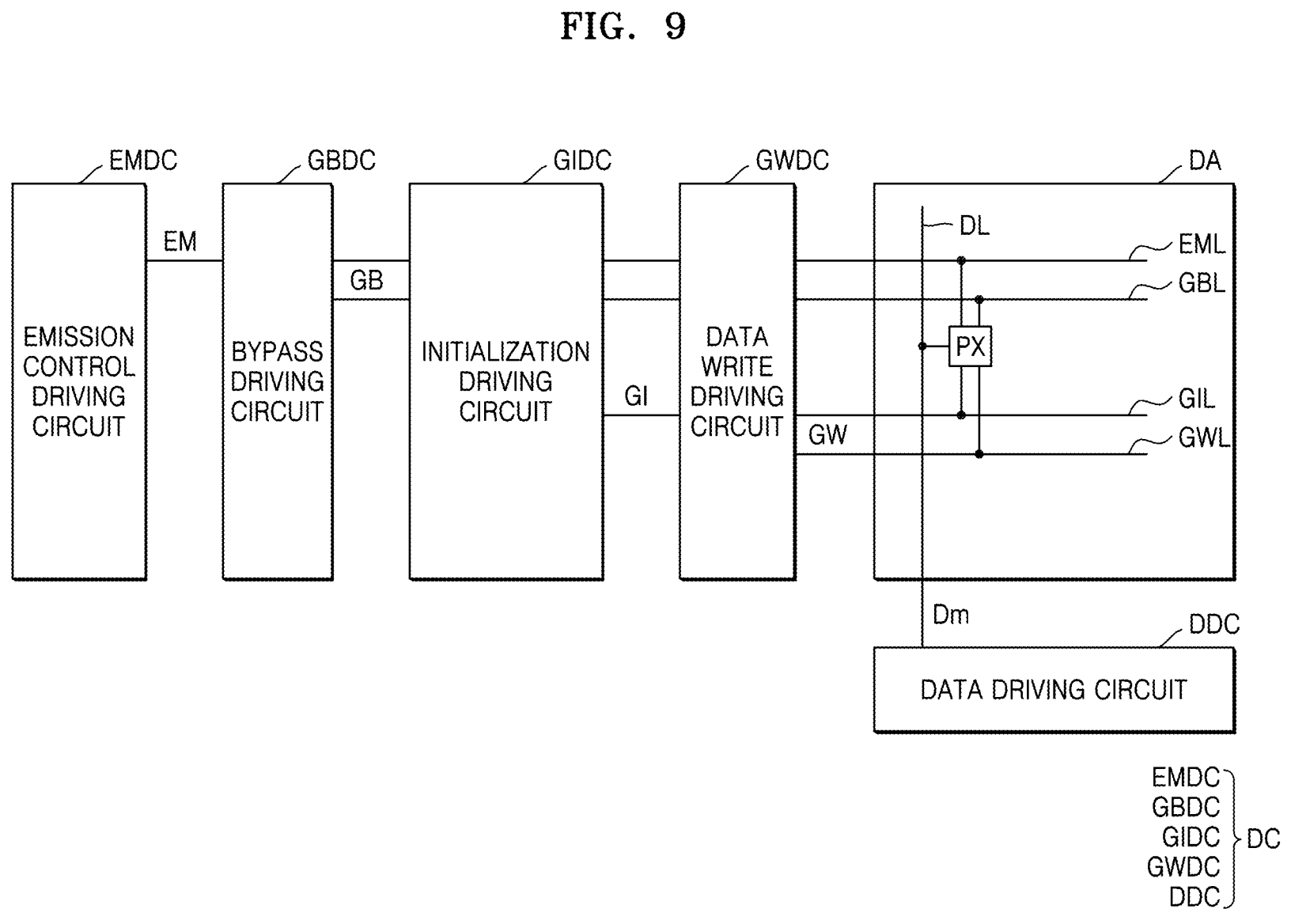

FIG. 9 is a schematic diagram illustrating a configuration of a display apparatus, according to an embodiment.

Referring to FIG. 9, in a display area DA, a plurality of pixels PX and signal lines for applying electrical signals to the plurality of pixels PX may be located. The signal lines for applying electrical signals to the pixels PX may include a plurality of data lines DL, a plurality of emission control lines EML, a plurality of scan signal lines GWL, a plurality of initialization control lines GIL, and a plurality of bypass control lines GBL.

A driving circuit DC for providing a signal for driving the pixels PX may be located outside the display area DA. The driving circuit DC may include a data driving circuit DDC and a gate driving circuit GDC (see FIG. 3), and the gate driving circuit GDC (see FIG. 3) may include an emission control driving circuit EMDC, a bypass driving circuit GBDC, an initialization driving circuit GIDC, and a data write driving circuit GWDC. The data driving circuit DDC may be located adjacent to a lower surface of the display area DA, may be connected to the data lines DL, and may output data signal Dm to the data lines DL.

The emission control driving circuit EMDC (or a first gate driving circuit), the bypass driving circuit GBDC (or a second gate driving circuit), the initialization driving circuit GIDC (or a third gate driving circuit), and the data write driving circuit GWDC (or a fourth gate driving circuit) may be located adjacent to a left surface or a right surface of the display area DA. The emission control driving circuit EMDC may be connected to the emission control lines EML, and may output an emission control signal EM to the emission control lines EML. The bypass driving circuit GBDC may be connected to the bypass control lines GBL, and may output a bypass control signal GB to the bypass control lines GBL. The initialization driving circuit GIDC may be connected to the initialization control lines GIL, and may output an initialization control signal GI to the initialization control lines GIL. The data write driving circuit GWDC may be connected to the scan signal lines GWL, and may output a scan signal GW.

Figure 10:
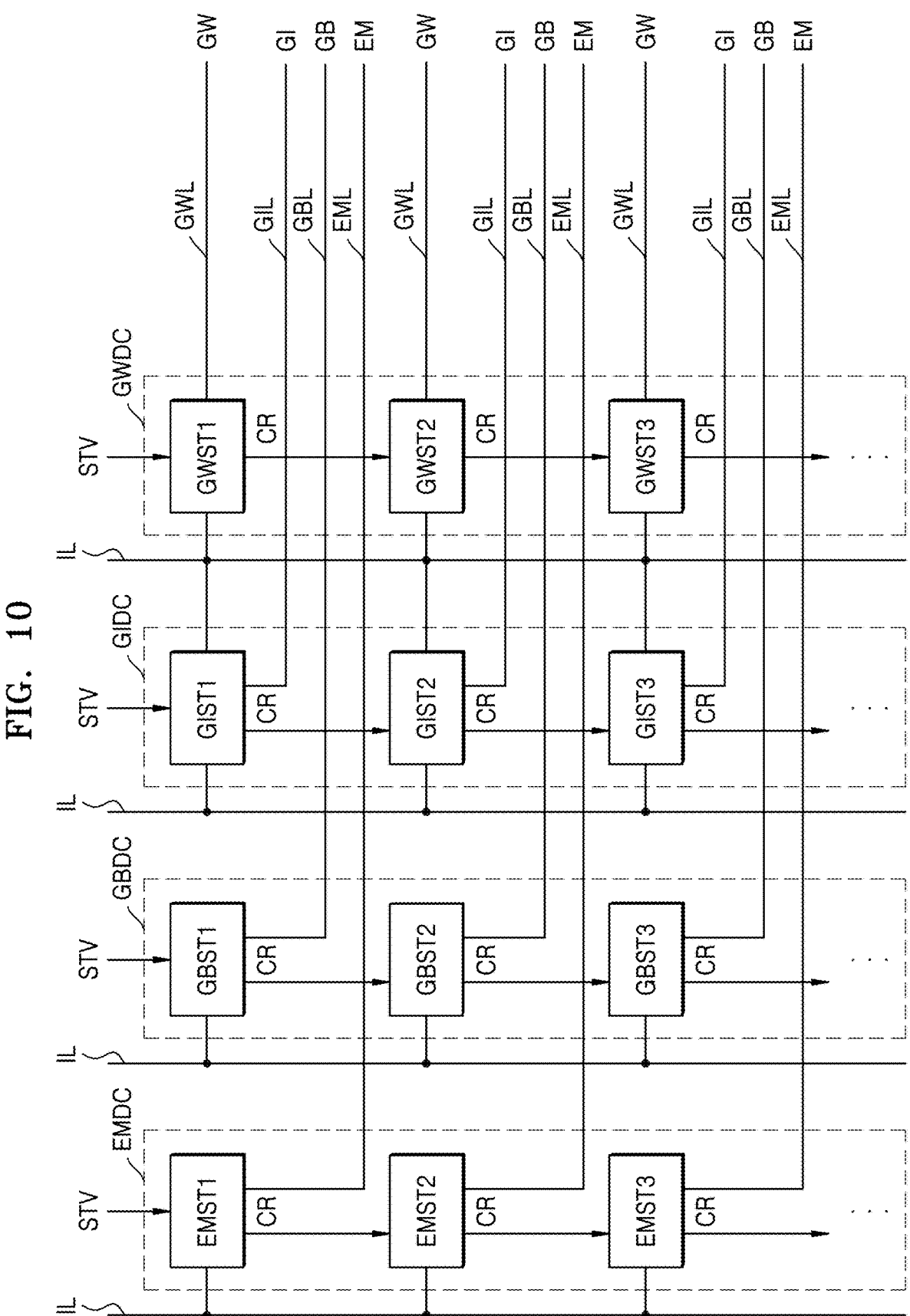
FIG. 10 is a diagram schematically illustrating a gate driving circuit of a display apparatus, according to an embodiment.

FIG. 10 is a diagram schematically illustrating a gate driving circuit, according to an embodiment. FIG. 10 is a diagram illustrating schematic configurations of an emission control driving circuit EMDC, a bypass driving circuit GBDC, an initialization driving circuit GIDC, and a data write driving circuit GWDC.

Referring to FIG. 10, the emission control driving circuit EMDC may be implemented as a shift register including a plurality of emission control stages (e.g., EMST1, EMST2, EMST3, . . . ). Each of the emission control stages (e.g., EMST1, EMST2, EMST3, . . . ) may be a sub-driving circuit. Each of the emission control stages (e.g., EMST1, EMST2, EMST3, . . . ) may be connected to a corresponding emission control line EML, and may output an emission control signal EM to the corresponding emission control line EML. A first emission control stage EMST1 may output an emission control signal EM in response to an external start signal STV, and each of the remaining emission control stages (e.g., EMST2, EMST3, . . . ) other than the first emission control stage EMST1 may receive a carry signal CR, output from a previous stage as a start signal. The emission control stages (e.g., EMST1, EMST2, EMST3, . . . ) may be connected to a plurality of input lines IL arranged outside the emission control stages (e.g., EMST1, EMST2, EMST3, . . . ).

The bypass driving circuit GBDC may be implemented as a shift register including a plurality of bypass stages (e.g., GBST1, GBST2, GBST3, . . . ). Each of the bypass stages (e.g., GBST1, GBST2, GBST3, . . . ) may be a sub-driving circuit. Each of the bypass stages (e.g., GBST1, GBST2, GBST3, . . . ) may be connected to a corresponding bypass control line GBL, and may output a bypass control signal GB to the corresponding bypass control line GBL. A first bypass stage GBST1 may output a bypass control signal GB in response to an external start signal STV, and each of the remaining bypass stages (e.g., GBST2, GBST3, . . . ) other than the first bypass stage GBST1 may receive a carry signal CR output from a previous stage as a start signal. The bypass stages (e.g., GBST1, GBST2, GBST3, . . . ) may be connected to a plurality of input lines IL arranged outside the bypass stages (e.g., GBST1, GBST2, GBST3, . . . ).

The initialization driving circuit GIDC may be implemented as a shift register including a plurality of initialization stages (e.g., GIST1, GIST2, GIST3, . . . ). Each of the initialization stages (e.g., GIST1, GIST2, GIST3, . . . ) may be a sub-driving circuit. Each of the initialization stages (e.g., GIST1, GIST2, GIST3, . . . ) may be connected to an initialization control line GIL, and may output a corresponding initialization control signal GI to the corresponding initialization control line GIL. A first initialization stage GIST1 may output an initialization control signal GI in response to an external start signal STV, and each of the remaining stages (e.g., GIST2, GIST3, . . . ) other than the first initialization stage GIST1 may receive a carry signal CR output from a previous stage as a start signal. The initialization stages (e.g., GIST1, GIST2, GIST3, . . . ) may be connected to a plurality of input lines IL arranged outside the initialization stages (e.g., GIST1, GIST2, GIST3, . . . ).

The data write driving circuit GWDC may be implemented as a shift register including a plurality of data write stages (e.g., GWST1, GWST2, GWST3, . . . ). Each of the data write stages (e.g., GWST1, GWST2, GWST3, . . . ) may be a sub-driving circuit. Each of the data write stages (e.g., GWST1, GWST2, GWST3, . . . ) may be connected to a corresponding scan signal line GWL, and may output a scan signal GW to the corresponding scan signal line GWL. A first data write stage GWST1 may output a scan signal GW in response to an external start signal STV, and each of the remaining data write stages (e.g., GWST2, GWST3, . . . ) other than the first data write stage GWST1 may receive a carry signal CR output from a previous stage as a start signal. The data write stages (e.g., GWST1, GWST2, GWST3, . . . ) may be connected to a plurality of input lines IL arranged outside the data write stages (e.g., GWST1, GWST2, GWST3, . . . ).

The plurality of input lines IL may be signal lines including a plurality of voltage lines and a plurality of clock wirings. Only one input line is illustrated in FIG. 10 for convenience of illustration.

Figure 11A:
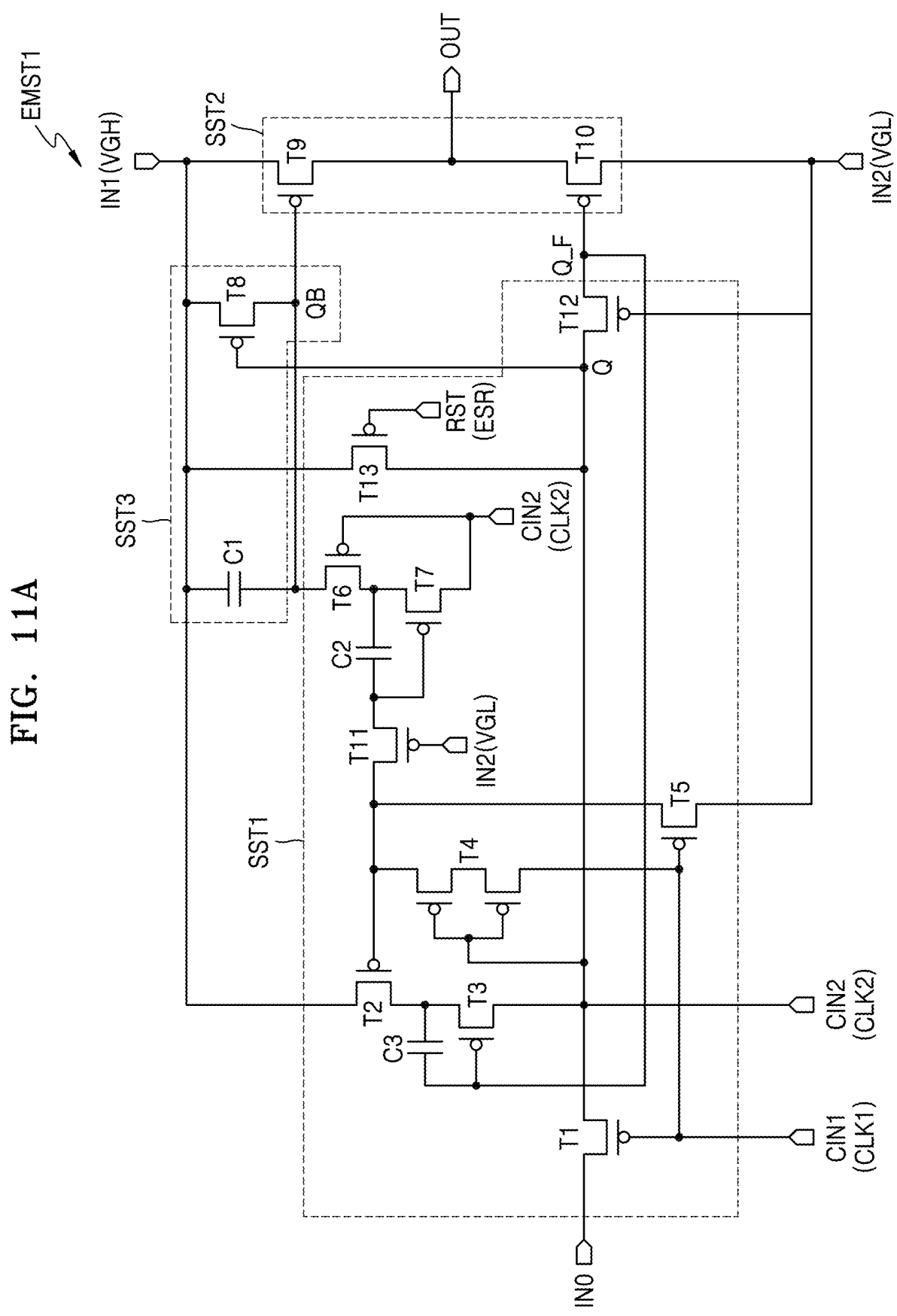
FIG. 11A is a circuit diagram illustrating an embodiment of a first emission stage included in the gate driving circuit of FIG. 10.
Figure 11B:
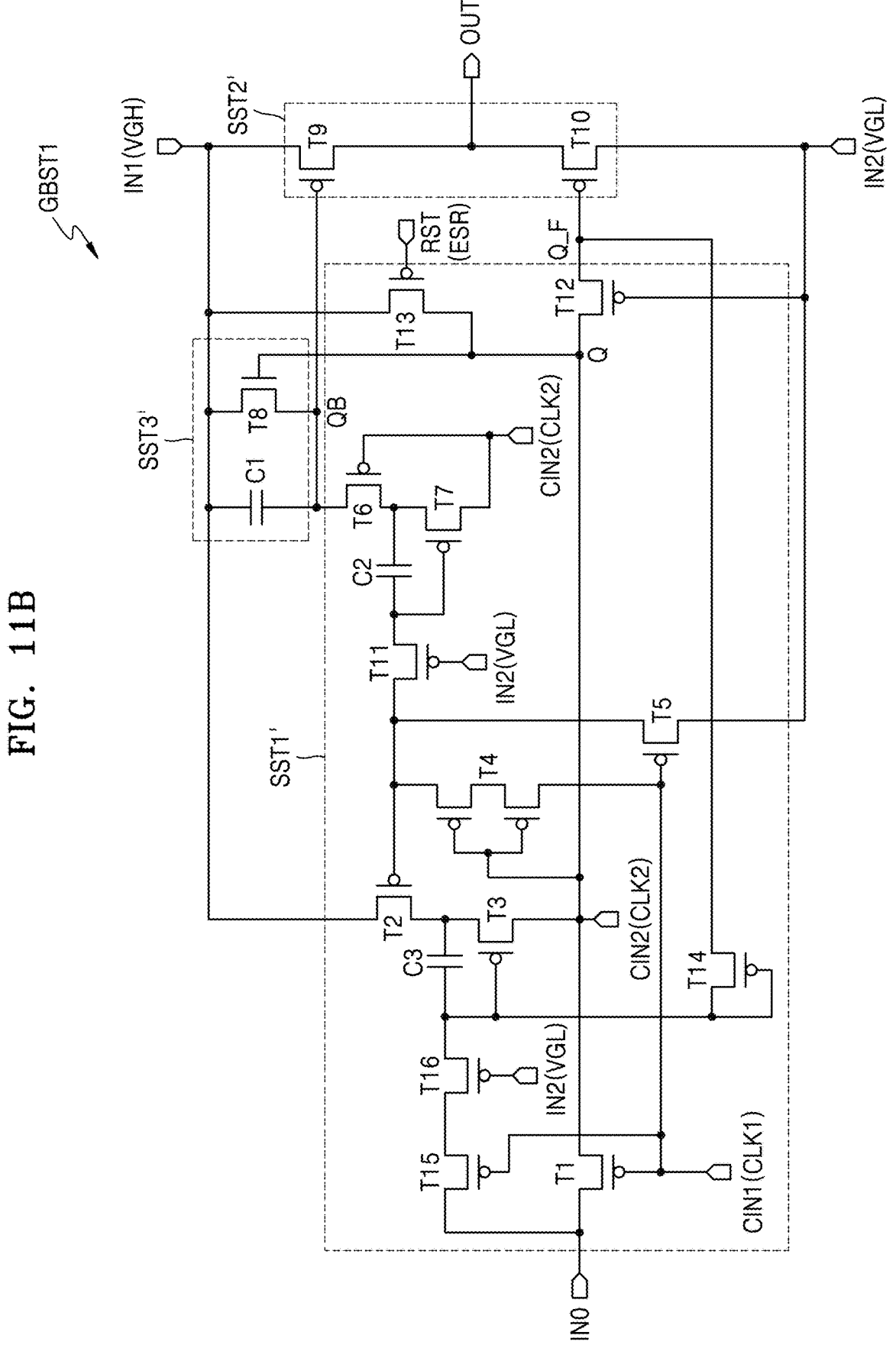
FIG. 11B is a circuit diagram illustrating an embodiment of a first bypass stage included in the gate driving circuit of FIG. 10.
Figure 11C:
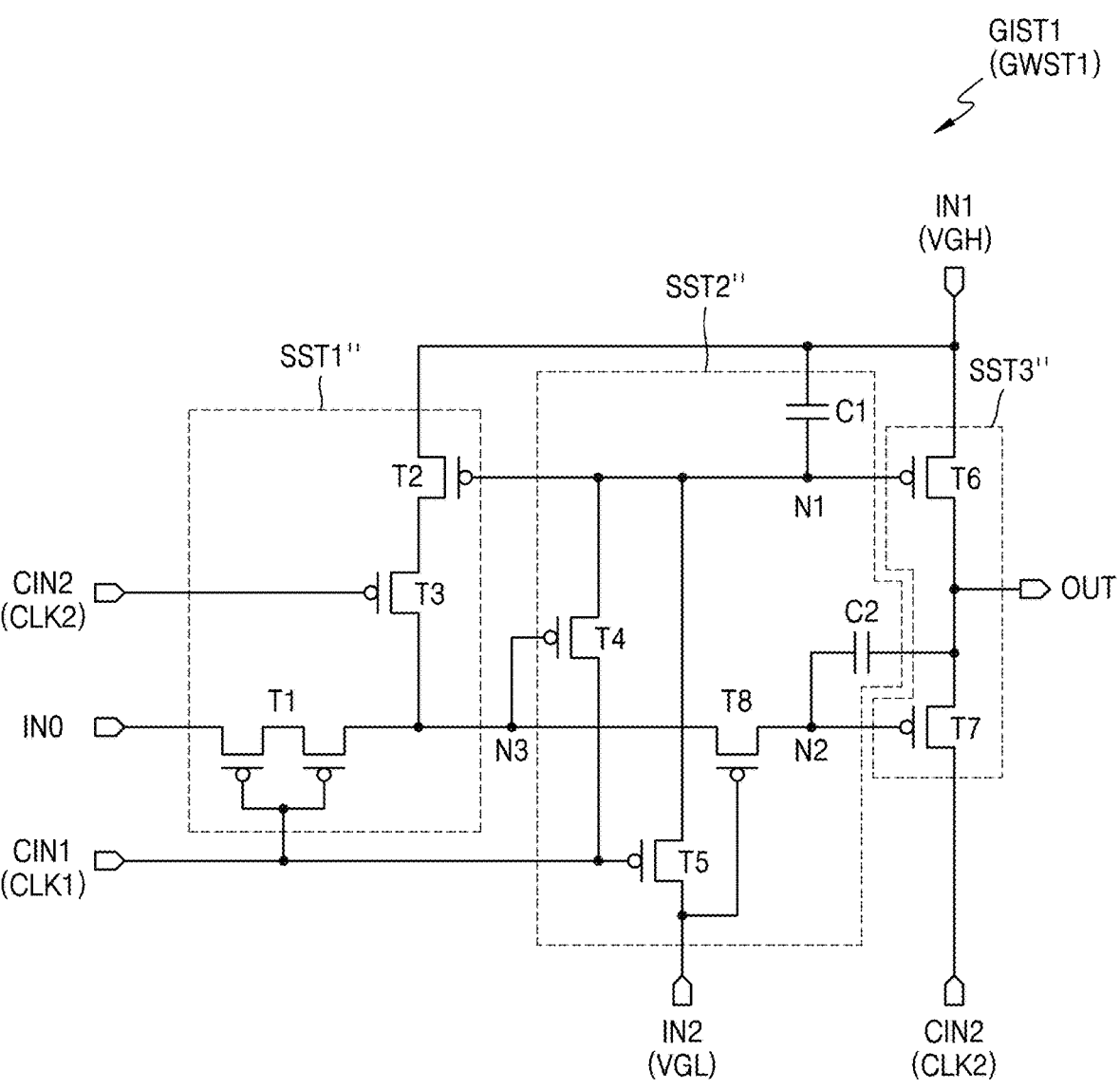
FIG. 11C is a circuit diagram illustrating a first initialization stage included in the gate driving circuit of FIG. 10, according to an embodiment.

FIG. 11A is a circuit diagram illustrating an embodiment of a first emission stage included in the gate driving circuit of FIG. 10. FIG. 11B is a circuit diagram illustrating an embodiment of a first bypass stage included in the gate driving circuit of FIG. 10. FIG. 11C is a circuit diagram illustrating a first initialization stage included in the gate driving circuit of FIG. 10, according to an embodiment.

First, referring to FIG. 11A, a first emission stage EMST1 may include an input terminal IN0, a first power input terminal IN1, a second power input terminal IN2, a first clock input terminal CIN1, a second clock input terminal CIN2, a reset terminal RST, and an output terminal OUT. An internal circuit configuration of the first emission stage EMST1 may be substantially the same as the internal circuit configuration of other emission stages.

Figure 13:
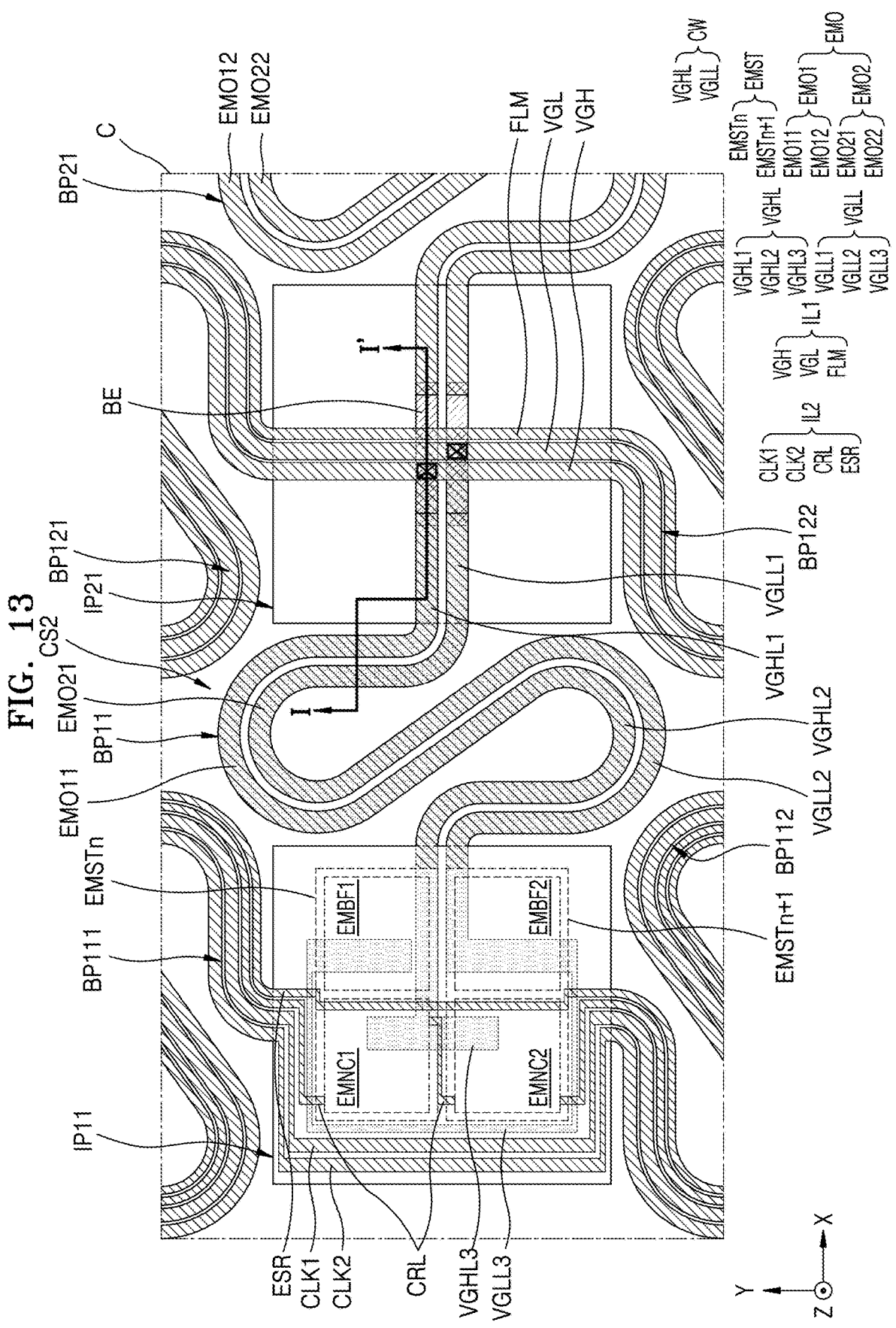
FIG. 13 is an enlarged schematic plan view illustrating a portion C of the display apparatus of FIG. 12, according to an embodiment.

The first power input terminal IN1 may be connected to a gate high voltage wiring VGH (see FIG. 13), the second power input terminal IN2 may be connected to a gate low voltage wiring VGL (see FIG. 13), and the reset terminal RST may be connected to a reset signal wiring ESR (see FIG. 13). Also, the first clock input terminal CIN1 may be connected to a first clock wiring CLK1, and the second clock input terminal CIN2 may be connected to a second clock wiring CLK2. The input terminal IN0 may be connected to a start signal wiring FLM (see FIG. 13), and emission stages other than the first emission stage EMST1 may be connected to a carry wiring CRL (see FIG. 13) connected to an output terminal OUT of a previous stage.

The first emission stage EMST1 may include a node controller SST1, an output unit SST2 (or a buffer unit), and a node maintaining unit SST3.

First, the output unit SST2 may be connected to the first power input terminal IN1 and the second power input terminal IN2, and the output unit SST2 may output a gate power voltage as a first gate signal to the output terminal OUT based on a voltage of a second control node Q_F and a first control node QB.

The output unit SST2 may include a ninth transistor T9 (or a pull-up transistor) and a tenth transistor T10 (or a pull-down transistor). The ninth transistor T9 may include a first electrode connected to the first power input terminal, a second electrode connected to the output terminal OUT, and a gate electrode connected to the first control node QB.

The tenth transistor T10 may include a first electrode connected to the output terminal OUT, a second electrode connected to the second power input terminal IN2, and a gate electrode connected to the second control node Q_F.

The node controller SST1 may be connected to the input terminal IN0, the first power input terminal IN1, the second power input terminal IN2, the first clock input terminal CIN1, and the second clock input terminal CIN2. The node controller SST1 may control a voltage of the first control node QB and a voltage of the second control node Q_F by using a start signal (or a previous gate signal) provided through the input terminal IN0 and a gate high voltage received from the gate high voltage wiring VGH.

The node controller SST1 may include first, second, third, fourth, fifth, sixth, seventh, $11^{th}$, $12^{th}$, and $13^{th}$ transistors T1, T2, T3, T4, T5, T6, T7, T11, T12, and T13, a second capacitor C2, and a third capacitor C3.

The first transistor T1 may include a first electrode connected to the input terminal IN0, a second electrode connected to a third control node Q (or a first electrode of the $12^{th}$ transistor T12), and a gate electrode connected to the first clock input terminal CIN1. The second transistor T2 may include a first electrode connected to the first power input terminal IN1, a second electrode connected to a first electrode of the third transistor T3, and a gate electrode connected to a first electrode of the $11^{th}$ transistor T11.

The third transistor T3 may include the first electrode connected to the second electrode of the second transistor T2, a second electrode connected to the second clock input terminal CIN2, and a gate electrode connected to the second control node Q_F. The third capacitor C3 may be formed between the second electrode of the second transistor T2 and the second control node Q_F, and may include a first electrode connected to the second electrode of the second transistor T2 and a second electrode connected to the second control node Q_F.

The fourth transistor T4 may include one pair of transistors, may be connected in series between the gate electrode of the second transistor T2 and the first clock input terminal CIN1, and may include a gate electrode connected to the third control node Q. The fifth transistor T5 may include a first electrode connected to the gate electrode of the second transistor T2, a second electrode connected to the second power input terminal IN2, and a gate electrode connected to the first clock input terminal CIN1.

The sixth transistor T6 may include a first electrode connected to the first control node QB, a second electrode connected to a first electrode of the seventh transistor T7, and a gate electrode connected to the second clock input terminal CIN2. The seventh transistor T7 may include the first electrode connected to the second electrode of the sixth transistor T6, a second electrode connected to the second clock input terminal CIN2, and a gate electrode connected to a second electrode of the $11^{th}$ transistor T11.

The second capacitor C2 may be formed between the second electrode of the $11^{th}$ transistor T11 and the second electrode of the sixth transistor T6, and may include a first electrode connected to the second electrode of the $11^{th}$ transistor T11 and a second electrode connected to the second electrode of the sixth transistor T6. The $11^{th}$ transistor T11 may include the first electrode connected to the gate electrode of the second transistor T2, the second electrode connected to the first electrode of the second capacitor C2, and a gate electrode connected to the second power input terminal IN2.

The $12^{th}$ transistor T12 may include the first electrode connected to the third control node Q (or the second electrode of the first transistor T1), a second electrode connected to the second control node Q_F, and a gate electrode connected to the second power input terminal IN2. The $13^{th}$ transistor T13 may include a first electrode connected to the first power input terminal IN1, a second electrode connected to the third control node Q (or the second electrode of the first transistor T1), and a gate electrode connected to the reset terminal RST. The reset terminal RST may be connected to the reset signal wiring ESR (see FIG. 13). When the display apparatus is turned on or turned off, a low-level reset signal may be applied to the reset terminal RST, the $13^{th}$ transistor T13 may be turned on in response to the low-level reset signal, and a reset operation may be performed so that a voltage at the second electrode (and the third control node Q) of the first transistor T1 has a high level.

The node maintaining unit SST3 may keep constant a voltage of the first control node QB in response to a voltage of the third control node Q. The node maintaining unit SST3 may include a first capacitor C1 and an eighth transistor T8.

The first capacitor C1 may be formed between the first power input terminal IN1 and the first control node QB, and may include a first electrode connected to the first power input terminal IN1 and a second electrode connected to the first control node QB. The first capacitor C1 may keep constant a voltage difference between the first power input terminal IN1 and the first control node QB.

The eighth transistor T8 may include a first electrode connected to the first power input terminal IN1, a second electrode connected to the first control node QB, and a gate electrode connected to the third control node Q. The eighth transistor T8 may keep constant a voltage of the first control node QB in response to a voltage of the third control node Q. For example, when a voltage of the third control node Q has a low level, the eighth transistor T8 may maintain a voltage of the first control node QB at a high level by using a gate high voltage.

Each of the first to $13^{th}$ transistors T1 to T13 may be a P-type transistor. Although the first to $12^{th}$ transistors T1 to T12 are single gate transistors in FIG. 11A, the disclosure is not limited thereto. For example, to improve reliability, at least one of the first to $12^{th}$ transistors T1 to T12 may be implemented as a dual gate transistor.

An emission control signal EM (see FIG. 10) output from the first emission stage EMST1 having the above configuration may be transmitted to a corresponding emission control line EML (see FIG. 10) through a corresponding emission output wiring. Also, a signal output from the first emission stage EMST1 may be transmitted to a second emission stage EMST2 (see FIG. 10) located next to the first emission stage EMST1 through a carry wiring CRL (see FIG. 13).

Next, referring to FIG. 11B, a first bypass stage GBST1 may include an input terminal IN0, a first power input terminal IN1, a second power input terminal IN2, a first clock input terminal CIN1, a second clock input terminal CIN2, a reset terminal RST, and an output terminal OUT. An internal circuit configuration of the first bypass stage GBST1 may be substantially the same as the internal circuit configuration of other bypass stages.

The first power input terminal IN1 may be connected to a gate high voltage wiring VGH (see FIG. 13), the second power input terminal IN2 may be connected to a gate low voltage wiring VGL (see FIG. 13), and the reset terminal RST may be connected to a reset signal wiring ESR (see FIG. 13). Also, the first clock input terminal CIN1 may be connected to a first clock wiring CLK1, and the second clock input terminal CIN2 may be connected to a second clock wiring CLK2. The input terminal IN0 may be connected to a start signal wiring FLM (see FIG. 13), and bypass stages other than the first bypass stage GBST1 may be connected to a carry wiring CRL (see FIG. 13) connected to an output terminal OUT of a previous stage.

The first bypass stage GBST1 may include a node controller SST1', an output unit SST2' (or a buffer unit), and a node maintaining unit SST3'. The first bypass stage GBST1 may be substantially the same as or similar to the first emission stage EMST1 except for $14^{th}$ to $16^{th}$ transistors T14, T15, and T16. Accordingly, a repeated description will be omitted.

The first bypass stages GBST1 may further include the $14^{th}$ to $16^{th}$ transistors T14, T15, and T16.

The $14^{th}$ transistor T14 may include a first electrode connected to a gate electrode of a third transistor T3, a second electrode connected to a second control node Q_F, and a gate electrode connected to the gate electrode of the third transistor T3. That is, the $14^{th}$ transistor T14 may be diode-connected between the gate electrode of the third transistor T3 and the second control node Q_F. The $14^{th}$ transistor T14 may keep constant a voltage of the second control node Q_F, regardless of the voltage change of a gate electrode of the third transistor T3, after a specific point of time.

The $15^{th}$ transistor T15 may include a first electrode connected to the input terminal IN0, a second electrode connected to a first electrode of the $16^{th}$ transistor T16, and a gate electrode connected to the first clock input terminal CIN1. The $15^{th}$ transistor T15 may initialize the gate electrode of the third transistor T3, by using a start signal (or a previous compensate gate signal) provided to the input terminal IN0, in response to a first clock signal provided through the first clock input terminal CIN1.

The $16^{th}$ transistor T16 may include the first electrode connected to the second electrode of the $15^{th}$ transistor T15, a second electrode connected to the gate electrode of the third transistor T3, and a gate electrode connected to the second power input terminal IN2. The $16^{th}$ transistor T16 may reduce or distribute a bias voltage applied to the $15^{th}$ transistor T15 between the input terminal IN0 and the gate electrode of the third transistor T3.

A bypass control signal GB (see FIG. 10) output from the first bypass stage GBST1 having the above configuration may be transmitted to a corresponding bypass control line GBL (see FIG. 10) through a corresponding bypass output wiring. Also, a signal output from the first bypass stage GBST1 may be transmitted to a second bypass stage GBST2 (see FIG. 10) located next to the first bypass stage GBST1 through a carry wiring CRL (see FIG. 15).

Next, referring to FIG. 11C, a first initialization stage GIST1 may include an input terminal IN0, a first power input terminal IN1, a second power input terminal IN2, a first clock input terminal CIN1, a second clock input terminal CIN2, and an output terminal OUT. An internal circuit configuration of the first initialization stage GIST1 may be the same as an internal circuit configuration of a first scan stage GWST1. Also, an internal circuit configuration of the first initialization stage GIST1 may be substantially the same as the internal circuit configuration of other initialization stages, and an internal circuit configuration of the first scan stage GWST1 may be substantially the same as the internal circuit configuration of other scan stages.

The first power input terminal IN1 may be connected to a gate high voltage wiring VGH (see FIG. 13), and the second power input terminal IN2 may be connected to a gate low voltage wiring VGL (see FIG. 13). Also, the first clock input terminal CIN1 may be connected to a first clock wiring CLK1, and the second clock input terminal CIN2 may be connected to a second clock wiring CLK2. The input terminal IN0 may be connected to a start signal wiring FLM (see FIG. 13), and initialization stages other than the first initialization stage GIST1 may be connected to a carry wiring CRL (see FIG. 13) connected to an output terminal OUT of a previous stage.

The first initialization stage GIST1 may include a first node controller SST1", a second node controller SST2", and an output unit SST3".

The output unit SST3" may control a voltage supplied to the output terminal OUT in response to a voltage of a first node N1 and a second node N2. To this end, the output unit SST3" may include a sixth transistor T6 and a seventh transistor T7. The output unit SST3" may be driven as a buffer. The sixth transistor T6 and the seventh transistor T7 included in the output unit SST3" may be connected in parallel to each other as shown in FIG. 11C.

The sixth transistor T6 may be connected between the output terminal OUT and the first power input terminal IN1 connected to a gate high voltage wiring VGH. The sixth transistor T6 may control connection between the first power input terminal IN1 and the output terminal OUT in response to a voltage applied to the first node N1. The sixth transistor T6 may include a first electrode connected to the first power input terminal IN1, a second electrode connected to the output terminal OUT, and a gate electrode connected to the first node N1.

The seventh transistor T7 may be connected between the output terminal OUT and the second clock input terminal CIN2 connected to the second clock wiring CLK2. The seventh transistor T7 may control connection between the output terminal OUT and the second clock input terminal CIN2 in response to a voltage applied to the second node N2. The seventh transistor T7 may include a first electrode connected to the output terminal OUT, a second electrode connected to the second clock input terminal CIN2, and a gate electrode connected to the second node N2.

The first node controller SST1" may control a voltage of a third node N3 in response to signals supplied to the input terminal IN0, the first clock input terminal CIN1, and the second clock input terminal CIN2. To this end, the first node controller SST1" may include a first transistor T1, a second transistor T2, and a third transistor T3.

The first transistor T1 may be connected between the third node N3 and the input terminal IN0 to which a start signal (or a previous gate signal) is applied. The first transistor T1 may control connection between the third node N3 and the input terminal IN0 through a first clock signal supplied to the first clock input terminal CIN1. The first transistor T1 may have a dual gate structure to prevent leakage current. The first transistor T1 may include one pair of transistors, may be connected in series between the input terminal IN0 and the third node N3, and may include a gate electrode connected to the first clock input terminal CIN1.

The second transistor T2 and the third transistor T3 may be connected in series between the third node N3 and the first power input terminal IN1. The third transistor T3 may be connected between the second transistor T2 and the third node N3. The third transistor T3 may control connection between the second transistor T2 and the third node N3 in response to a second clock signal supplied to the second clock input terminal CIN2. The third transistor T3 may include a first electrode connected to a second electrode of the second transistor T2, a second electrode connected to the third node N3, and a gate electrode connected to the second clock input terminal CIN2.

The second transistor T2 may be connected between the third transistor T3 and the first power input terminal IN1. The second transistor T2 may control connection between the third transistor T3 and the first power input terminal IN1 in response to a voltage of the first node N1. The second transistor T2 may include a first electrode connected to the first power input terminal IN1, the second electrode connected to the first electrode of the third transistor T3, and a gate electrode connected to the first node N1.

The second node controller SST2" may control a voltage of the first node N1 in response to a voltage of the first clock input terminal CIN1 and the third node N3. To this end, the second node controller SST2" may include an eighth transistor T8, a fourth transistor T4, a fifth transistor T5, a first capacitor C1, and a second capacitor C2.

The first capacitor C1 may be connected between the first node N1 and the first power input terminal IN1. The first capacitor C1 may charge a voltage applied to the first node N1. The first capacitor C1 may include a first electrode connected to the first node N1 and the first power input terminal IN1. The first electrode of the first capacitor C1 may be connected to the gate electrode of the second transistor T2 and the gate electrode of the sixth transistor T6.

The second capacitor C2 may be connected between the second node N2 and the output terminal OUT. The second capacitor C2 charges a voltage corresponding to turning-on and turning-off of the seventh transistor T7. The second capacitor C2 may include a first electrode connected to the second node N2 and a second electrode connected to the output terminal OUT. The first electrode of the second capacitor C2 may be electrically connected to a second electrode of the eight transistor T8.

The fourth transistor T4 may be connected between the first node N1 and the first clock input terminal CIN1. The fourth transistor T4 may control connection between the first node N1 and the first clock input terminal CIN1 in response to a voltage of the third node N3. The fourth transistor T4 may include a first electrode connected to the first clock input terminal CIN1, a second electrode connected to the first node N1, and a gate electrode connected to the third node N3.

The fifth transistor T5 may be located between the first node N1 and the second power input terminal IN2 connected to the gate low voltage wiring VGL. The fifth transistor T5 may control connection between the first node N1 and the second power input terminal IN2 in response to the first clock signal of the first clock input terminal CIN1. The fifth transistor T5 may include a first electrode connected to the first node N1, a second electrode connected to the second power input terminal IN2, and a gate electrode connected to the first clock input terminal CIN1.

The eighth transistor T8 may be located between the third node N3 and the second node N2. The eighth transistor T8 may maintain electrical connection between the third node N3 and the second node N2 while maintaining a turn-on state. Also, the eighth transistor T8 may limit a voltage drop width of the third node N3 in response to a voltage of the second node N2. The eighth transistor T8 may include a first electrode connected to the third node N3, the second electrode connected to the second node N2, and a gate electrode connected to the second power input terminal IN2.

An initialization control signal GI (see FIG. 10) output from the first initialization stage GIST1 having the above configuration may be transmitted to a corresponding initialization control line GIL (see FIG. 10) through a corresponding initialization output wiring. Also, a signal output from the first initialization stage GIST1 may be transmitted to a second initialization stage GIST2 (see FIG. 10) located next to the first initialization stage GIST1 through a carry wiring CRL (see FIG. 17).

Figure 12:
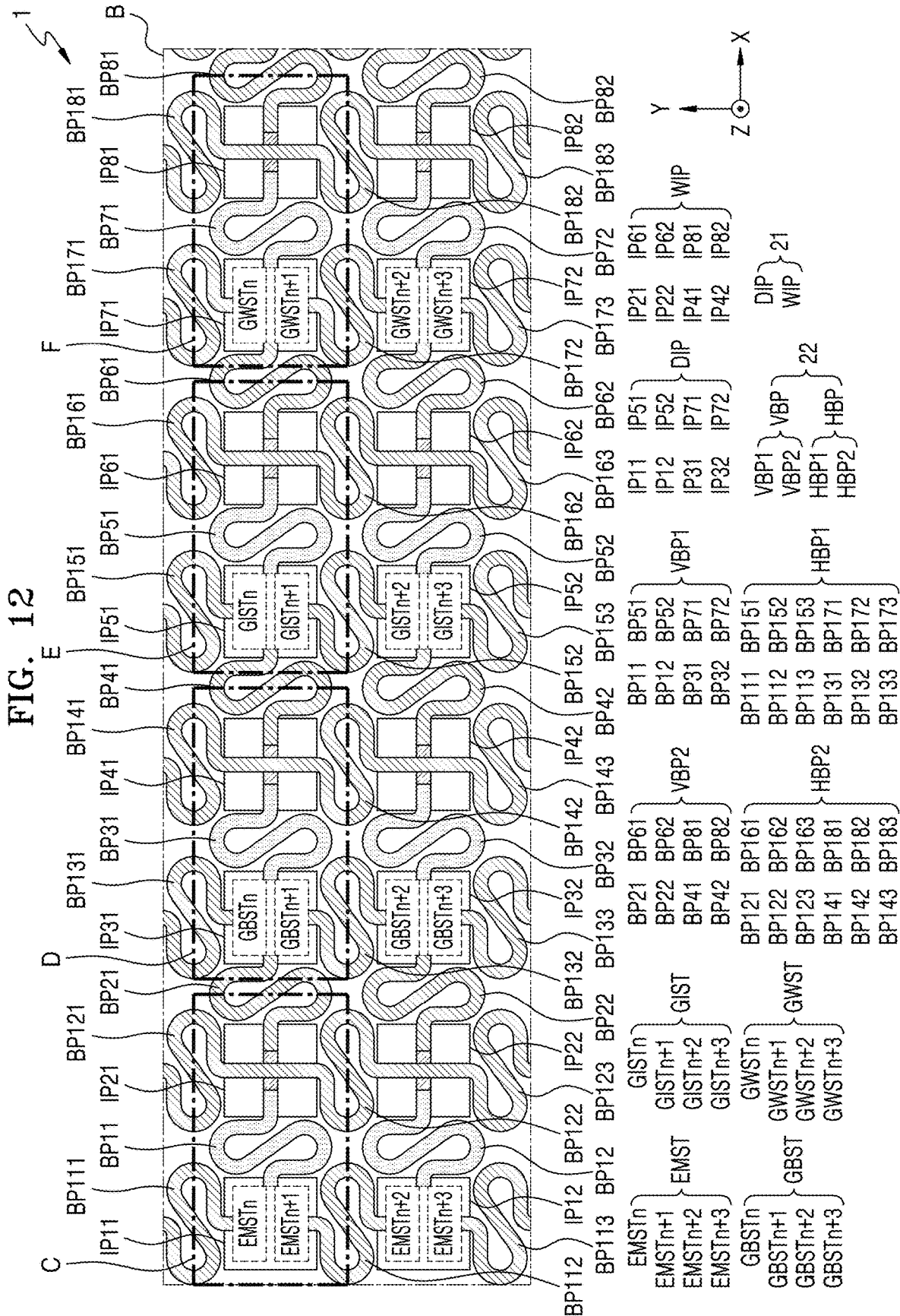
FIG. 12 is an enlarged schematic plan view illustrating a portion B of the display apparatus of FIG. 3, according to an embodiment.

FIG. 12 is an enlarged schematic plan view illustrating a portion B of the display apparatus of FIG. 3, according to an embodiment.

Referring to FIG. 12, in the non-display area NDA (see FIG. 3), a plurality of peripheral island portions 21 and a plurality of bridge portions 22 may be located. The plurality of peripheral island portions 21 may be spaced apart from each other, and the peripheral bridge portion 22 may connect adjacent peripheral island portions 21 to each other. When adjacent peripheral island portions 21 are connected to each other by the peripheral bridge portion 22 in the specification, it means that the peripheral bridge portion 22 extends between the adjacent peripheral island portions 21, and the peripheral island portions 21 and the plurality of peripheral bridge portions 22 are integrally provided.

The peripheral island portion 21 may include a driver island portion DIP where a driver stage may be located, and a wiring island portion WIP where input lines may be located. In detail, at least one driver stage may be located in the driver island portion DIP, and some of input lines for applying a signal or a voltage to the driver stage may be located in the wiring island portion WIP. However, not all of the input lines for applying a signal or a voltage to the driver stage are located in the wiring island portion WIP, and some may be located in the wiring island portion WIP and others may be located in the driver island portion DIP. Hereinafter, some of a plurality of input lines located in the wiring island portion WIP may be referred to as first input lines IL1 (see FIG. 13), and others of the plurality of input lines located in the driver island portion DIP may be referred to as second input lines IL2 (see FIG. 13).

The driver island portion DIP and the wiring island portion WIP may be alternately arranged in a first row along the first direction (e.g., the x direction), and the driver island portion DIP and the wiring island portion WIP may be arranged in a second row parallel to the first row, in the same manner as the first row. That is, the driver island portion DIP may be continuously arranged in a first column along the second direction (e.g., the y direction), and the wiring island portion WIP may be continuously arranged in a second column parallel to the first column. As a plurality of wiring island portions WIP are continuously arranged along the second direction, a plurality of first input lines IL1 (see FIG. 13) may extend along the second direction (e.g., the y direction). Likewise, as a plurality of driver island portions DIP are continuously arranged along the second direction, a plurality of second input lines IL2 (see FIG. 13) may extend along the second direction (e.g., the y direction).

For example, the driver island portion DIP may include a 1-1 island portion IP11, a 1-2 island portion IP12, a 3-1 island portion IP31, a 3-2 island portion IP32, a 5-1 island portion IP51, a 5-2 island portion IP52, a 7-1 island portion IP71, and a 7-2 island portion IP72. The wiring island portion WIP may include a 2-1 island portion IP21, a 2-2 island portion IP22, a 4-1 island portion IP41, a 4-2 island portion IP42, a 6-1 island portion IP61, a 6-2 island portion IP62, an 8-1 island portion IP81, and an 8-2 island portion IP82.

The peripheral bridge portion 22 may is a portion that connects adjacent peripheral island portions 21 to form a serpentine structure, and may have a serpentine shape. A plurality of output wirings for transmitting an output signal of a driver and a plurality of connection wirings connected to an input line to transmit an input signal may be located in the peripheral bridge portion 22.

The peripheral bridge portion 22 may include a vertical bridge portion VBP and a horizontal bridge portion HBP. In detail, the vertical bridge portion VBP is the peripheral bridge portion 22 connecting the driver island portion DIP to the wiring island portion WIP and may have an 'S' shape in the first direction (e.g., the x direction). The horizontal bridge portion HBP is the peripheral bridge portion 22 connecting adjacent driver island portions DIP or connecting adjacent wiring island portions WIP, and may have an 'S' shape in the second direction (e.g., the y direction). That is, the horizontal bridge portion HBP may have a shape obtained by rotating a shape of the vertical bridge portion VBP by 90 degrees.

The vertical bridge portion VBP may include a first vertical bridge portion VBP1 and a second vertical bridge portion VBP2. The first vertical bridge portion VBP1 may be the peripheral bridge portion 22 located between a specific driver island portion DIP and a wiring island portion WIP where input lines for applying a signal to the specific driver island portion DIP are located. The second vertical bridge portion VBP2 may be located between the specific driver island portion DIP and a wiring island portion WIP where input lines for applying a signal to a driver island portion DIP other than the specific driver island portion DIP are located. In other words, the first vertical bridge portion VBP1 may be the peripheral bridge portion 22 located between the specific driver island portion DIP and the wiring island portion WIP related to the specific driver island portion DIP, and the second vertical bridge portion VBP2 may be the peripheral bridge portion 22 located between the specific driver island portion DIP and the wiring island portion WIP not related to the specific driver island portion DIP.

Accordingly, both an output wiring of a driver and a connection wiring of input lines may be located in the first vertical bridge portion VBP1, and only the output wiring of the driver may be located in the second vertical bridge portion VBP2. The first vertical bridge portion VBP1 and the second vertical bridge portion VBP2 may be alternately arranged along the first direction. For example, the first vertical bridge portion VBP1 may include a 1-1 bridge portion BP11, a 1-2 bridge portion BP12, a 3-1 bridge portion BP31, a 3-2 bridge portion BP32, a 5-1 bridge portion BP51, a 5-2 bridge portion BP52, a 7-1 bridge portion BP71, and a 7-2 bridge portion BP72. The second vertical bridge portion VBP2 may include a 2-1 bridge portion BP21, a 2-2 bridge portion BP22, a 4-1 bridge portion BP41, a 4-2 bridge portion BP42, a 6-1 bridge portion BP61, a 6-2 bridge portion BP62, an 8-1 bridge portion BP81, and an 8-2 bridge portion BP82.

The horizontal bridge portion HBP may include a first horizontal bridge portion HBP1 and a second horizontal bridge portion HBP2. The first horizontal bridge portion HBP1 may be the peripheral bridge portion 22 connecting the driver island portions DIP that are located adjacent to each other. The second horizontal bridge portion HBP2 may be the peripheral bridge portion 22 connecting the wiring island portions WIP that are located adjacent to each other. Accordingly, the first horizontal bridge portion HBP1 and the second horizontal bridge portion HBP2 may be alternately arranged along the first direction (e.g., the x direction).

For example, the first horizontal bridge portion HBP1 may include an 11-1 bridge portion BP111, an 11-2 bridge portion BP112, an 11-3 bridge portion BP113, a 13-1 bridge portion BP131, a 13-2 bridge portion BP132, a 13-3 bridge portion BP133, a 15-1 bridge portion BP151, a 15-2 bridge portion BP152, a 15-3 bridge portion BP153, a 17-1 bridge portion BP171, a 17-2 bridge portion BP172, and a 17-3 bridge portion BP173.

The second horizontal bridge portion HBP2 may include 12-1 bridge portion BP121, a 12-2 bridge portion BP122, a 12-3 bridge portion BP123, a 14-1 bridge portion BP141, a 14-2 bridge portion BP142, a 14-3 bridge portion BP143, a 16-1 bridge portion BP161, a 16-2 bridge portion BP162, a 16-3 bridge portion BP163, an 18-1 bridge portion BP181, an 18-2 bridge portion BP182, and an 18-3 bridge portion BP173.

In a gate driving circuit GDC (see FIG. 3) located in the driver island portion DIP, an emission control driving circuit EMDC (see FIG. 10), a bypass driving circuit GBDC (see FIG. 10), an initialization driving circuit GIDC (see FIG. 10), and a data write driving circuit GWDC (see FIG. 10) may be sequentially arranged in that order from an outer side toward a display area DA (see FIG. 3). Also, when a size and/or a width of the peripheral island portion 21 is greater than a size and/or a width of a main island portion 11 (see FIG. 4) as shown in FIG. 12, two driver stages may be located in the driver island portion DIP.

For example, emission control stages may be located in the 1-1 island portion IP11 and a 1-2 island portion IP12. In detail, an $n^{th}$ emission control stage EMSTn and an $n+1^{th}$ emission control stage EMSTn+1 (where n may be a natural number equal to or greater than 1) may be located in the 1-1 island portion IP11, and an $n+2^{th}$ emission control stage EMSTn+2 and an $n+3^{th}$ emission control stage EMSTn+3 may be located in the 1-2 island portion IP12.

Likewise, bypass stages may be located in the 3-1 island portion IP31 and the 3-2 island portion IP32. In detail, an $n^{th}$ bypass stage GBSTn and an $n+1^{th}$ bypass stage GBSTn+1 may be located in the 3-1 island portion IP31, and an $n+2^{th}$ bypass stage GBSTn+2 and an $n+3^{th}$ bypass stage GBSTn+3 may be located in the 3-2 island portion IP32.

Initialization stages may be located in the 5-1 island portion IP51 and the 5-2 island portion IP52. In detail, an $n^{th}$ initialization stage GISTn and an $n+1^{th}$ initialization stage GISTn+1 may be located in the 5-1 island portion IP51, and an n+2$^{th}$ initialization stage GISTn+2 and an n+3$^{th}$ initialization stage GISTn+3 may be located in the 5-2 island portion IP52.

Data write stages may be located in the 7-1 island portion IP71 and the 7-2 island portion IP72. In detail, an n$^{th}$ data write stage GWSTn and an n+1$^{th}$ data write stage GWSTn+1 may be located in the 7-1 island portion IP71, and an n+2$^{th}$ data write stage GWSTn+2 and an n+3$^{th}$ data write stage GWSTn+3 may be located in the 7-2 island portion IP72.

As described above, input lines for applying a signal or a voltage to each driver stage may include the first input lines IL1 (see FIG. 13) located in the wiring island portion WIP and the second input lines IL2 (see FIG. 13) located in the driver island portion DIP. The first input lines IL1 (see FIG. 13) may be located in the wiring island portion WIP, and may extend by also being located in the second horizontal bridge portion HBP2. The second input lines IL2 (see FIG. 13) may be located in the driver island portion DIP, and may extend by also being located in the first horizontal bridge portion HBP1.

For example, some of input lines for supplying a signal or a voltage to the emission control stage EMST may extend through the 12-1 bridge portion BP121, the 12-2 bridge portion BP122, and the 12-3 bridge portion BP123, and others may extend through the 11-1 bridge portion BP111, the 11-2 bridge portion BP112, and the 11-3 bridge portion BP113. Likewise, some of input lines for supplying a signal or a voltage to the bypass stage GBST may extend through the 14-1 bridge portion BP141, the 14-2 bridge portion BP142, and the 14-3 bridge portion BP143, and others may extend through the 13-1 bridge portion BP131, the 13-2 bridge portion BP132, and the 13-3 bridge portion BP133. Some of input lines for supplying a signal or a voltage to the initialization stage GIST may extend through the 16-1 bridge portion BP161, the 16-2 bridge portion BP162, and the 16-3 bridge portion BP163, and others may extend through the 15-1 bridge portion BP151, the 15-2 bridge portion BP152, and the 15-3 bridge portion BP153. Some of input lines for supplying a signal or a voltage to the data write stage GWST may extend through the 18-1 bridge portion BP181, the 18-2 bridge portion BP182, and the 18-3 bridge portion BP183, and others may extend through the 17-1 bridge portion BP171, the 17-2 bridge portion BP172, and the 17-3 bridge portion BP173.

An output wiring for transmitting an output signal of each driver stage may extend toward the display area DA (see FIG. 3) along the first direction (e.g., the x direction). Accordingly, the output wiring may be located in the same row as the driver island portion DIP in which the connected driver stage is located, but may extend through a plurality of vertical bridge portions VBP closer to the display area DA (see FIG. 3) than the driver island portion DIP.

For example, an emission control output wiring of the n$^{th}$ emission control stage EMSTn may be located in the same row as the 1-1 island portion IP11, but may extend through the 1-1 bridge portion BP11, the 2-1 bridge portion BP21, the 3-1 bridge portion BP31, the 4-1 bridge portion BP41, the 5-1 bridge portion BP51, the 6-1 bridge portion BP61, the 7-1 bridge portion BP71, and the 8-1 bridge portion BP81 closer to the display area DA than the 1-1 island portion IP11. Likewise, a bypass output wiring of the n$^{th}$ bypass stage GBSTn may be located in the same row as the 3-1 island portion IP31, but may extend through the 3-1 bridge portion BP31, the 4-1 bridge portion BP41, the 5-1 bridge portion BP51, the 6-1 bridge portion BP61, the 7-1 bridge portion BP71, and the 8-1 bridge portion BP81 closer to the display area DA (see FIG. 3) than the 3-1 island portion IP31. An initialization output wiring of the n$^{th}$ initialization stage GISTn may be located in the same row as the 5-1 island portion IP51, but may extend through the 5-1 bridge portion BP51, the 6-1 bridge portion BP61, the 7-1 bridge portion BP71, and the 8-1 bridge portion BP81 closer to the display area DA (see FIG. 3) than the 5-1 island portion IP51. A data write output wiring of the n$^{th}$ data write stage GWSTn may be located in the same row as the 7-1 island portion IP71, but may extend through the 7-1 bridge portion BP71 and the 8-1 bridge portion BP81 closer to the display area DA (see FIG. 3) than the 7-1 island portion IP71.

Figure 14:
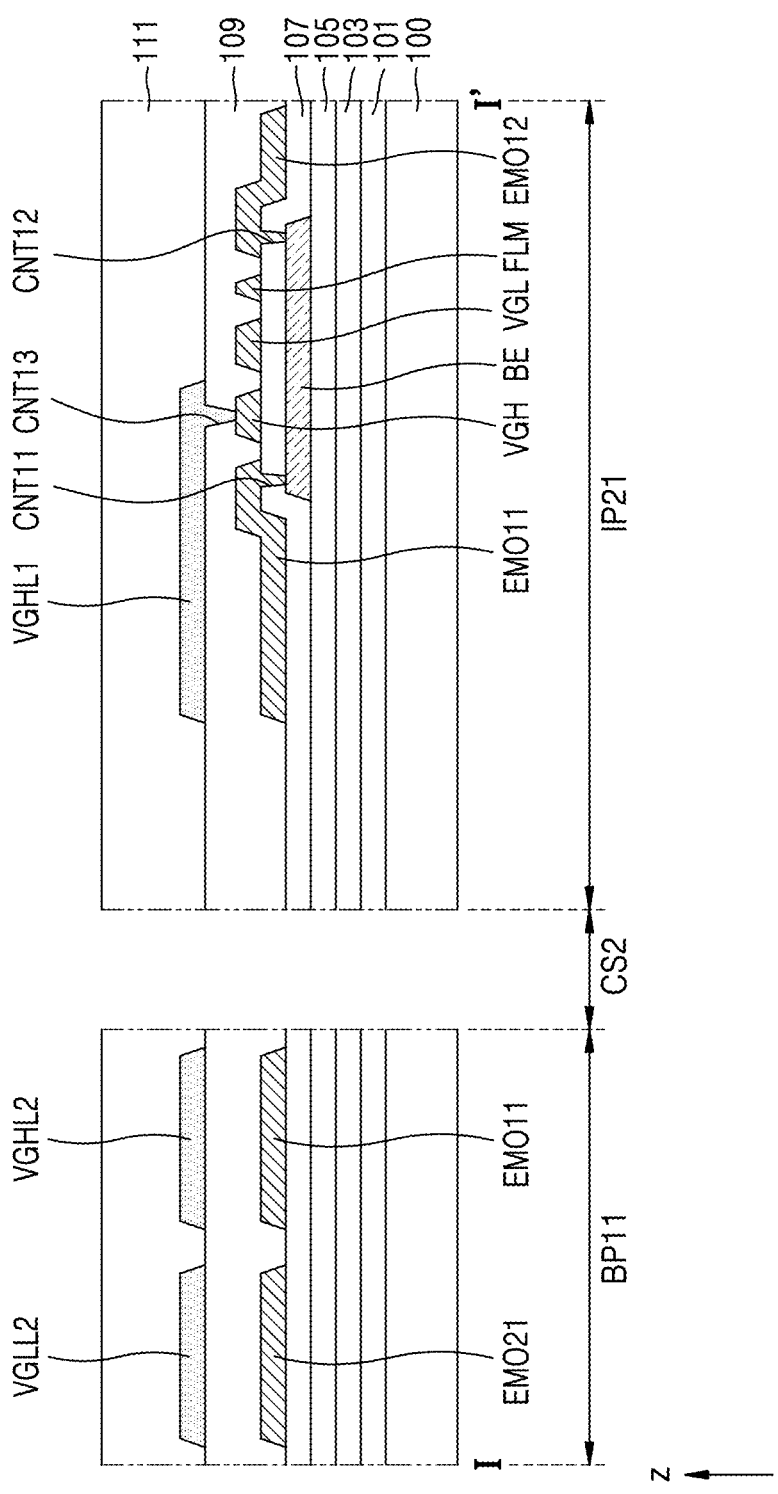
FIG. 14 is a cross-sectional view illustrating a part of the display apparatus of FIG. 13, taken along line I-I', according to an embodiment.

FIG. 13 is an enlarged schematic plan view illustrating a portion C of the display apparatus of FIG. 12, according to an embodiment. FIG. 14 is a cross-sectional view illustrating a part of the display apparatus of FIG. 13, taken along line I-I', according to an embodiment.

First, referring to FIG. 13, an n$^{th}$ emission control stage EMSTn and an n+1$^{th}$ emission control stage EMSTn+1 may be located in a 1-1 island portion IP11. Each emission control stage EMST may include a node controller and a buffer transistor. For example, the n$^{th}$ emission stage EMSTn may include a first emission node controller EMNC1 and a first emission buffer transistor EMBF1, and the n+1$^{th}$ emission stage EMSTn+1 may include a second emission node controller EMNC2 and a second emission buffer transistor EMBF2. Each of the first emission node controller EMNC1 and the second emission node controller EMNC2 may include a plurality of transistors and capacitors, and may control a voltage of a node by using a start signal provided through an input terminal. Each of the first emission buffer transistor EMBF1 and the second emission buffer transistor EMBF2 may be a transistor located to isolate a signal source from a circuit driven by the signal source.

An output signal of each of the n$^{th}$ emission control stage EMSTn and the n+1$^{th}$ emission stage EMSTn+1 may be used to apply an emission control signal EM (see FIG. 10) to the display DA (see FIG. 3) through an emission control output wiring EMO. In detail, the emission control signal EM output from the emission stage EMST may be first transmitted to the emission control output wiring EMO, and then may be supplied to a pixel of the display area DA (see FIG. 3) through an emission control line EML (see FIG. 10) connected to the emission control output wiring EMO.

The emission control output wiring EMO may include a first emission control output wiring EMO1 connected to the n$^{th}$ emission control stage EMSTn and a second emission control output wiring EMO2 connected to the n+1$^{th}$ emission control stage EMSTn+1. That is, one output wiring may be located per stage. In another embodiment, when one emission stage EMST is located in the 1-1 island portion IP11, one emission control output wiring EMO may be located on a 1-1 bridge portion BP11.

First, the first emission control output wiring EMO1 may include a first portion EMO11 of the first emission control output wiring and a second portion EMO12 of the first emission control output wiring.

The first portion EMO11 of the first emission control output wiring may be a portion directly connected to the n$^{th}$ emission control stage EMSTn. The first portion EMO11 of the first emission control output wiring may be located in a first vertical bridge portion VBP1, for example, the 1-1 bridge portion BP11. Accordingly, the first portion EMO11 of the first emission control output wiring may include a portion having a serpentine shape or an 'S' shape. As described below, because connection wirings of a first input lines IL1 are also located in the 1-1 bridge portion BP11, the first portion EMO11 of the first emission control output wiring may overlap a part of the connection wiring in a plan view.

The first portion EMO11 of the first emission control output wiring may extend from the 1-1 bridge portion BP11 and may also be partially located in a 2-1 island portion IP21. The first portion EMO11 of the first emission control output wiring located on the 2-1 island portion IP21 may extend along the first direction (e.g., the x direction). However, the first input lines IL1 may extend along the second direction (e.g., the y direction) in the 2-1 island portion IP21. Accordingly, the first portion EMO11 of the first emission control output wiring may extend only to an area where the first input lines IL1 are not located so as not to overlap the first input lines IL1 in a plan view.

When the first input lines IL1 and the emission control output wiring EMO are located in the same layer, collision between wirings may be avoided through a bridge electrode BE as shown in FIG. 13. That is, the bridge portion BE may be located under the first input lines IL1 and the emission control output wiring EMO, and at least one insulating layer may be located between the emission control output wiring EMO and the bridge electrode BE. Because the bridge electrode BE should transmit the emission control signal EM (see FIG. 10), one end may be connected to the first portion EMO11 of the first emission control output wiring through a contact hole and the other end may be connected to the second portion EMO12 of the first emission control output wiring through a contact hole.

The second portion EMO12 of the first emission control output wiring may be located on the 2-1 island portion IP21 and may extend along the first direction (e.g., the x direction). One end of the second portion EMO12 of the first emission control output wiring may be connected to the bridge electrode BE to receive then emission control signal EM (see FIG. 10). The second portion EMO12 of the first emission control output wiring may extend from the 2-1 island portion IP21 and may be located in a 2-1 bridge portion BP21. The second portion EMO12 of the first emission control output wiring may include a portion having a serpentine shape or an 'S' shape. Because a connection wiring of the first input lines IL1 does not need to be located in the 2-1 bridge portion BP21, the second portion EMO12 of the first emission control output wiring may not overlap the connection wiring in a plan view.

Likewise, the second emission control output wiring EMO2 may have the same structure as the first emission control output wiring EMO1. That is, the second emission control output wiring EMO2 may include a first portion EMO21 of the second emission control output wiring and a second portion EMO22 of the second emission control output wiring. The first portion EMO21 of the second emission control output wiring may have a similar shape to the first portion EMO11 of the first emission control output wiring, and the second portion EMO22 of the second emission control output wiring may have a similar shape to the second portion EMO12 of the first emission control output wiring.

In this case, a width of each of the 1-1 bridge portion BP11 and the 2-1 bridge portion BP21 may have a length of 35 μm to 40 μm. Because two emission control output wirings EMO are located in each of the 1-1 bridge portion BP11 and the 2-1 bridge portion BP21, in an embodiment, a width of one emission control output wiring EMO may be 16 μm, and a width of a separation space between the emission control output wirings EMO may be 4 μm. That is, a load of a wiring may be minimized by maximally using a width of the emission control output wiring EMO located in each of the 1-1 bridge portion BP11 and the 2-1 bridge portion BP21.

Input lines for applying a signal or a voltage to the emission control stage EMST may be located in a non-display area NDA (see FIG. 3). The input lines may include first input lines IL1 located in a wiring island portion WIP (see FIG. 12) and second input lines IL2 located in a driver island portion DIP (see FIG. 12). That is, from among the input lines for the emission control stage EMST, the first input lines IL1 may be located in the 2-1 island portion IP21 and the second input lines IL2 may be located in the 1-1 island portion IP11. The first input lines IL1 and the second input lines IL2 may extend along the second direction (e.g., the y direction). Accordingly, the first input lines IL1 may extend through a 12-1 bridge portion BP121 and a 12-2 bridge portion BP122, and the second input lines IL2 may extend through an 11-1 bridge portion BP111 and an 11-2 bridge portion BP112.

In an embodiment, the first input lines IL1 may include a gate high voltage wiring VGH, a gate low voltage wiring VGL, and a start signal wiring FLM. The gate high voltage wiring VGH and the gate low voltage wiring VGL are wirings for applying a driving voltage to the emission control stage EMST (see FIG. 12), and the gate high voltage wiring VGH may apply a gate-off voltage and the gate low voltage wiring VGL may apply a gate-on voltage. The start signal wiring FLM may be a wiring for applying a start signal to a first emission control stage EMST1 (see FIG. 10).

In an embodiment, the second input lines IL2 may include a first clock wiring CLK1, a second clock wiring CLK2, a carry wiring CRL, and a reset signal wiring ESR. The first clock wiring CLK1 and the second clock wiring CLK2 are wirings for transmitting a first clock signal and a second clock signal, respectively, and each of the first clock signal and the second clock signal may be a square wave signal in which a logic high level and a logic low level are repeated. The carry wiring CRL is a wiring for transmitting a carry signal, and a carry signal may be a start signal of a next stage. For example, each of the remaining emission control stages EMST other than the first emission control signal EMST1 (see FIG. 10) may receive a carry signal output from a previous stage as a start signal. The reset signal wiring ESR is a wiring for transmitting a reset signal, and a reset signal may be a signal that is activated at a low level when the display apparatus 1 (see FIG. 12) is powered on or reset.

Because the second input lines IL2 may be located adjacent to the emission control stage EMST in the 1-1 island portion IP11, a signal may be easily transmitted. In contrast, because the first input lines IL1 are located in the 2-1 island portion IP21 spaced apart from the 1-1 island portion IP11, a connection wiring CW may be additionally required. The connection wiring CW may include a high voltage connection wiring VGHL connected to the gate high voltage wiring VGH and a low voltage connection wiring VGLL connected to the gate low voltage wiring VGL from among the first input lines IL1. Because the start signal wiring FLM from among the first input lines IL1 does not need to transmit a signal to the $n^{th}$ emission control stage EMSTn and the $n+1^{th}$ emission control stage EMSTn+1, the start signal wiring FLM may not be connected to the connection wiring CW.

The high voltage connection wiring VGHL may include a first portion VGHL1 of the high voltage connection wiring, a second portion VGHL2 of the high voltage connection wiring, and a third portion VGHL3 of the high voltage connection wiring. The first portion VGHL1 of the high voltage connection wiring may refer to a portion of the high voltage connection wiring VGHL located in the 2-1 island portion IP21. The first portion VGHL1 of the high voltage connection wiring is a portion directly connected to the gate high voltage wiring VGH, and may be connected to the gate high voltage wiring VGH through a contact hole. Because the gate high voltage wiring VGH extends along the second direction (e.g., the y direction), the first portion VGHL1 of the high voltage connection wiring may extend along the first direction (e.g., the x direction) intersecting the gate high voltage wiring VGH.

The second portion VGHL2 of the high voltage connection wiring may refer to a portion of the high voltage connection wiring VGHL located in the first vertical bridge portion VBP1, for example, the 1-1 bridge portion BP11. Accordingly, the second portion VGHL2 of the high voltage connection wiring may have a serpentine shape or an 'S' shape. The second portion VGHL2 of the high voltage connection wiring may overlap the emission control output wiring EMO in a plan view.

The third portion VGHL3 of the high voltage connection wiring may refer to a portion of the high voltage connection wiring VGHL located in the 1-1 island portion IP11. The third portion VGHL3 of the high voltage connection wiring may directly transmit a voltage to the $n^{th}$ emission control stage EMSTn and the $n+1^{th}$ emission control stage EMSTn+1. Accordingly, the third portion VGHL3 of the high voltage connection wiring may have a branched shape extending along the first direction (e.g., the x direction) and then extending along the second direction (e.g., the y direction).

Likewise, the low voltage connection wiring VGLL may have a structure similar to the structure of the high voltage connection wiring VGHL. That is, the low voltage connection wiring VGHLL may include a first portion VGLL1 of the low voltage connection wiring corresponding to the first portion VGHL1 of the high voltage connection wiring, a second portion VGLL2 of the low voltage connection wiring corresponding to the second portion VGHL2 of the high voltage connection wiring, and a third portion VGLL3 of the low voltage connection wiring corresponding to the third portion VGHL3 of the high voltage connection wiring. However, the third portion VGLL3 of the low voltage connection wiring may have a shape extending around an outer side of the 1-1 island portion IP11 so as not to overlap the third portion VGHL3 of the high voltage connection wiring in a plan view, and may transmit a voltage to each of the $n^{th}$ emission stage EMSTn and the $n+1^{th}$ emission control stage EMSTn+1.

In order to maximally ensure a width of a wiring and minimize a load of the wiring, the emission control output wiring EMO and the connection wiring CW may be located on different layers. Referring to FIG. 14, the emission control output wiring EMO may be located between the second interlayer-insulating layer 107 and the first organic insulating layer 109. That is, the emission control output wiring EMO may be located on substantially the same layer as the source electrode S1 (see FIG. 7A) located in the main island portion 11 (see FIG. 4), and may include the same material as the source electrode S1 (see FIG. 7A). The connection wiring CW may be located between the first organic insulating layer 109 and the second organic insulating layer 111. That is, the connection wiring CW may be located on substantially the same layer as the first connection electrode CL1 (see FIG. 7A) of the main island portion 11 (see FIG. 4), and may include the same material as the first connection electrode CL1.

When the first input lines IL1 are located in the same layer as the emission control output wiring EMO as shown in FIG. 14, the first portion EMO11 of the first emission control output wiring and the second portion EMO12 of the first emission control output wiring may be electrically connected through the bridge electrode BE. For example, one end of the bridge electrode BE may be connected to the first portion EMO11 of the first emission control output wiring through a contact hole CNT11, and the other end may be connected to the second portion EMO12 of the first emission control output wiring through a contact hole CNT12. The bridge electrode BE may be located under the emission control output wiring EMO and/or the first input lines IL1. For example, the bridge electrode BE may be located on substantially the same layer as the upper electrode CE2 located in the main island portion 11 (see FIG. 4) as shown in FIG. 14. However, the disclosure is not limited thereto, and the bridge electrode BE may be located on substantially the same layer as the first gate electrode G1 located in the main island portion 11 (see FIG. 4).

Figure 15:
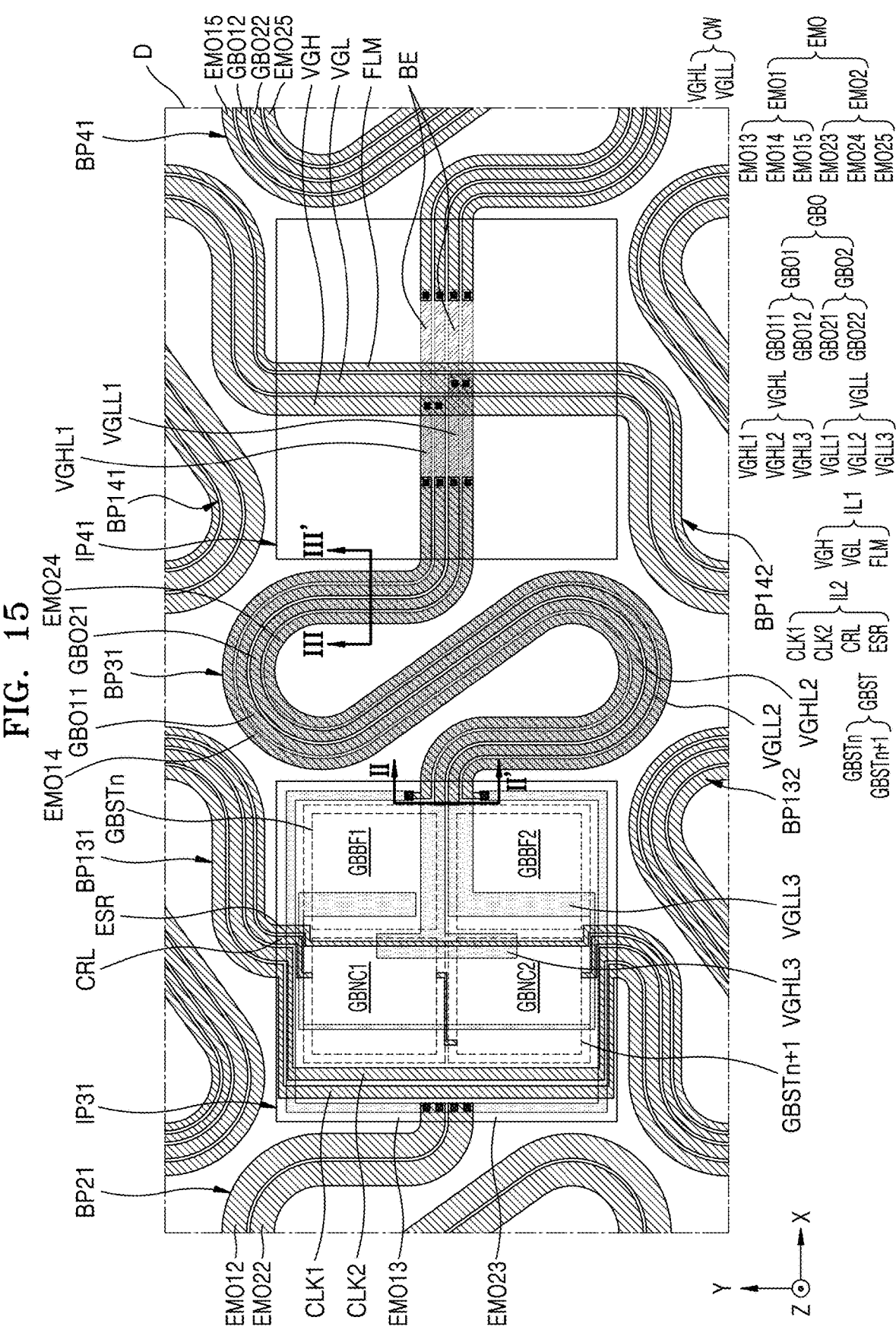
FIG. 15 is an enlarged cross-sectional view illustrating a portion D of the display apparatus of FIG. 12, according to an embodiment.
Figure 16:
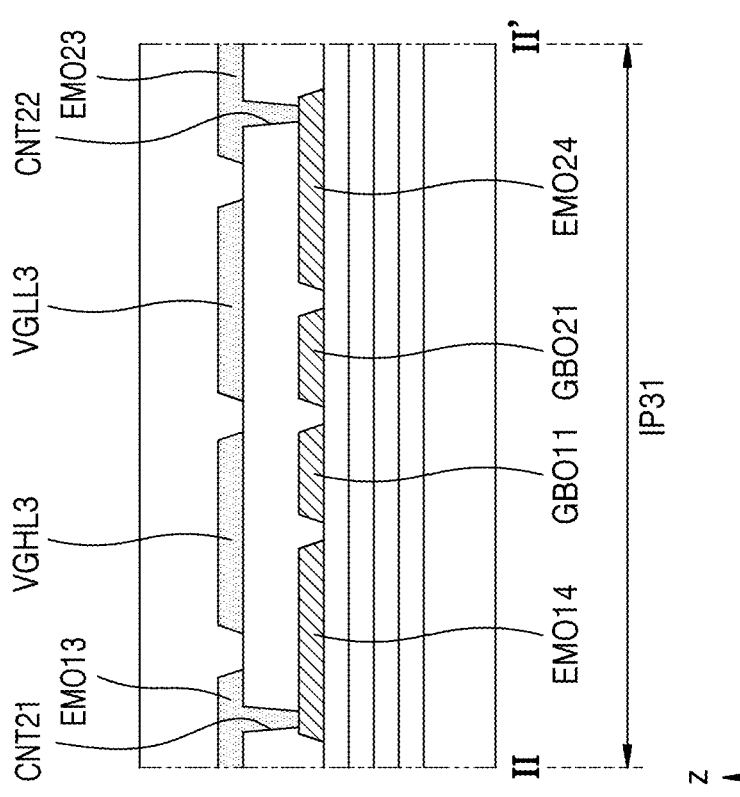
FIG. 16 is a cross-sectional view illustrating a part of the display apparatus of FIG. 15, taken along lines II-II' and III-III', according to an embodiment.

FIG. 15 is an enlarged schematic plan view illustrating a portion D of the display apparatus of FIG. 12, according to an embodiment. FIG. 16 is a cross-sectional view illustrating a part of the display apparatus of FIG. 15, taken along lines II-II and III-III', according to an embodiment.

First, referring to FIG. 15, an $n^{th}$ bypass stage GBSTn and an $n+1^{th}$ bypass stage GBSTn+1 may be located in a 3-1 island portion IP31. Each bypass stage GBST may include a node controller and a buffer transistor. For example, the $n^{th}$ bypass stage GBSTn may include a first bypass node controller GBNC1 and a first bypass buffer transistor GBBF1, and the $n+1^{th}$ bypass stage GBSTn+1 may include a second bypass node controller GBNC2 and a second bypass buffer transistor GBBF2.

An output signal of each of the $n^{th}$ bypass stage GBSTn and the $n+1^{th}$ bypass stage GBSTn+1 may be used to apply a bypass control signal GB (see FIG. 10) to the display area DA (see FIG. 3) through a bypass output wiring GBO. In detail, the bypass control signal GB (see FIG. 10) output from the bypass stage GBST may be first transmitted to the bypass output wiring GBO, and then may be supplied to a pixel of the display area DA (see FIG. 3) through a bypass control line GBL (see FIG. 10) connected to the bypass output wiring GBO.

The bypass output wiring GBO may include a first bypass output wiring GBO1 connected to the $n^{th}$ bypass stage GBSTn and a second bypass output wiring GBO2 connected to the $n+1^{th}$ bypass stage GBSTn+1. The first bypass output wiring GBO1 may include a first portion GBO11 of the first bypass output wiring and a second portion GBO12 of the first bypass output wiring, and the second bypass output wiring GBO2 may include a first portion GBO21 of the second bypass output wiring and a second portion GBO22 of the second bypass output wiring.

The first portion GBO11 of the first bypass output wiring is directly connected to the $n^{th}$ bypass stage GBSTn and may extend to be located in a 3-1 bridge portion BP31 and a 4-1 island portion IP41, like the first portion EMO11 of the first emission control output wiring. The second portion GBO12 of the first bypass output wiring may be located in the 4-1 island portion IP41 and may extend to a 4-1 bridge portion BP41, like the second portion EMO12 of the first emission control output wiring. The first portion GBO11 of the first bypass output wiring and the second portion GOB12 of the first bypass output wiring may be connected to one end and the other end of a bridge electrode BE, respectively, to be electrically connected to each other. The first portion GBO21 of the second bypass output wiring may have a similar shape to the first portion GBO11 of the first bypass output wiring, and the second portion GBO22 of the second bypass output wiring may have a similar shape to the second portion GBO12 of the first bypass output wiring.

Referring to FIG. 16, the first portion GBO11 of the first bypass output wiring and the first portion GBO21 of the second bypass output wiring may be located between the second interlayer-insulating layer 107 and the first organic insulating layer 109, may be located on substantially the same layer as the source electrode S1 (see FIG. 7A) of the main island portion 11 (see FIG. 4), and may include the same material as the material of the source electrode S1 (see FIG. 7A). Likewise, the second portion GBO12 of the first bypass output wiring and the second portion GBO22 of the second bypass output wiring may also be located on substantially the same layer as the source electrode S1 (see FIG. 7A).

An emission control output wiring EMO extending from a 2-1 bridge portion BP21 may be located in the 3-1 island portion IP31, the 3-1 bridge portion BP31, and the 4-1 island portion IP41. Because the emission control output wiring EMO is a wiring for transmitting an output signal of the emission control stage EMST (see FIG. 13) located outside the bypass stage GBST, the emission control output wiring EMO may be referred to as a 'pre-output wiring'. A first emission control output wiring EMO1 may include a third portion EMO13 of the first emission control output wiring, a fourth portion EMO14 of the first emission control output wiring, and a fifth portion EMO15 of the first emission control output wiring, and a second emission control output wiring EMO2 may include a third portion EMO23 of the second emission control output wiring, a fourth portion EMO24 of the second emission control output wiring, and a fifth portion EMO25 of the second emission control output wiring.

A second portion EMO12 of the first emission control output wiring and a second portion EMO22 of the second emission control output wiring located in the 2-1 bridge portion BP21 may be connected to the third portion EMO13 of the first emission control output wiring and the third portion EMO23 of the second emission control output wiring located in the 3-1 island portion IP31, respectively. The third portion EMO13 of the first emission control output wiring and the third portion EMO23 of the second emission control output wiring may extend around an outer side of a bypass stage GBST. In detail, the third portion EMO13 of the first emission control output wiring may extend around an upper side of the $n^{th}$ bypass stage GBSTn, and the third portion EMO23 of the second emission control output wiring may extend around a lower side of the $n+1^{th}$ bypass stage GBSTn+1.

However, referring to FIG. 16, in order to avoid overlapping with a circuit unit of the bypass stage GBST in a plan view, the third portion EMO13 of the first emission control output wiring and the third portion EMO23 of the second emission control output wiring may be located on a different layer from the second portion EMO12 of the first emission control output wiring and the second portion EMO22 of the second emission control output wiring. That is, the third portion EMO13 of the first emission control output wiring and the third portion EMO23 of the second emission control output wiring may be located between the first organic insulating layer 109 and the second organic insulating layer 111, may be located on substantially the same layer as the first connection electrode CL1 (see FIG. 7A) of the main island portion 11 (see FIG. 4), and may include the same material as the first connection electrode CL1.

The third portion EMO13 of the first emission control output wiring and the third portion EMO23 of the second emission control output wiring may extend around an outer side of the 3-1 island portion IP31, and may be connected to the fourth portion EMO14 of the first emission control output wiring and the fourth portion EMO24 of the second emission control output wiring located in the 3-1 bridge portion BP31. Referring to FIG. 16, the third portion EMO13 of the first emission control output wiring may be connected to the fourth portion EMO14 of the first emission control output wiring through a contact hole CNT21, and the third portion EMO23 of the second emission control output wiring may be connected to the fourth portion EMO24 of the second emission control output wiring through a contact hole CNT22.

The fourth portion EMO14 of the first emission control output wiring may be located in the same layer as the first portion GBO11 of the first bypass output wiring to have a similar shape, and the fourth portion EMO24 of the second emission control output wiring may be located in the same layer as the first portion GBO21 of the second bypass output wiring to have a similar shape. That is, the fourth portion EMO14 of the first emission control output wiring and the fourth portion EMO24 of the second emission control output wiring may extend to be located in the 3-1 bridge portion BP31 and the 4-1 island portion IP41.

Also, the fourth portion EMO14 of the first emission control output wiring may be connected to the fifth portion EMO15 of the first emission control output wiring through the bridge electrode BE, and the fourth portion EMO24 of the second emission control output wiring may be connected to the fifth portion EMO25 of the second emission control output wiring through the bridge electrode BE. The fifth portion EMO15 of the first emission control output wiring may be located in the same layer as the second portion GBO12 of the first bypass output wiring and may have a shape similar to the second portion GBO12 of the first bypass output wiring. The fifth portion EMO25 of the second emission control output wiring may be located in the same layer as the second portion GBO22 of the second bypass output wiring and may have a shape similar to the shape of the second portion GBO22 of the second bypass output wiring.

That is, the first portion GBO11 of the first bypass output wiring, the first portion GBO21 of the second bypass output wiring, the fourth portion EMO14 of the first emission control output wiring, and the fourth portion EMO24 of the second emission control output wiring may be located in the 3-1 bridge portion BP31, and the second portion GBO12 of the first bypass output wiring, the second portion GBO22 of the second bypass output wiring, the fifth portion EMO15 of the first emission control output wiring, and the fifth portion EMO25 of the second emission control output wiring may be located in the 4-1 bridge portion BP41.

However, because the first emission control output wiring EMO1 and the second emission control output wiring EMO2 extend around an outer side of the bypass stage GBST, the fourth portion EMO14 of the first emission control output wiring and the fourth portion EMO24 of the second emission control output wiring located in the 3-1 bridge portion BP31 may be located on an outer side of the 3-1 bridge portion BP31. Accordingly, the first portion GBO11 of the first bypass output wiring and the first portion GBO21 of the second bypass output wiring located in the 3-1 bridge portion BP31 may be located at the center of the 3-1 bridge portion BP31. In other words, the bypass output wiring GBO connected to the bypass stage GBST located in the 3-1 island portion IP31 may be located at the center of the 3-1 bridge portion BP31, and pre-output wirings may be located on an outer side of the 3-1 bridge portion BP31.

Also, a width of the peripheral bridge portion 22 (see FIG. 12) may be constant, and thus, a width of each of the 3-1 bridge portion BP31 and the 4-1 bridge portion BP41 may have a length of 35 μm to 40 μm, like the 1-1 bridge portion BP11. However, unlike a case where only two emission control output wirings EMO are located in the 1-1 bridge portion BP11 and the 2-1 bridge portion BP21, two emission control output wirings EMO and two bypass output wirings GBO may be located in the 3-1 bridge portion BP31 and the 4-1 bridge portion BP41. A width of an output wiring located in the 3-1 bridge portion BP31 and the 4-1 bridge portion BP41 may be less than a width of an output wiring located in the 1-1 bridge portion BP11. In an embodiment, a width of each of the emission control output wiring EMO and the bypass output wiring GBO located in the 3-1 bridge portion BP31 may be 6 μm, and a width of a separation space between output wirings may be 4 μm. That is, a load of an output wiring may be minimized by maximally using widths of the emission control output wiring EMO and the bypass output wiring GBO located in the 3-1 bridge portion BP31 and the 4-1 bridge portion BP41.

Input lines for applying a signal or a voltage to the bypass stage GBST may also be located in the 3-1 island portion IP31 and the 4-1 island portion IP41. First input lines IL1 located in the 4-1 island portion IP41 may have a structure similar to the structure of the first input lines IL1 located in the 2-1 island portion IP21 of FIG. 13, and second input lines IL2 located in the 3-1 island portion IP31 may have a structure similar to the structure of the second input lines IL2 located in the 1-1 island portion IP11 of FIG. 13. Likewise, a high voltage connection wiring VGHL and a low voltage connection wiring VGLL which are a connection wiring CW for transmitting a voltage of the first input lines IL1 may also have structures similar to those of the high voltage connection wiring VGHL and the low voltage connection wiring VGLL of FIG. 13.

Figure 17:
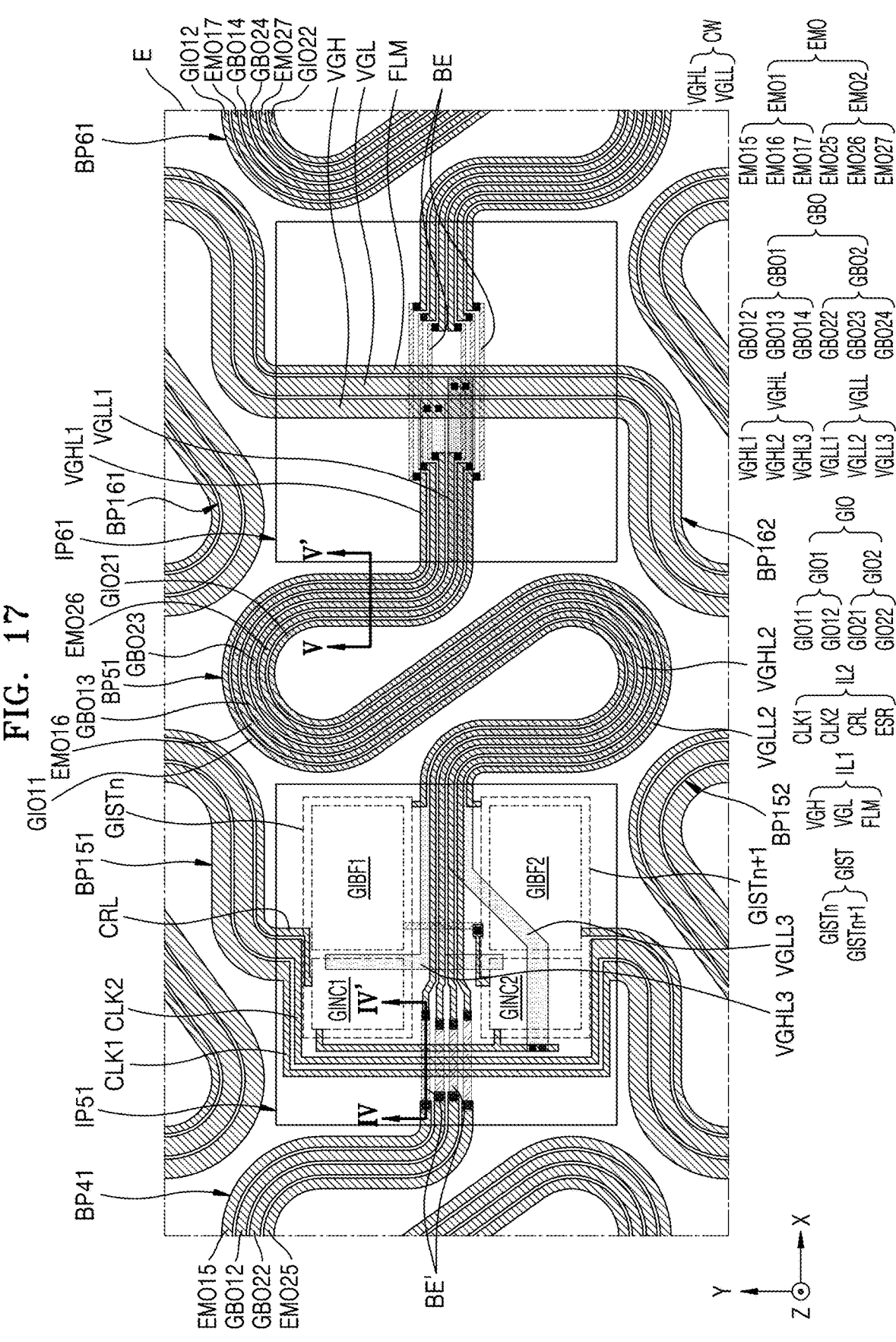
FIG. 17 is an enlarged schematic plan view illustrating a portion E of the display apparatus of FIG. 12, according to an embodiment.
Figure 18:
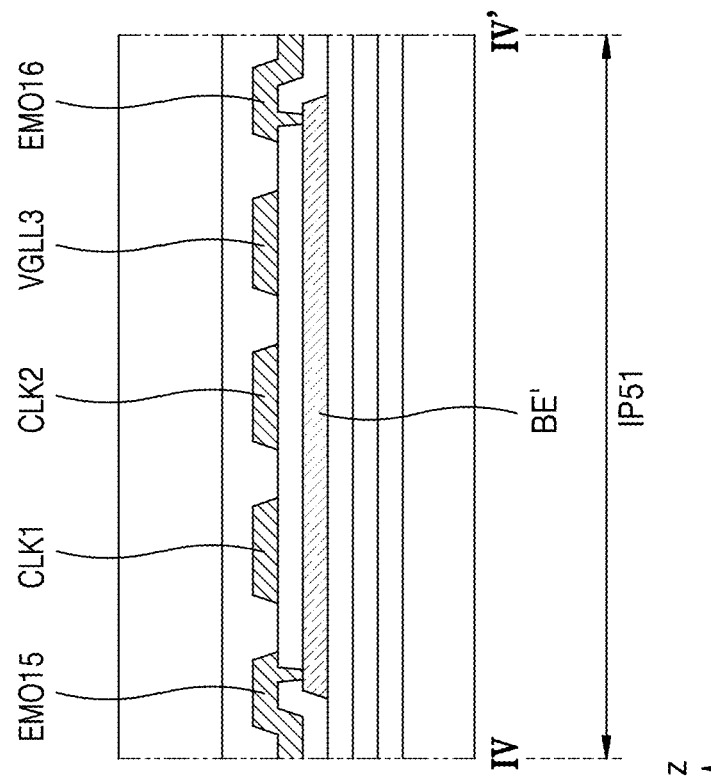
FIG. 18 is a cross-sectional view illustrating a part of the display apparatus of FIG. 17, taken along lines VI-VI' and V-V', according to an embodiment.

FIG. 17 is an enlarged schematic plan view illustrating a portion E of the display apparatus of FIG. 12, according to an embodiment. FIG. 18 is a cross-sectional view illustrating a part of the display apparatus of FIG. 17, taken along lines IV-IV' and V-V', according to an embodiment.

First, referring to FIG. 17, an $n^{th}$ initialization stage GISTn and an $n+1^{th}$ initialization stage GISTn+1 may be located in a 5-1 island portion IP51. Each initialization stage GIST may include a node controller and a buffer transistor. For example, the $n^{th}$ initialization stage GISTn may include a first initialization node controller GINC1 and a first initialization buffer transistor GIBF1, and the $n+1^{th}$ initialization stage GISTn+1 may include a second initialization node controller GINC2 and a second initialization buffer transistor GIBF2.

An output signal of each of the $n^{th}$ initialization stage GISTn and the $n+1^{th}$ initialization stage GISTn+1 may be used to apply an initialization control signal GI (see FIG. 10) to the display area DA (see FIG. 3) through an initialization output wiring GIO. In detail, the initialization control signal GI (see FIG. 10) output from the initialization stage GIST may be first transmitted to the initialization output wiring GIO, and then may be supplied to a pixel of the display area DA (see FIG. 3) through an initialization control line GIL (see FIG. 10) connected to the initialization output wiring GIO.

The initialization output wiring GIO may include a first initialization output wiring GIO1 connected to the $n^{th}$ initialization stage GISTn and a second initialization output wiring GIO2 connected to the $n+1^{th}$ initialization stage GISTn+1. The first initialization output wiring GIO1 may include a first portion GIO11 of the first initialization output wiring and a second portion GIO12 of the first initialization output wiring, and the second initialization output wiring GIO2 may include a first portion GIO21 of the second initialization output wiring and a second portion GIO22 of the second initialization output wiring.

Like the first portion EMO11 of the first emission control output wiring, the first portion GIO11 of the first initialization output wiring may be directly connected to the $n^{th}$ initialization stage GISTn and may extend to be located in a 5-1 bridge portion BP51 and a 6-1 island portion IP61. Like the second portion EMO12 of the first emission control output wiring, the second portion GIO12 of the first initialization output wiring may be located in the 6-1 island portion IP61 and may extend to a 6-1 bridge portion BP61. The first portion GIO11 of the first initialization output wiring and the second portion GIO12 of the first initialization output wiring may be connected to one end and the other end of a bridge electrode BE, respectively, to be electrically connected to each other. The first portion GIO21 of the second initialization output wiring may have a similar shape to the first portion GIO11 of the first initialization output wiring, and the second portion GIO22 of the second initialization output wiring may have a similar shape to the second portion GIO12 of the first initialization output wiring.

Referring to FIG. 18, the first portion GIO11 of the first initialization output wiring and the first portion GIO21 of the second initialization output wiring may be located between the second interlayer-insulating layer 107 and the first organic insulating layer 109. That is, the first portion GIO11 of the first initialization output wiring and the first portion GIO21 of the second initialization output wiring may be located on substantially the same layer as the source electrode S1 (see FIG. 7A) of the main island portion 11 (see FIG. 4) and may include the same material as the source electrode S1. Likewise, the second portion GIO12 of the first initialization output wiring and the second portion GIO22 of the second initialization output wiring may be located on substantially the same layer as the source electrode S1 (see FIG. 7A).

An emission control output wiring EMO and a bypass output wiring GBO extending from a 4-1 bridge portion BP41 may be located in the 5-1 island portion IP51, the 5-1 bridge portion BP51, and the 6-1 island portion IP61. Because the emission control output wiring EMO and the bypass output wiring GBO are wirings for transmitting an output signal of stages located outside the initialization stage GIST, the emission control output wiring EMO and the bypass output wiring GBO may be referred to as 'pre-output wirings'.

A first emission control output wiring EMO1 may include a sixth portion EMO16 of the first emission control output wiring and a seventh portion EMO17 of the first emission control output wiring, and a second emission control output wiring EMO2 may include a sixth portion EMO26 of the second emission control output wiring and a seventh portion EMO27 of the second emission control output wiring. Likewise, a bypass output wiring GBO1 may include a third portion GBO13 of the first bypass output wiring and a fourth portion GBO14 of the first bypass output wiring, and a second bypass output wiring GBO2 may include a third portion GBO23 of the second bypass output wiring and a fourth portion GBO24 of the second bypass output wiring.

The emission control output wiring EMO and the bypass output wiring GBO located in the 4-1 bridge portion BP41 may be connected to the emission control output wiring EMO and the bypass output wiring GBO located in the 5-1 island portion IP51. For example, a fifth portion EMO15 of the first emission control output wiring may be connected to the sixth portion EMO16 of the first emission control output wiring, and a fifth portion EMO25 of the second emission control output wiring may be connected to the sixth portion EMO26 of the second emission control output wiring. A second portion GBO12 of the first bypass output wiring may be connected to the third portion GBO13 of the first bypass output wiring, and a second portion GBO22 of the second bypass output wiring may be connected to the third portion GBO23 of the second bypass output wiring.

Pre-output wirings located in the 5-1 island portion IP51 may not extend around an outer side of the initialization stage GIST, but may extend to pass through a space where the $n^{th}$ initialization stage GISTn and the $n+1^{th}$ initialization stage GISTn+1 are spaced apart from each other. That is, the pre-output wirings located in the 5-1 island portion IP51 may extend in the first direction (e.g., the x direction) through the center of the 5-1 island portion IP51. However, as the pre-output wirings extend in the first direction (e.g., the x direction) and second input lines IL2 extend in the second direction (e.g., the y direction), there may occur an area where the pre-output wirings and the second input lines IL2 overlap each other in a plan view. Accordingly, in order to avoid collision between the pre-output wirings and the second input lines IL2, the pre-output wirings may be connected to the second input lines IL2 through a bridge electrode BE' in the intersection area. For example, the fifth portion EMO15 of the first emission control output wiring located in the 4-1 bridge portion BP41 may be connected to the sixth portion EMO16 of the first emission control output wiring located in the 5-1 island portion IP51 through the bridge electrode BE'.

Referring to FIG. 18, the emission control output wiring EMO and the second input lines IL2 may be located at substantially the same layer as the source electrode S1 (see FIG. 7A), and the bridge electrode BE' may be located at substantially the same layer as the upper electrode CE2 (see FIG. 7A). In this case, one end of the bridge electrode BE' may be connected to the fifth portion EMO15 of the first emission control output wiring through a contact hole, and the other end may be connected to the sixth portion EMO16 of the first emission control output wiring, to transmit an emission control signal EM (see FIG. 10).

The sixth portion EMO16 of the first emission control output wiring and the third portion GBO13 of the first bypass output wiring may be located in the same layer as the first portion GIO11 of the first initialization output wiring to have a similar shape, and the sixth portion EMO26 of the second emission control output wiring and the third portion GBO23 of the second bypass output wiring may be located in the same layer as the first portion GIO21 of the second initialization output wiring to have a similar shape. That is, the sixth portion EMO16 of the first emission control output wiring, the sixth portion EMO26 of the second emission control output wiring, the third portion GBO13 of the first bypass output wiring, and the third portion GBO23 of the second bypass output wiring may extend to be located in the 5-1 bridge portion BP51 and the 6-1 island portion IP61.

Also, the sixth portion EMO16 of the first emission control output wiring may be connected to the seventh portion EMO17 of the first emission control output wiring through the bridge electrode BE, and the sixth portion EMO26 of the second emission control output wiring may be connected to the seventh portion EMO27 of the second emission control output wiring through the bridge electrode BE. Likewise, the bypass output wiring GBO and the initialization output wiring GIO may extend through the bridge electrode BE in the 6-1 island portion IP61. The seventh portion EMO17 of the first emission control output wiring and the fourth portion GBO14 of the first bypass output wiring may be located in the same layer as the second portion GIO12 of the first initialization output wiring and may have a shape similar to the shape of the second portion GIO12 of the first initialization output wiring. The seventh portion EMO27 of the second emission control output wiring and the fourth portion GBO24 of the second bypass output wiring may be located in the same layer as the second portion GIO22 of the second initialization output wiring and may have a shape similar to the shape of the second portion GIO22 of the second initialization output wiring.

That is, the first portion GIO11 of the first initialization output wiring, the first portion GIO21 of the second initialization output wiring, the third portion GBO13 of the first bypass output wiring, the third portion GBO23 of the second bypass output wiring, the sixth portion EMO16 of the first emission control output wiring, and the sixth portion EMO26 of the second emission control output wiring may be located in the 5-1 bridge portion BP51. The second portion GIO12 of the first initialization output wiring, the second portion GIO22 of the second initialization output wiring, the fourth portion GBO14 of the first bypass output wiring, the fourth portion GBO24 of the second bypass output wiring, the seventh portion EMO17 of the first emission control output wiring, and the seventh portion EMO27 of the second emission control output wiring may be located in the 6-1 bridge portion BP61.

However, because the first emission control output wiring EMO1, the second emission control output wiring EMO2, the first bypass output wiring GBO1, and the second bypass output wiring GBO2 extend through a separation space between the initialization stages GIST, the sixth portion EMO16 of the first emission control output wiring, the third portion GBO13 of the first bypass output wiring, the third portion GBO23 of the second bypass output wiring, and the sixth portion EMO26 of the second emission control output wiring may be located at the center of the 5-1 bridge portion BP51. Accordingly, the first portion GIO11 of the first initialization output wiring and the first portion GIO21 of the second initialization output wiring located in the 5-1 bridge portion BP51 may be located on an outer side of the 5-1 bridge portion BP51. In other words, the initialization output wiring GIO connected to the initialization stage GIST located in the 5-1 island portion IP51 may be located on an outer side of the 5-1 bridge portion BP51, and pre-output wirings may be located at the center of the 5-1 bridge portion BP51.

Also, a width of the peripheral bridge portion 22 (see FIG. 12) may be constant, and thus, a width of each of the 5-1 bridge portion BP51 and the 6-1 bridge portion BP11 may have a length of 35 μm to 40 μm, like the 1-1 bridge portion BP11. However, unlike a case where only two emission control output wirings EMO and two bypass output wirings GBO are located in the 3-1 bridge portion BP31 and the 4-1 bridge portion BP41, two emission control output wirings EMO, two bypass output wirings GBO, and two initialization output wirings GIO may be located in the 5-1 bridge portion BP51 and the 6-1 bridge portion BP61. Accordingly, a width of an output wiring located in the 5-1 bridge portion BP51 and the 6-1 bridge portion BP61 may be less than a width of an output wiring located in the 1-1 bridge portion BP11 to the 4-1 bridge portion BP41. In an embodiment, a width of each of the emission control output wiring EMO, the bypass output wiring GBO, and the initialization output wiring GIO located in the 5-1 bridge portion BP51 may be 4 μm, and a width of a separation space between output wirings may be 3 μm. That is, a load of an output wiring may be minimized by maximally using widths of the emission control output wiring EMO, the bypass output wiring GBO, and the initialization output wiring GIO located in the 5-1 bridge portion BP51 and the 6-1 bridge portion BP61.

Input lines for applying a signal or a voltage to the initialization stage GIST may also be located in the 5-1 island portion IP51 and the 6-1 island portion IP61. First input lines IL1 located in the 6-1 island portion IP61 may have a structure similar to the structure of the first input lines IL1 located in the 2-1 island portion IP21 of FIG. 13, and second input lines IL2 located in the 5-1 island portion IP51 may have a structure similar to the structure of the second input lines IL2 located in the 1-1 island portion IP11 of FIG. 13. Likewise, a high voltage connection wiring VGHL and a low voltage connection wiring VGLL which are a connection wiring CW for transmitting a voltage of the first input lines IL1 may have structures similar to the high voltage connection wiring VGHL and he low voltage connection wiring VGLL of FIG. 13.

Figure 19:
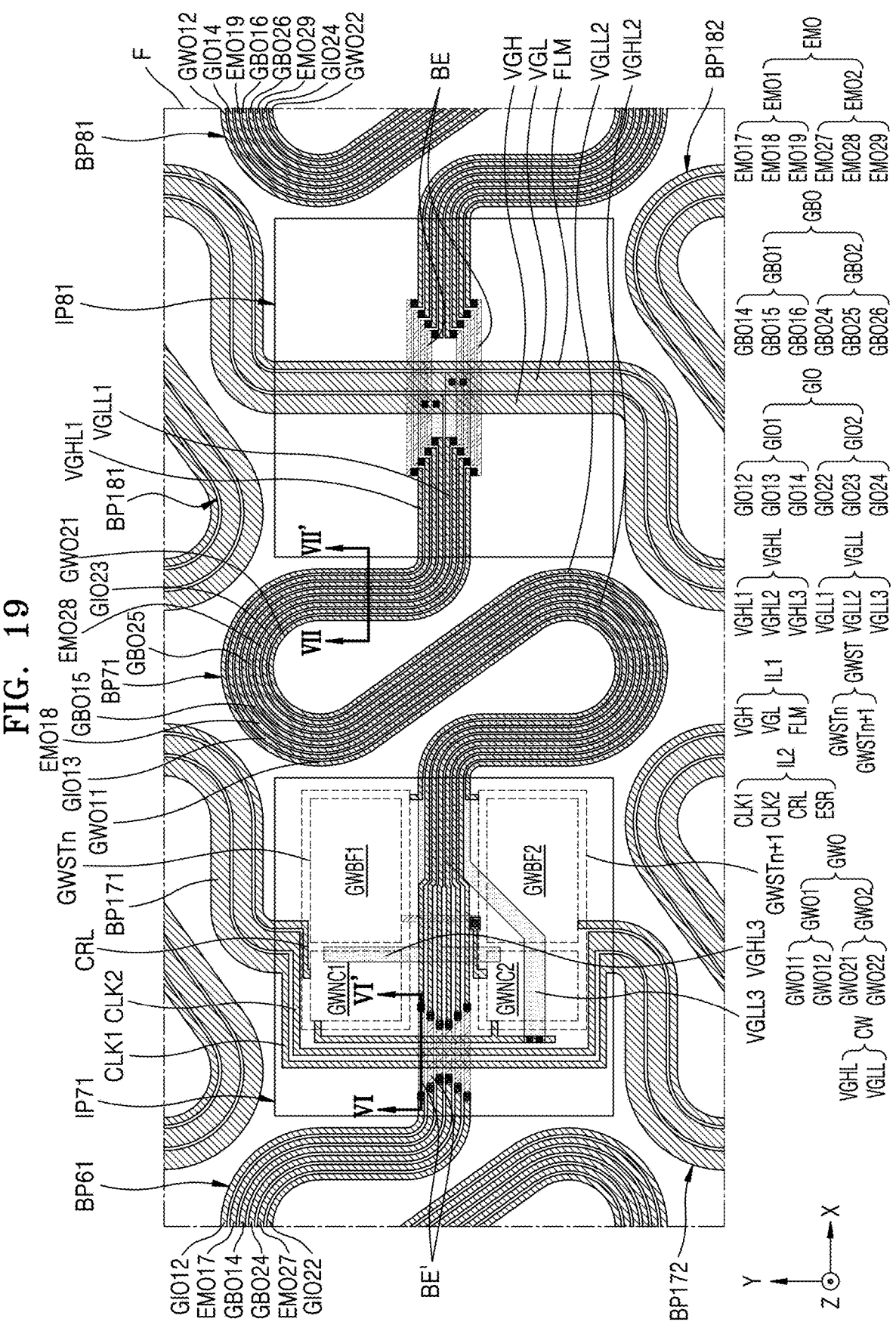
FIG. 19 is an enlarged schematic plan view illustrating a portion F of the display apparatus of FIG. 12, according to an embodiment.
Figure 20:
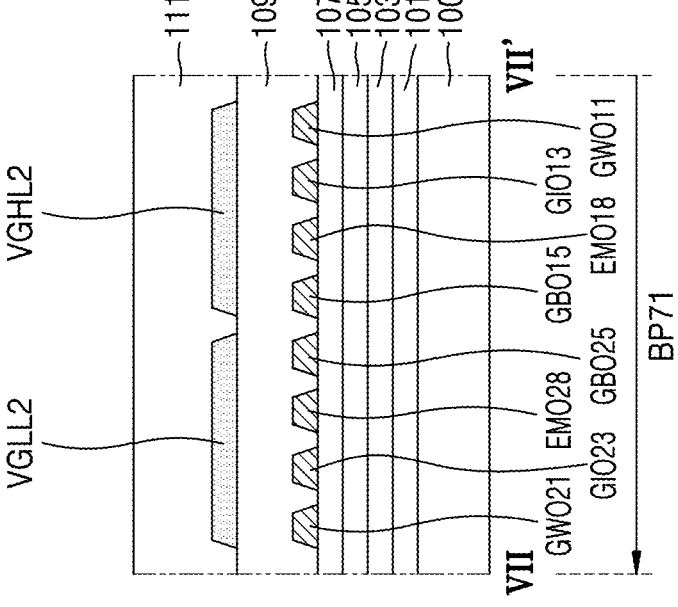
FIG. 20 is a cross-sectional view illustrating a part of the display apparatus of FIG. 19, taken along lines VI-VI' and VII-VII', according to an embodiment.
Figure 20:
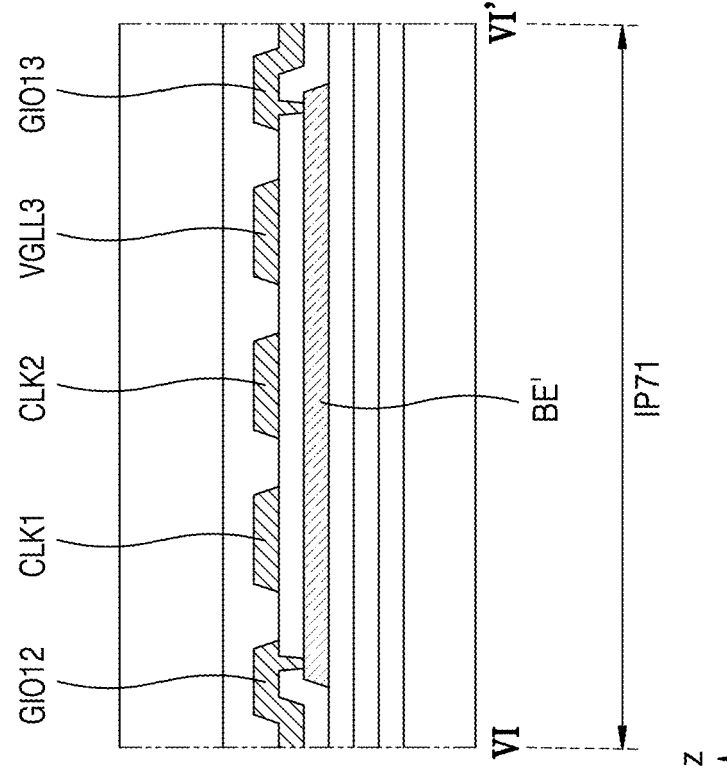

FIG. 19 is an enlarged schematic plan view illustrating a portion F of the display apparatus of FIG. 12, according to an embodiment. FIG. 20 is a cross-sectional view illustrating a part of the display apparatus of FIG. 19, taken along lines VI-VI' and VII-VII', according to an embodiment.

First, referring to FIG. 19, a 7-1 island portion IP71 may be located in an $n^{th}$ data write stage GWSTn and an $n+1^{th}$ data write stage GWSTn+1. Each data write stage GWST may include a node controller and a buffer transistor. For example, the $n^{th}$ data write stage GWSTn may include a first scan node controller GWNC1 and a first scan buffer transistor GWBF1, and the $n+1^{th}$ data write stage GWSTn+1 may include a second scan node controller GWNC2 and a second scan buffer transistor GWBF2.

An output signal of each of the $n^{th}$ data write stage GWSTn and the $n+1^{th}$ data write stage GWSTn+1 may be used to apply a scan signal GW (see FIG. 10) to the display area DA (see FIG. 3) through a data write output wiring GWO. In detail, a scan signal GW (see FIG. 10) output from the data write stage GWST may be first transmitted to the data write output wiring GWO, and then may be supplied to a pixel of the display area DA (see FIG. 3) through a scan signal line GWL (see FIG. 10) connected to the data write output wiring GWO.

The data write output wiring GWO may include a first data write output wiring GWO1 connected to the $n^{th}$ data write stage GWSTn and a second data write output wiring GWO2 connected to the $n+1^{th}$ data write stage GWSTn+1. The first data write output wiring GWO1 may include a first portion GWO11 of the first data write output wiring and a second portion GWO12 of the first data write output wiring, and the second data write output wiring GWO2 may include a first portion GWO21 of the second data write output wiring and a second portion GWO22 of the second data write output wiring.

The first portion GWO11 of the first data write output wiring may be directly connected to the $n^{th}$ data write stage GWSTn and may extend to be located in a 7-1 bridge portion BP71 and an 8-1 island portion IP81, like the first portion EMO11 of the first emission control output wiring. The second portion GWO12 of the first data write output wiring may be located in the 8-1 island portion IP81 and may extend to an 8-1 bridge portion BP81, like the second portion EMO12 of the first emission control output wiring. The first portion GWO11 of the first data write output wiring and the second portion GWO12 of the first data write output wiring may be connected to one end and the other end of a bridge electrode BE, respectively, to be electrically connected to each other. The first portion GWO21 of the second data write output wiring may have a similar shape to the first portion GWO11 of the first data write output wiring, and the second portion GWO22 of the second data write output wiring may have a similar shape to the second portion GWO12 of the first data write output wiring.

Referring to FIG. 20, the first portion GWO11 of the first data write output wiring and the first portion GWO21 of the second data write output wiring may be located between the second interlayer-insulating layer 107 and the first organic insulating layer 109. That is, the first portion GWO11 of the first data write output wiring and the first portion GWO21 of the second data write output wiring may be located on substantially the same layer as the source electrode S1 (see FIG. 7A) of the main island portion 11 (see FIG. 4) and may include the same material as the material of the source electrode S1. Likewise, the second portion GWO12 of the first data write output wiring and the second portion GWO22 of the second data write output wiring may be located in the same layer as the source electrode S1 (see FIG. 7A).

An emission control output wiring EMO, a bypass output wiring GBO, and an initialization output wiring GIO extending from a 6-1 bridge portion BP61 may be located in the 7-1 island portion IP71, the 7-1 bridge portion BP71, and the 8-1 island portion IP81. Because the emission control output wiring EMO, the bypass output wiring GBO, and the initialization output wiring GIO are wirings for transmitting an output signal of stages located outside the data write stage GWST, the emission control output wiring EMO, the bypass output wiring GBO, and the initialization output wiring GIO may be referred to as 'pre-output wirings'.

A first emission control output wiring EMO1 may include an eighth portion EMO18 of the first emission control output wiring and a ninth portion EMO19 of the first emission control output wiring, and a second emission control output wiring EMO2 may include an eighth portion EMO28 of the second emission control output wiring and a ninth portion EMO29 of the second emission control output wiring. Likewise, a bypass output wiring GBO1 may include a fifth portion GBO15 of the first bypass output wiring and a sixth portion GBO16 of the first bypass output wiring, and a second bypass output wiring GBO2 may include a fifth portion GBO25 of the second bypass output wiring and a sixth portion GBO26 of the second bypass output wiring. A first initialization output wiring GIO1 may include a third portion GIO13 of the first initialization output wiring and a fourth portion GIO14 of the first initialization output wiring, and a second initialization output wiring GIO2 may include a third portion GIO23 of the second initialization output wiring and a fourth portion GIO24 of the second initialization output wiring.

The emission control output wiring EMO, the bypass output wiring GBO, and the initialization output wiring GIO located in the 6-1 bridge portion BP61 may be connected to the emission control output wiring EMO, the bypass output wiring GBO, and the initialization output wiring GIO located in the 7-1 island portion IP71. For example, a seventh portion EMO17 of the first emission control output wiring may be connected to the eight portion EMO18 of the first emission control output wiring, and a seventh portion EMO27 of the second emission control output wiring may be connected to the eighth portion EMO28 of the second emission control output wiring. A fourth portion GBO14 of the first bypass output wiring may be connected to the fifth portion GBO15 of the first bypass output wiring, and a fourth portion GBO24 of the second bypass output wiring may be connected to the fifth portion GBO25 of the second bypass output wiring. A second portion GIO12 of the first initialization output wiring may be connected to the third portion GIO13 of the first initialization output wiring, and a second portion GIO22 of the second initialization output wiring may be connected to a third portion GIO23 of the second initialization output wiring.

Pre-output wirings located in the 7-1 island portion IP71 may not extend around an outer side of the data write stage GWST, but may extend to pass through a space where the $n^{th}$ data write stage GWSTn and the $n+1^{th}$ data write stage GWSTn are spaced apart from each other. That is, the pre-output wirings located in the 7-1 island portion IP71 may extend in the first direction (e.g., the x direction) through the center of the 7-1 island portion IP71. However, as the pre-output wirings extend in the first direction (e.g., the x direction) and second input lines IL2 extend in the second direction (e.g., the y direction), there may occur an area where the pre-output wirings and the second input lines IL2 overlap each other in a plan view. Accordingly, in order to avoid collision between the pre-output wirings and the second input lines IL2, the pre-output wirings may be connected through a bridge electrode BE' in the area where the pre-output wirings and the second input lines IL2 intersect each other. For example, the seventh portion EMO17 of the first emission control output wiring located in the 6-1 bridge portion BP61 may be connected to the eighth portion EMO18 of the first emission control output wiring located in the 7-1 island portion IP71 through the bridge electrode BE'.

Referring to FIG. 20, the initialization output wiring GIO and the second input lines IL2 may be located on substantially the same layer as the source electrode S1 (see FIG. 7A), and the bridge electrode BE' may be located on substantially the same layer as the upper electrode CE2 (see FIG. 7A). In this case, one end of the bridge electrode BE' may be connected to the second portion GIO12 of the first initialization output wiring through a contact hole and the other may be connected to the third portion GIO13 of the first initialization output wiring through a contact hole, to transmit an initialization control signal GI (see FIG. 10).

The eighth portion EMO18 of the first emission control output wiring, the fifth portion GBO15 of the first bypass output wiring, and the third portion GIO13 of the first initialization output wiring may be located in the same layer as the first portion GWO11 of the first data write output wiring to have a similar shape, and the eight portion EMO28 of the second emission control output wiring, the fifth portion GBO25 of the second bypass output wiring, and the third portion GIO23 of the second initialization output wiring may be located in the same layer as the first portion GWO21 of the second data write output wiring to have a similar shape. That is, the eighth portion EMO18 of the first emission control output wiring, the eighth portion EMO28 of the second emission control output wiring, the fifth portion GBO15 of the first bypass output wiring, the fifth portion GBO25 of the second bypass output wiring, the third portion GIO13 of the first initialization output wiring, and the third portion GIO23 of the second initialization output wiring may extend to be located in the 7-1 bridge portion BP71 and the 8-1 island portion IP81.

Also, the eighth portion EMO18 of the first emission control output wiring may be connected to the ninth portion EMO19 of the first emission control output wiring through the bridge electrode BE, and the eighth portion EMO28 of the second emission control output wiring may be connected to the ninth portion EMO29 of the second emission control output wiring through the bridge electrode BE. Likewise, the bypass output wiring GBO, the initialization output wiring GIO, and the data write output wiring GWO may extend through the bridge electrode BE in the 8-1 island portion IP81. The ninth portion EMO19 of the first emission control output wiring, the sixth portion GBO16 of the first bypass output wiring, and the fourth portion GIO14 of the first initialization output wiring may be located in the same layer as the second portion GWO12 of the first data write output wiring and may have a shape similar to the shape of the second portion GWO12 of the first data write output wiring. The ninth portion EMO29 of the second emission control output wiring, the sixth portion GBO26 of the second bypass output wiring, and the fourth portion GIO24 of the second initialization output wiring may be located in the same layer as the second portion GWO22 of the second data write output wiring and may have a shape similar to the shape of the second portion GWO22 of the second data write output wiring.

That is, the first portion GWO11 of the first data write output wiring, the first portion GWO21 of the second data write output wiring, the third portion GIO13 of the first initialization output wiring, the third portion GIO23 of the second initialization output wiring, the firth portion GBO15 of the first bypass output wiring, the fifth portion GBO25 of the second bypass output wiring, the eighth portion EMO18 of the first emission control output wiring, and the eighth portion EMO28 of the second emission control output wiring may be located in the 7-1 bridge portion BP71. The second portion GWO12 of the first data write output wiring, the second portion GWO22 of the second data write output wiring, the fourth portion GIO14 of the first initialization output wiring, the fourth portion GIO24 of the second initialization output wiring, the sixth portion GBO16 of the first bypass output wiring, the sixth portion GBO26 of the second bypass output wiring, the ninth portion EMO19 of the first emission control output wiring, and the ninth portion EMO29 of the second emission control output wiring may be located in the 8-1 bridge portion BP81.

However, because the first emission control output wiring EMO1, the second emission control output wiring EMO2, the first bypass output wiring GBO1, the second bypass output wiring GBO2, the first initialization output wiring GIO1, and the second initialization output wiring GIO2 extend through a separation space between the data write stages GWST, the third portion GIO13 of the first initialization output wiring, the eighth portion EMO18 of the first emission control output wiring, the fifth portion GBO15 of the first bypass output wiring, the fifth portion GBO25 of the second bypass output wiring, the eighth portion EMO28 of the second emission control output wiring, and the third portion GIO23 of the second initialization output wiring may be located at the center of the 7-1 bridge portion BP71. Accordingly, the first portion GWO11 of the first data write output wiring and the first portion GWO21 of the second data write output wiring located in the 7-1 bridge portion BP71 may be located on an outer side of the 7-1 bridge portion BP71. In other words, the data write output wiring GWO connected to the data write stage GWST located in the 7-1 island portion IP71 may be located on an outer side of the 7-1 bridge portion BP71, and pre-output wirings may be located at the center of the 7-1 bridge portion BP71.

Also, a width of the peripheral bridge portion 22 (see FIG. 12) may be constant, and thus, a width of each of the 7-1 bridge portion BP71 and the 8-1 bridge portion BP81 may have a length of 35 μm to 40 μm, like the 1-1 bridge portion BP11. However, unlike a case where only two emission control output wirings EMO, two bypass output wirings GBO, and two initialization output wirings GIO are located in the 5-1 bridge portion BP51 and the 6-1 bridge portion BP61, two emission control output wirings EMO, two bypass output wirings GBO, two initialization output wirings GIO, and two data write output wirings GWO may be located in the 7-1 bridge portion BP71 and the 8-1 bridge portion BP81. Accordingly, a width of an output wiring located in the 7-1 bridge portion BP71 and the 8-1 bridge portion BP81 may be less than a width of an output wiring located in the 1-1 bridge portion BP11 to the 6-1 bridge portion BP61. In an embodiment, a width of each of the emission control output wiring EMO, the bypass output wiring GBO, the initialization output wiring GIO, and the data write output wiring GWO located in the 7-1 bridge portion BP71 may be 2.5 μm, and a width of a separation space between output wirings may be 2.5 μm. That is, a load of an output wiring may be minimized by maximally using widths of the emission control output wiring EMO, the bypass output wiring GBO, the initialization output wiring GIO, and the data write output wiring GWO located in the 7-1 bridge portion BP71 and the 8-1 bridge portion BP81.

That is, the display apparatus 1 according to an embodiment having the above structure may improve stretchability and may minimize a load of a wiring. In a general display apparatus, there is a sufficient space to arrange a driving circuit in the non-display area NDA (see FIG. 3), and thus, an output wiring of a driving circuit or input wirings may be easily arranged. On the other hand, in the display apparatus 1, because an output wiring or input lines should be located in a bridge portion, a length of a wiring may increase according to an 'S' shape, and because multiple wirings should be arranged in a limited space, a width of each wiring may decrease, thereby increasing a load of the wiring. However, in the display apparatus 1 according to an embodiment, because output wirings of the gate driving circuit GDC (see FIG. 3) are efficiently arranged in the peripheral bridge portion 22 (see FIG. 12) and widths of the output wirings in the peripheral bridge portion 22 (see FIG. 12) are maximally ensured, a load of the output wirings may be effectively reduced, thereby providing a high-quality image.

Input lines for applying a signal or a voltage to the data write stage GWST may also be located in the 7-1 island portion IP71 and the 8-1 island portion IP81. First input lines IL1 located in the 8-1 island portion IP81 may have a similar structure to the first input lines IL1 located in the 2-1 island portion IP21 of FIG. 13, and second input lines IL2 located in the 7-1 island portion IP71 may have a similar structure to the second input lines IL2 located in the 1-1 island portion IP11 of FIG. 13. Likewise, a high voltage connection wiring VGHL and a low voltage connection wiring VGLL which are a connection wiring CW for transmitting a voltage of the first input lines IL1 may have a similar structure to the high voltage connection wiring VGHL and the low voltage connection wiring VGLL of FIG. 13.

Figure 21A:
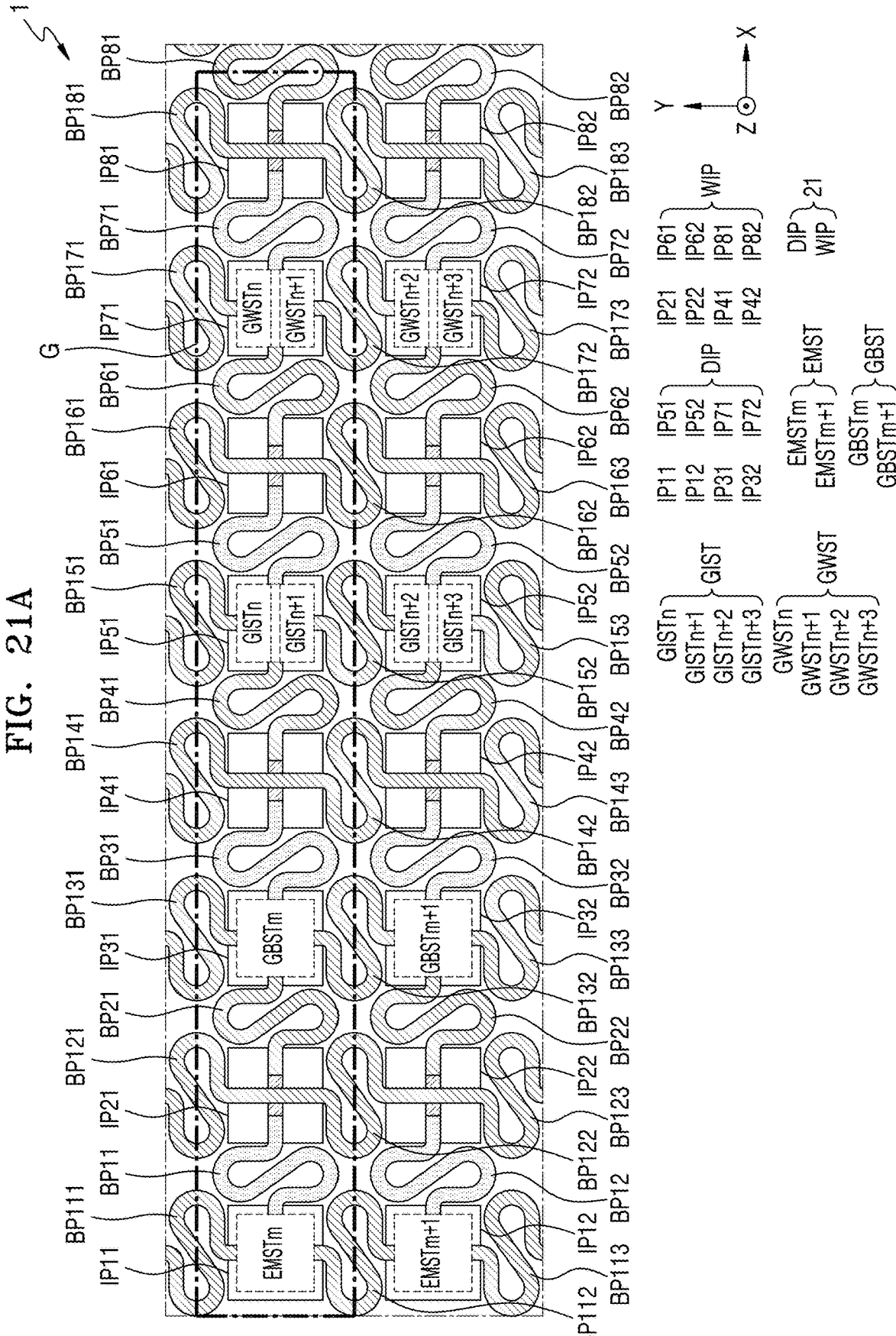
FIG. 21A is an enlarged schematic plan view illustrating a part of a display apparatus, according to another embodiment.
Figure 21B:
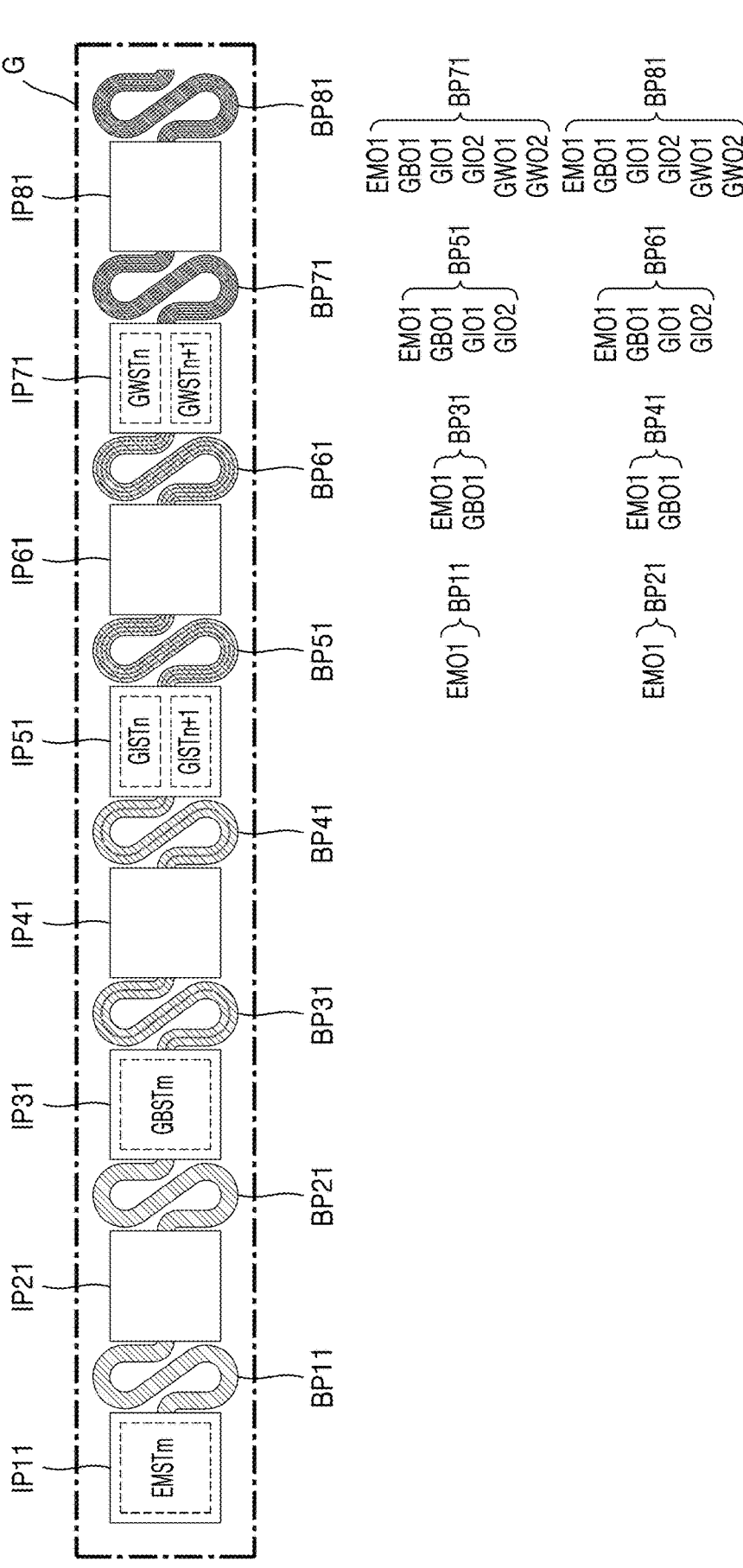
FIG. 21B is an enlarged schematic plan view illustrating a portion G of the display apparatus of FIG. 21A, according to another embodiment.

FIG. 21A is an enlarged schematic plan view illustrating a part of a display apparatus, according to another embodiment. FIG. 21B is an enlarged schematic plan view illustrating a portion G of the display apparatus of FIG. 21A, according to another embodiment. Referring to FIGS. 21A and 21B, features other than features of an emission control stage EMST, a bypass stage GBST, and an output wiring are the same as those described with reference to FIGS. 12 to 20. In FIGS. 21A and 21B, the same elements as those in FIGS. 12 to 20 are denoted by the same reference numerals, and thus, a difference will be mainly described. FIG. 21B illustrates only an island portion and an output wiring for convenience of explanation.

First, referring to FIG. 21A, the emission control stage EMST may be located in a 1-1 island portion IP11 and a 1-2 island portion IP12 which are a driver island portion DIP, and the bypass stage GBST may be located in a 3-1 island portion IP31 and a 3-2 island portion IP32. However, unlike a case where two stages are located in one driver island portion DIP in FIG. 12, in another embodiment as shown in FIG. 21A, only one stage may be located in one driver island portion DIP. For example, an $m^{th}$ emission control stage EMSTm (m is a natural number) may be located in the 1-1 island portion IP11, and an $m+1^{th}$ emission control stage EMSTm+1 may be located in the 1-2 island portion IP12. Likewise, an $m^{th}$ bypass stage GBSTm may be located in the 3-1 island portion IP31, and an $m+1^{th}$ bypass stage may be located in the 3-2 island portion IP32. On the other hand, two initialization stages GIST may be located in a 5-1 island portion IP51 and a 5-2 island portion IP52, and two data write stages GWST may be located in a 7-1 island portion IP71 and a 7-2 island portion IP72.

Because one driver island portion DIP may correspond to pixels constituting two rows located in the display area DA (see FIG. 3), the initialization stage GIST and the data write stage GWST may supply a signal to pixels constituting one row, but the emission control stage EMST and the bypass stage GBST may supply a signal to pixels constituting two rows.

Referring to FIG. 21B, because only the $m^{th}$ emission control stage EMSTm is located in the 1-1 island portion IP11, only a first emission control output wiring EMO1 may be located in a 1-1 bridge portion BP11 and a 2-1 bridge portion BP21. Also, because only the $m^{th}$ bypass stage GBSTm is located in the 3-1 island portion IP31, only a first bypass output wiring GBO1 may be located in a 3-1 bridge portion BP31 and a 4-1 bridge portion BP41. Accordingly, the first emission control output wiring EMO1, the first bypass output wiring GBO1, a first initialization output wiring GIO1, and a second initialization output wiring GIO2 may be located in a 5-1 bridge portion BP51 and a 6-1 bridge portion BP61, and the first emission control output wiring EMO1, the first bypass output wiring GBO1, the first initialization output wiring GIO1, the second initialization output wiring GIO2, a first data write output wiring GWO1, and a second data write output wiring GWO2 may be located in a 7-1 bridge portion BP71 and an 8-1 bridge portion BP81.

That is, one output wiring may be located in the 1-1 bridge portion BP11 and the 2-1 bridge portion BP21, two output wirings may be located in the 3-1 bridge portion BP31 and the 4-1 bridge portion BP41, four output wirings may be located in the 5-1 bridge portion BP51 and the 6-1 bridge portion BP61, and sixth output wirings may be located in the 7-1 bridge portion BP71 and the 8-1 bridge portion BP81. In other words, because only one emission control stage EMST and bypass stage GBST are located per driver island portion DIP and the number of the emission control output wirings EMO and the bypass output wirings GOB may be reduced by one, the number of output wirings located in each peripheral bridge portion 22 (see FIG. 12) may be reduced.

Because an output wiring may have a limited width in each peripheral bridge portion 22 (see FIG. 12), when the number of output wirings is reduced, a width that each output wiring may have may be increased. As a result, because the display apparatus 1 according to another embodiment may ensure a wider width of an output wiring, a load of the output wiring may be further reduced.

Figure 22A:
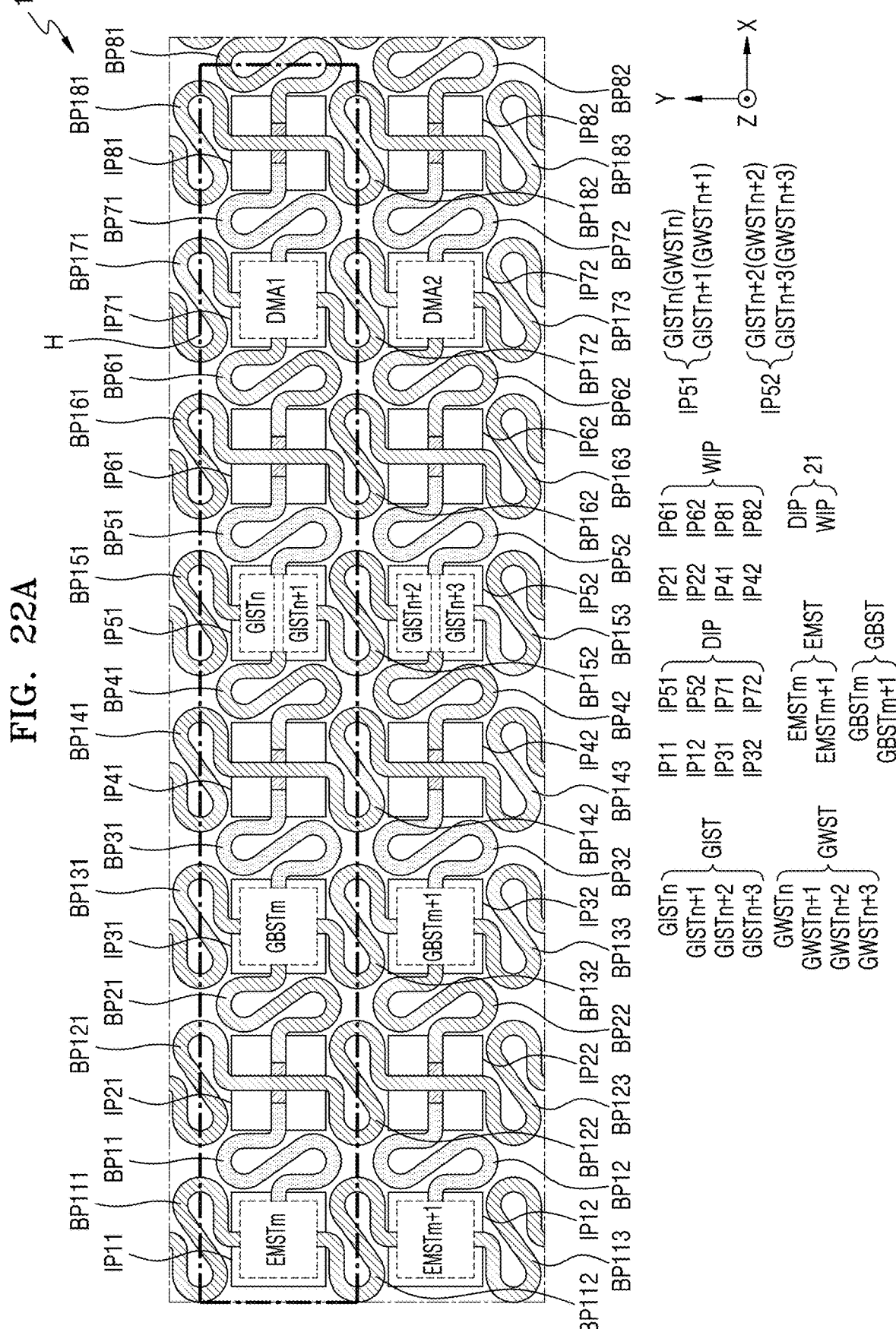
FIG. 22A is an enlarged schematic plan view illustrating a part of a display apparatus, according to another embodiment.
Figure 22B:
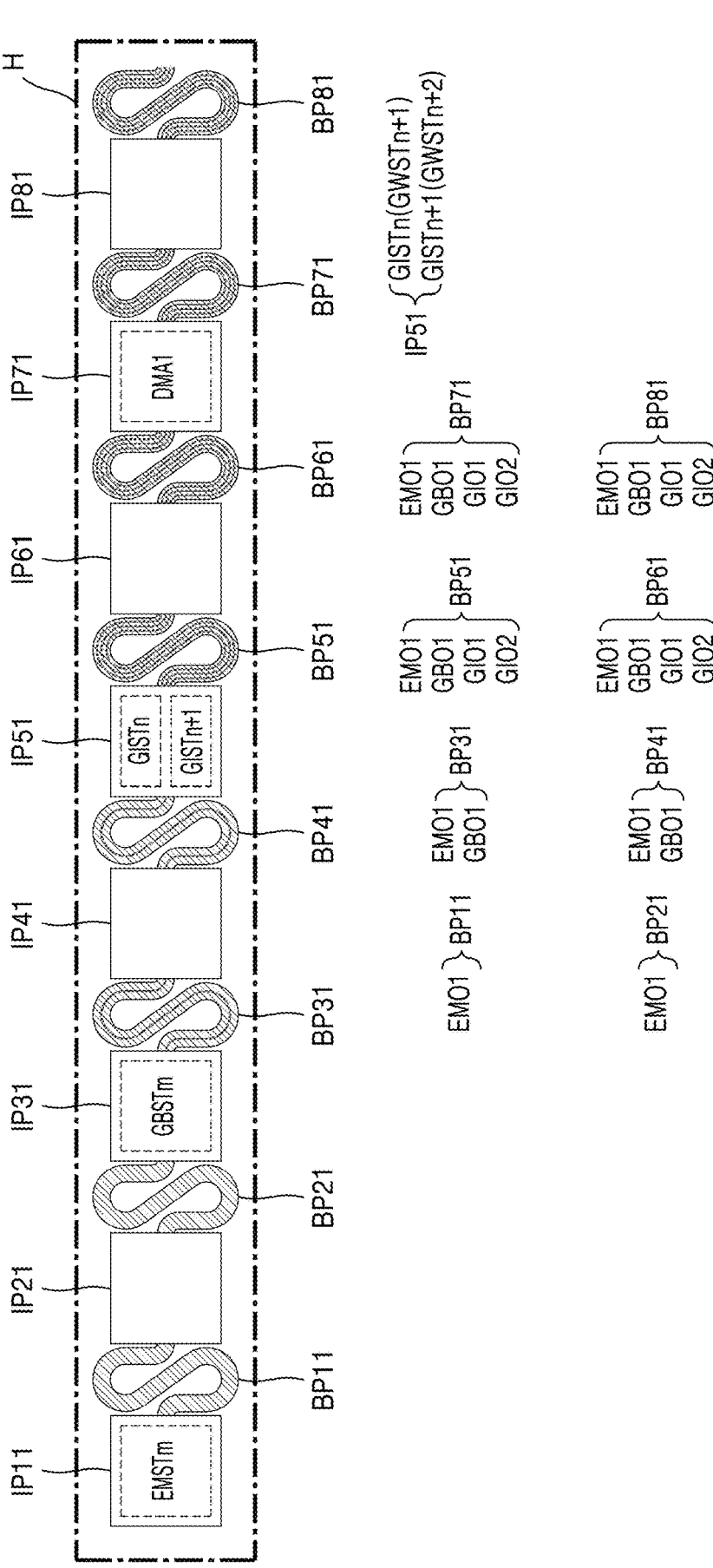
FIG. 22B is an enlarged schematic plan view illustrating a portion H of the display apparatus of FIG. 22A, according to another embodiment.

FIG. 22A is an enlarged schematic plan view illustrating a part of a display apparatus, according to another embodiment. FIG. 22B is an enlarged schematic plan view illustrating a portion H of the display apparatus of FIG. 22A, according to another embodiment. Referring to FIGS. 22A and 22B, features other than features of an initialization stage GIST and a data write stage GWST are the same as those described with reference to FIGS. 21A and 21B. In FIGS. 22A and 22B, the same elements as those in FIGS. 21A and 21B are denoted by the same reference numerals, and a difference will be mainly described. FIG. 22B illustrates only an island portion and an output wiring for convenience of explanation.

First, referring to FIG. 22A, the initialization stage GIST and the data write stage GWST may be located in a 5-1 island portion IP51 and a 5-2 island portion IP52. That is, in the display apparatus 1 of FIG. 22A, the initialization stage GIST may also be used as the data write stage GWST. In other words, the initialization stage GIST and the data write driving stage GWST may configured as one stage. The initialization stage GIST may output not only an initialization control signal GI (see FIG. 10) but also a scan signal GW (see FIG. 10). Accordingly, each of a 7-1 island portion IP71 and a 7-2 island portion IP72 in which the data write stage GWST was located may include a dummy area. For example, the 7-1 island portion IP71 may include a first dummy area DMA1 in which a dummy transistor may be located. Likewise, the 7-2 island portion IP71 may include a second dummy area DMA2 in which a dummy transistor may be located.

Referring to FIG. 22B, as described above, because an $n^{th}$ initialization stage GISTn and an $n+1^{th}$ initialization stage GISTn+1 may be located in the 5-1 island portion IP51 and the initialization stage GIST may function as the data write stage GWST, a stage may not be located in the 7-1 island portion IP71. Accordingly, an output wiring for transmitting an output signal of the data write stage GWST may not be separately located. A first emission control output wiring EMO1, a first bypass output wiring GBO1, a first bypass output wiring GIO1, and a second initialization output wiring GIO2 may be located in each of a 5-1 bridge portion BP51 and a 6-1 bridge portion BP61, and the first emission control output wiring EMO1, the first bypass output wiring GBO1, the first bypass output wiring GIO1, and the second initialization output wiring GIO2 may be located in each of a 7-1 bridge portion BP71 and an 8-1 bridge portion BP81.

That is, one output wiring may be located in a 1-1 bridge portion BP11 and a 2-1 bridge portion BP21, two output wirings may be located in a 3-1 bridge portion BP31 and a 4-1 bridge portion BP41, four output wirings may be located in the 5-1 bridge portion BP51 and the 6-1 bridge portion BP61, and four output wirings may be located in the 7-1 bridge portion BP71 and the 8-1 bridge portion BP81. In other words, as the initialization stage GIST and the data write stage GWST are configured as one stage, because a data write output wiring GWO may not be located, the number of output wirings located in the 7-1 bridge portion BP71 and the 8-1 bridge portion BP81 may be reduced.

Because an output wiring may have a limited width in each peripheral bridge portion 22 (see FIG. 12), when the number of output wirings is reduced, a width that each output wiring may have may be increased. As a result, because the display apparatus 1 according to another embodiment may ensure a wider width of an output wiring, a load of the output wiring may be further reduced.

Figure 23:
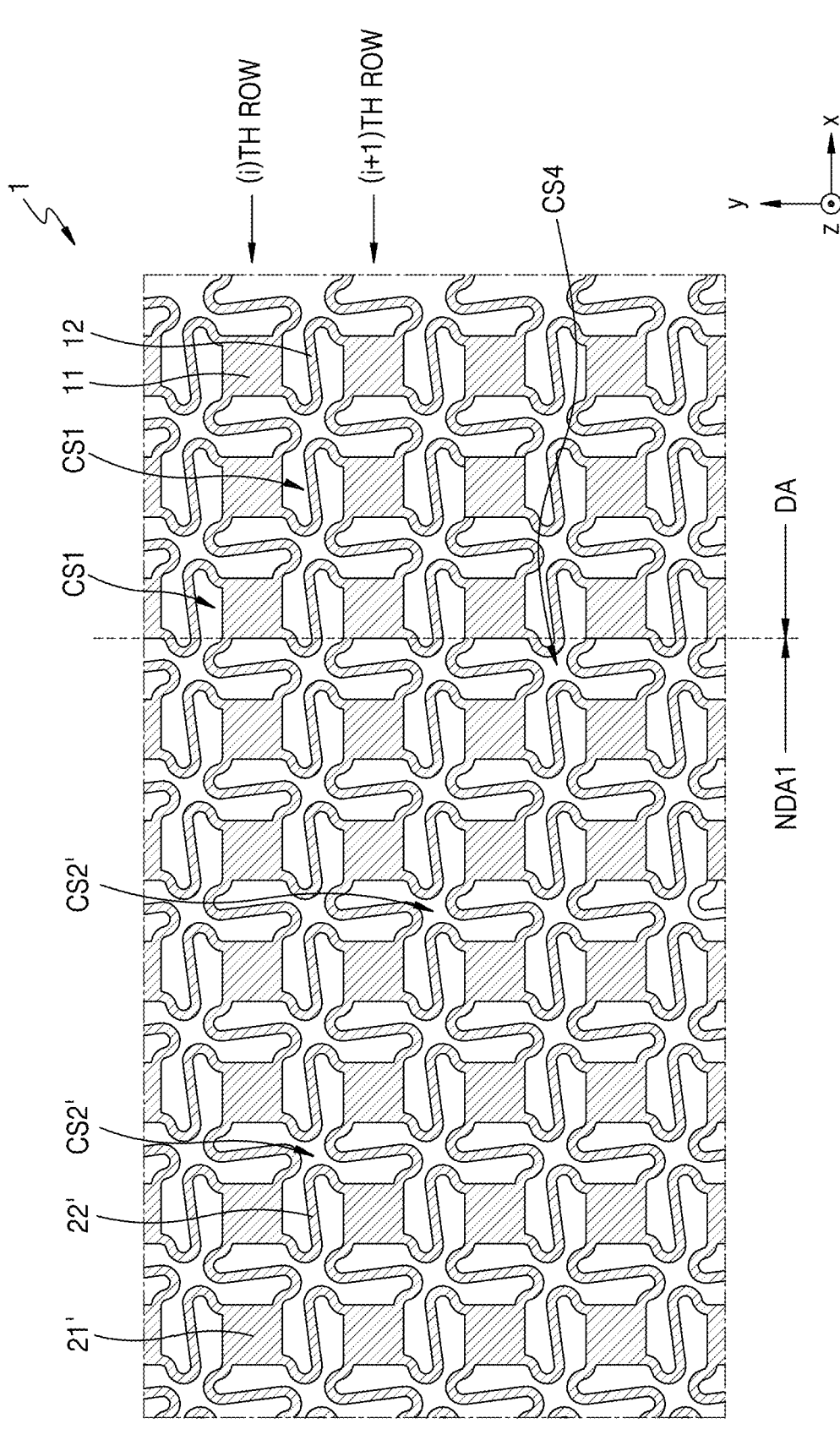
FIG. 23 is an enlarged schematic plan view illustrating a part of a display apparatus, according to another embodiment.
Figure 24:
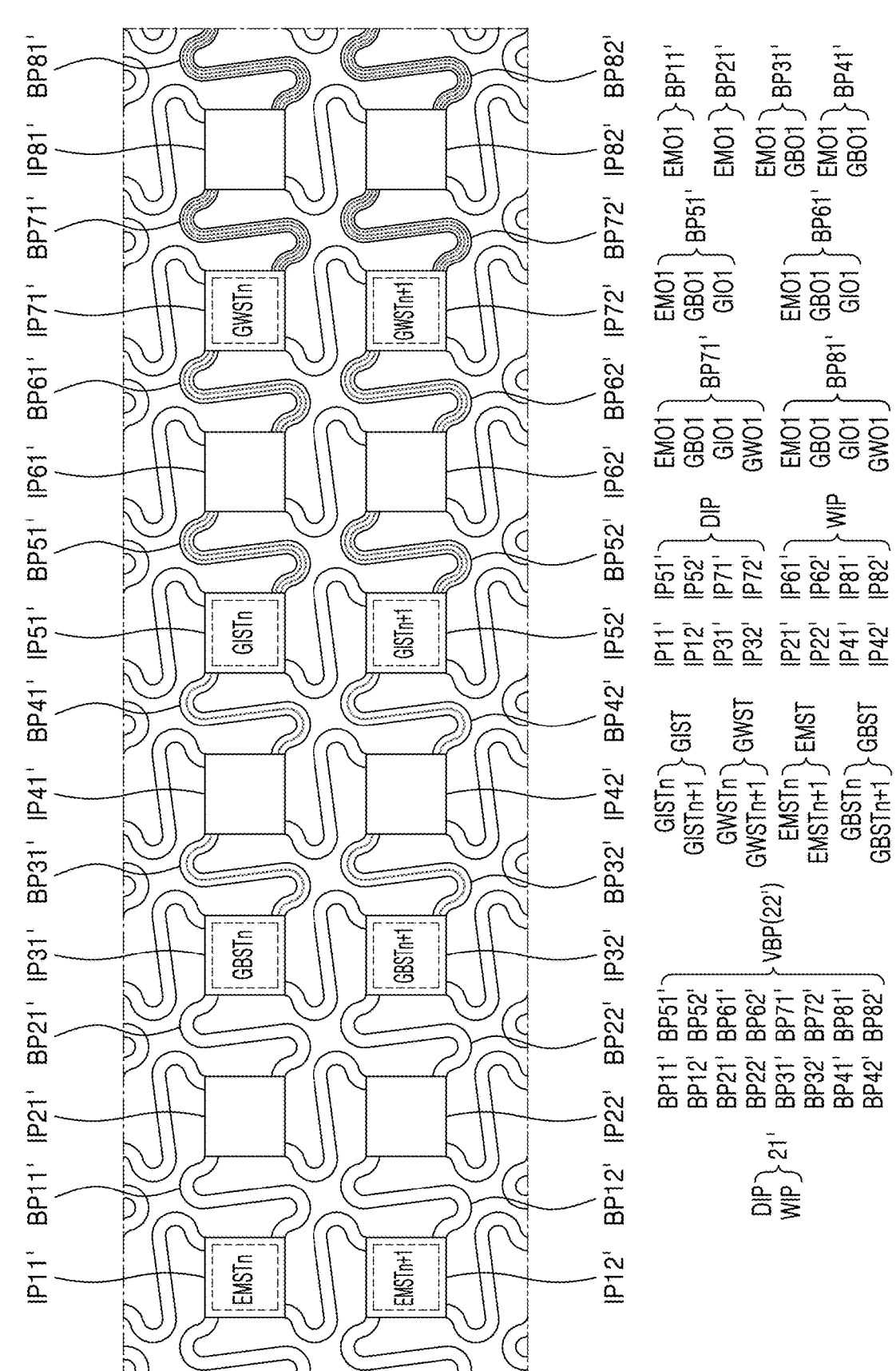
FIG. 24 is an enlarged schematic plan view illustrating a part of a display apparatus, according to another embodiment.
Figure 25:
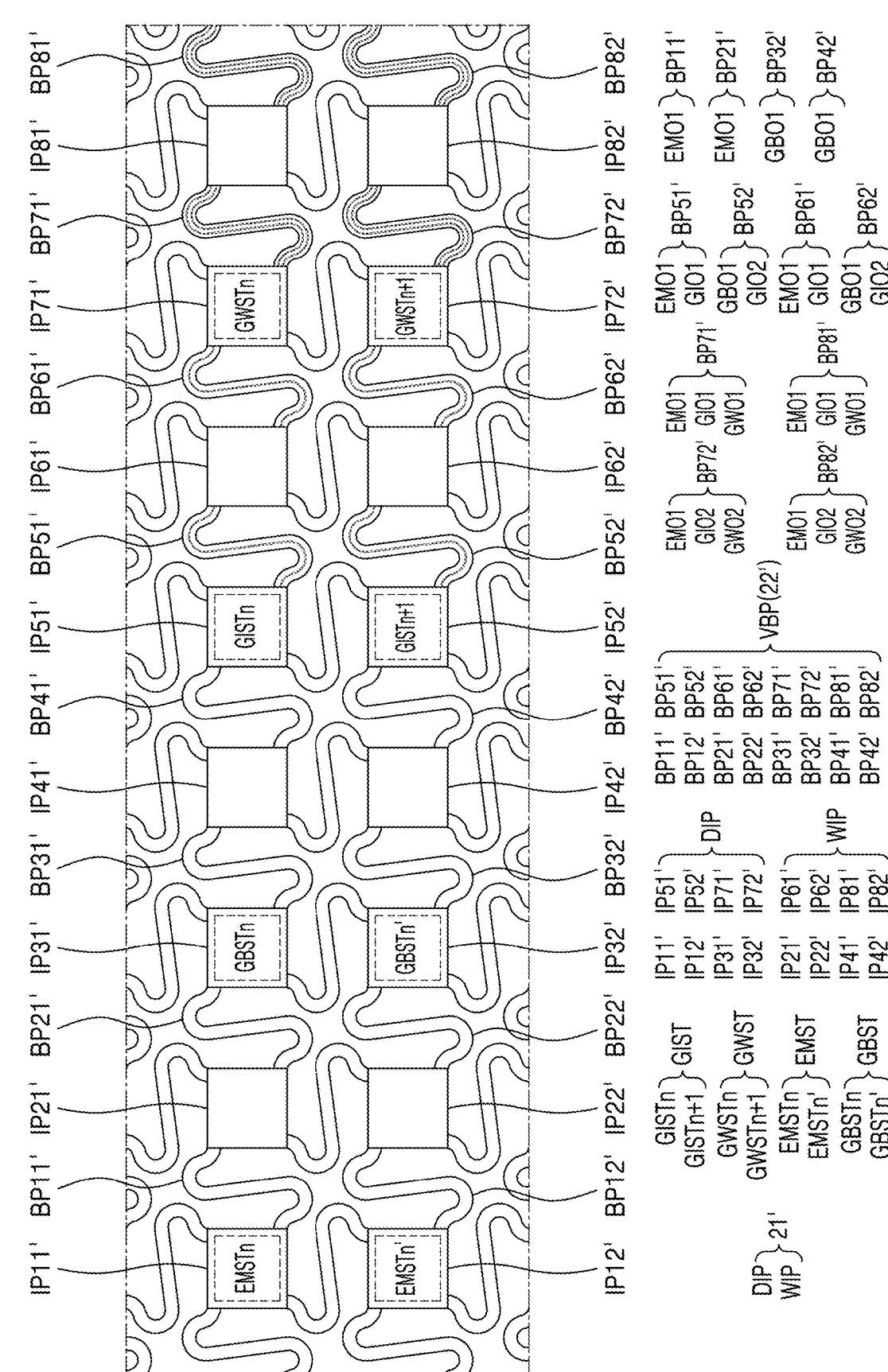
FIG. 25 is an enlarged schematic plan view illustrating a part of a display apparatus, according to another embodiment.
Figure 26:
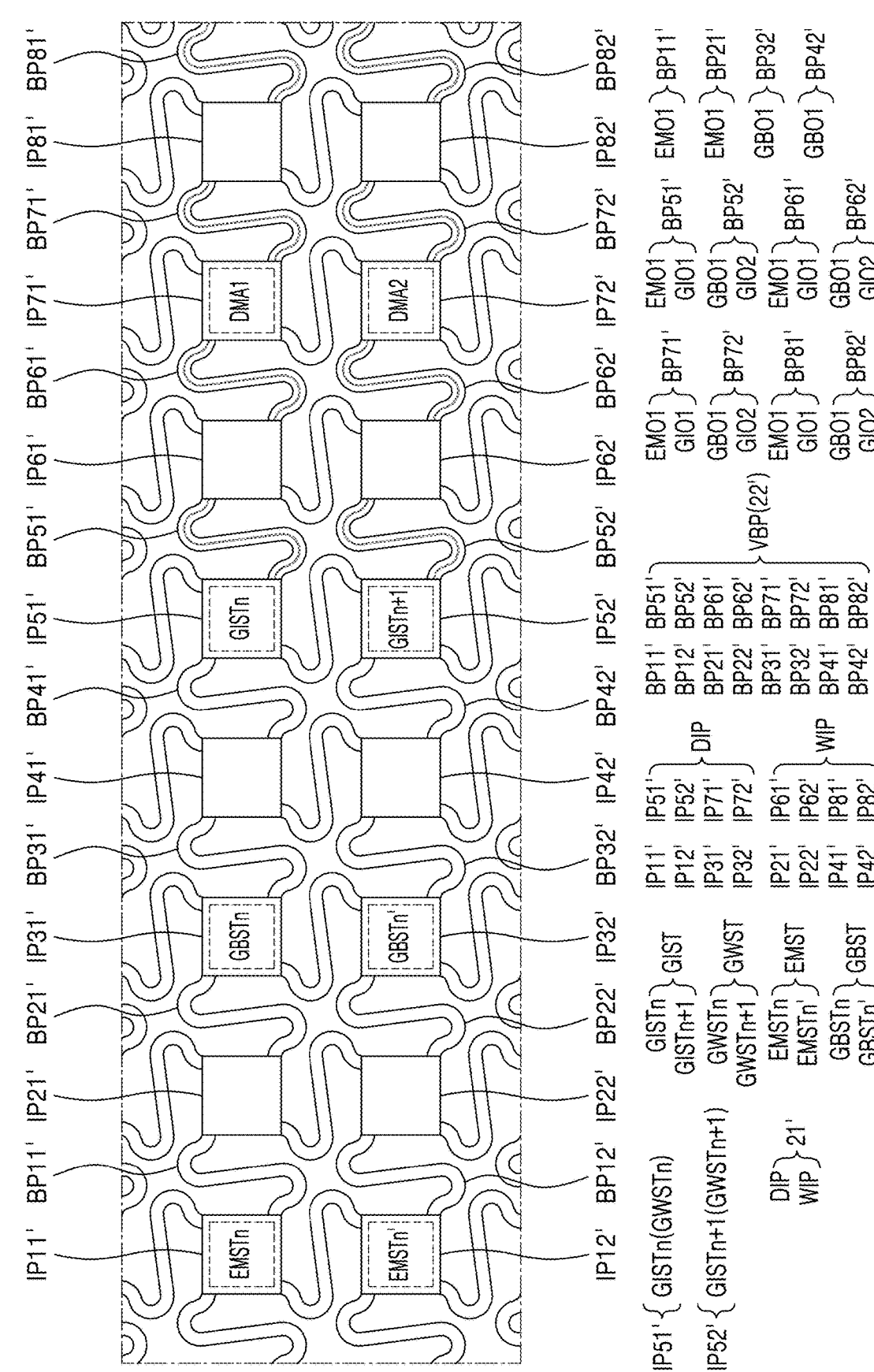
FIG. 26 is an enlarged schematic plan view illustrating a part of a display apparatus, according to another embodiment.

FIG. 23 is an enlarged schematic plan view illustrating a part of a display apparatus, according to another embodiment. FIG. 24 is an enlarged schematic plan view illustrating a part of a display apparatus, according to another embodiment. FIG. 25 is an enlarged schematic plan view illustrating a part of a display apparatus, according to another embodiment. FIG. 26 is an enlarged schematic plan view illustrating a part of a display apparatus, according to another embodiment. Referring to FIGS. 23 to 26, features other than features of a peripheral island portion 21' and a peripheral bridge portion 22" are the same as those described with reference to FIGS. 12 to 20. In FIGS. 23 to 26, the same elements as those in FIGS. 12 to 20 are denoted by the same reference numerals, and a difference will be mainly described.

First, referring to FIG. 23, the display apparatus 1 may include the peripheral island portions 21' spaced apart from each other in the first direction (e.g., the x direction) and the second direction (e.g., the y direction) and the peripheral bridge portions 22' connecting adjacent peripheral island portions 21' in a first non-display area NDA1. In this case, a size and/or a width of the peripheral island portion 21' may be the same as a size and/or a width of a main island portion 11. For example, a planar area of the peripheral island portion 21' may be the same as a planar area of the main island portion 11. Likewise, a size and/or a width of the peripheral bridge portion 22' may be the same as a size and/or a width of a main bridge portion 12. For example, a planar area of the peripheral bridge portion 22' may be the same as a planar area of the main bridge portion 12'.

Accordingly, the peripheral island portion 21' may have the same structure as a shape of the main island portion 11, and the peripheral bridge portion 22 may have the same structure as a shape of the main bridge portion 12. That is, the peripheral bridge portions 22' may be connected to four sides of the peripheral island portion 21', and each of the four peripheral bridge portions 22' may extend from each corner of the peripheral island portion 21'.

Also, the peripheral island portions 21' of any one row located in the first non-display area NDA1 may correspond to the main island portions 11 of any one row arranged in the display area DA. For example, the peripheral island portions 21' of any one row located in the first non-display area NDA1 may correspond to the main island portions 11 arranged in an $(i)^{th}$ row of the display area DA, and the peripheral island portions 21' of another row may correspond to the main island portions 11 arranged in an $(i+1)^{th}$ row of the display area DA.

Referring to FIG. 24, only one stage may be located in the peripheral island portion 21' having the above structure. For example, an $n^{th}$ emission control stage EMSTn may be located in a 1-1 island portion IP11', and an $n+1^{th}$ emission control stage EMSTn+1 may be located in a 1-2 island portion IP12'. Likewise, an $n^{th}$ bypass stage GBSTn may be located in a 3-1 island portion IP31', and an $n+1^{th}$ bypass stage GBSTn+1 may be located in a 3-2 island portion IP32'. An $n^{th}$ initialization stage GISTn may be located in a 5-1 island portion IP51', and an $n+1^{th}$ initialization stage GISTn+1 may be located in a 5-2 island portion IP52'. An $n^{th}$ data write stage GWSTn may be located in a 7-1 island portion IP71', and an $n+1^{th}$ data write stage GWSTn+1 may be located in a 7-2 island portion IP72'.

Accordingly, only a first emission control output wiring EMO1 may be located in a 1-1 bridge portion BP11' and a 2-1 bridge portion BP21', and only the first emission control output wiring EMO1 and a first bypass output wiring GBO1 may be located in a 3-1 bridge portion BP31' and a 4-1 bridge portion BP41'. Likewise, only the first emission control output wiring EMO1, the first bypass output wiring GBO1, and a first initialization output wiring GIO1 may be located in a 5-1 bridge portion BP51' and a 6-1 bridge portion BP61', and only the first emission control output wiring EMO1, the first bypass output wiring GBO1, the first initialization output wiring GIO1, and a first data write output wiring GWO1 may be located in a 7-1 bridge portion BP71' and an 8-1 bridge portion BP81'.

That is, one output wiring may be located in the 1-1 bridge portion BP11 and the 2-1 bridge portion BP21, two output wirings may be located in the 3-1 bridge portion BP31 and the 4-1 bridge portion BP41, three output wirings may be located in the 5-1 bridge portion BP51 and the 6-1 bridge portion BP61, and four output wirings may be located in the 7-1 bridge portion BP71 and the 8-1 bridge portion BP81. In other words, even when a structure of the peripheral island portion 21' is the same as the structure of the main island portion 11, through the above structure, a width of an output wiring may be maximally ensured and a load of a wiring may be reduced.

Next, referring to FIG. 25, an emission control stage EMST may be located in a 1-1 island portion IP11' and a 1-2 island portion IP12', and a bypass stage GBST may be located in a 3-1 island portion IP31' and a 3-2 island portion IP32'. However, unlike a case where one stage is located in one driver island portion DIP of FIG. 24, in an embodiment as shown in FIG. 25, only one stage may be located in two driver island portions DIP. In an embodiment, an $n^{th}$ emission control stage EMSTn may be located in the 1-1 island portion IP11', and the emission control stage EMST may not be located in the 1-2 island portion IP12'. In another embodiment, a part of the $n^{th}$ emission stage EMSTn may be located in the 1-1 island portion IP11', and another part EMSTn' of the $n^{th}$ emission stage may be located in the 1-2 island portion IP12'. That is, the $n^{th}$ emission control stage EMST may be divided and located in the 1-1 island portion IP11' and the 1-2 island portion IP12'.

Likewise, an $n^{th}$ bypass stage GBSTn may be located in the 3-1 island portion IP31', and the bypass stage GBST may not be located in the 3-2 island portion IP32'. In another embodiment, a part of the $n^{th}$ bypass stage GBSTn may be located in the 3-1 island portion IP31', and another part GBSTn' of the $n^{th}$ bypass stage may be located in the 3-2 island portion IP32'. That is, the $n^{th}$ bypass stage GBST may be divided and located in the 3-1 island portion IP31' and the 3-2 island portion IP32'.

According to an embodiment, only a first emission control output wiring EMO1 may be located in a 1-1 bridge portion BP11', a 2-1 bridge portion BP21', a 3-1 bridge portion BP31', and a 4-1 bridge portion BP41', and only a first bypass output wiring GBO1 may be located in a 3-2 bridge portion BP32' and a 4-2 bridge portion BP42'. Accordingly, the first emission control output wiring EMO1 and a first initialization output wiring GIO1 may be located in a 5-1 bridge portion BP51' and a 6-1 bridge portion BP61', and the first bypass output wiring GBO1 and a second initialization output wiring GIO2 may be located in a 5-2 bridge portion BP52' and a 6-2 bridge portion BP62'. Likewise, the first emission control output wiring EMO1, the first initialization output wiring GIO1, and a first data write output wiring GWO1 may be located in a 7-1 bridge portion BP71' and an 8-1 bridge portion BP81', and the first bypass output wiring GBO1, the second initialization output wiring GIO2, and a second data write output wiring GWO2 may be located in a 7-2 bridge portion BP72' and a 8-2 bridge portion BP82'.

That is, one output wiring may be located in the 1-1 bridge portion BP11', the 2-1 bridge portion BP21', the 3-1 bridge portion BP31', and the 4-1 bridge portion BP41', two output wirings may be located in the 5-1 bridge portion BP51' and the 6-1 bridge portion BP61', and three output wirings may be located in the 7-1 bridge portion BP71' and the 8-1 bridge portion BP81'. In other words, because one emission control stage EMST and bypass stage GBST are located for two driver island portions DIP and the number of the emission control output wirings EMO and the bypass output wirings GBO may be reduced by one, the number of output wirings located in each peripheral bridge portion 22' may be reduced.

Because an output wiring may have a limited width in each peripheral bridge portion 22', when the number of output wirings is reduced, a width that each output wiring may have may be increased. As a result, because the display apparatus 1 according to another embodiment may ensure a wider width of an output wiring, a load of the output wiring may be further reduced.

Next, referring to FIG. 26, an initialization stage GIST and a data write stage GWST may be located in a 5-1 island portion IP51' and a 5-2 island portion IP52'. That is, in the display apparatus 1 of FIG. 26, the initialization stage GIST may be used as the data write stage GWST. In other words, the initialization stage GIST and the data write driving stage GWST may be configured as one stage. The initialization stage GIST may output not only an initialization control signal GI (see FIG. 10) but also a scan signal GW (see FIG. 10). Accordingly, each of a 7-1 island portion IP71' and a 7-2 island portion IP72' where the data write stage GWST was located may include a dummy area. For example, the 7-1 island portion IP71' may include a first dummy area DAM1 in which a dummy transistor may be located. Likewise, the 7-2 island portion IP71 may include a second dummy area DMA2 in which a dummy transistor may be located.

In other words, because an $n^{th}$ initialization stage GISTn and an $n+1^{th}$ initialization stage GISTn+1 may be located in the 5-1 island portion IP51', and the initialization stage GIST may function as the data write stage GWST, a stage may not be located in the 7-1 island portion IP71'. Accordingly, an output wiring for transmitting an output signal of the data write stage GWST may not be separately located. A first emission control output wiring EMO1 and a first initialization output wiring GIO1 may be located in a 5-1 bridge portion BP51' and a 6-1 bridge portion BP61', and a first bypass output wiring GBO1 and a second initialization output wiring GIO2 may be located in a 5-2 bridge portion BP52' and a 6-2 bridge portion BP62'. Only the first emission control output wiring EMO1 and the first initialization output wiring GIO1 may be located in a 7-1 bridge portion BP71' and an 8-1 bridge portion BP81', and the first bypass output wiring GBO1 and the second initialization output wiring GIO2 may be located in a 7-2 bridge portion BP72' and an 8-2 bridge portion BP82'

That is, one output wiring may be located in the 1-1 bridge portion BP11', the 2-1 bridge portion BP21', the 3-1 bridge portion BP31', and the 4-1 bridge portion BP41', and two output wirings may be located in the 5-1 bridge portion BP51', the 6-1 bridge portion BP61', the 7-1 bridge portion BP71' and the 8-1 bridge portion BP81'. In other words, as the initialization stage GIST and the data write stage GWST are configured as one stage, because a data write output wiring GWO may not be located, the number of output wirings located in the 7-1 bridge portion BP71' and the 8-1 bridge portion BP81' may be reduced.

Because an output wiring may have a limited width in each peripheral bridge portion 22', when the number of output wirings is reduced, a width that each output wiring may have may be increased. As a result, because the display apparatus 1 according to another embodiment may ensure a wider width of an output wiring, a load of the output wiring may be further reduced.

According to an embodiment, a display apparatus that may prevent damage due to concentration of stress and may be stretched in various directions may be provided. Also, a display apparatus according to an embodiment may provide an image having excellent quality by minimizing a load of an output wiring. The above effects are only an example, and the scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims.

What is claimed is:

1. A display apparatus comprising:
   a substrate comprising a display area and a non-display area surrounding the display area;
   a peripheral island portion located in the non-display area and comprising a driver island portion and a wiring island portion, which are spaced apart from each other;
   a peripheral bridge portion located in the non-display area and connecting the driver island portion to the wiring island portion;
   a gate driving circuit located in the driver island portion and comprising a plurality of stages;
   a plurality of input lines located in the wiring island portion; and
   a plurality of output wirings connected to the gate driving circuit and extending toward the display area,
   wherein number of output wirings of the plurality of output wirings and located on the peripheral bridge portion gradually increases as the output wirings of the plurality of output wirings are closer to the display area.

2. The display apparatus of claim 1, wherein a width of each of the output wirings of the plurality of output wirings gradually decreases as the output wirings of the plurality of output wirings are closer to the display area.

3. The display apparatus of claim 2, wherein a width of the peripheral bridge portion in the non-display area is constant, wherein the output wirings of the plurality of output wirings are spaced apart from each other and each have a maximum width in the peripheral bridge portion.

4. The display apparatus of claim 1, wherein the driver island portion and the wiring island portion are alternately arranged along a same row extending in a certain direction.

5. The display apparatus of claim 4, wherein the output wirings located on the peripheral bridge portion include output wirings electrically connected to stages of the plurality of stages located in the driver island portion located in the same row as the peripheral bridge portion but farther from the display area than the peripheral bridge portion.

6. The display apparatus of claim 4, wherein the gate driving circuit comprises a first gate driving circuit to an $n^{th}$ gate driving circuit sequentially arranged along the direction, and n is a natural number of 2 or more,
   wherein the first gate driving circuit is an outermost gate driving circuit from among the first gate driving circuit to the $n^{th}$ gate driving circuit, and
   the $n^{th}$ gate driving circuit is located closer to the display area than an $n-1^{th}$ gate driving circuit.

7. The display apparatus of claim 6, wherein
   the driver island portion comprises a first driver island portion in which the first gate driving circuit is located to an $n^{th}$ driver island portion in which the $n^{th}$ gate driving circuit is located, and
   the peripheral bridge portion comprises a first peripheral bridge portion connected to the first driver island portion to an $n^{th}$ peripheral bridge portion connected to the $n^{th}$ driver island portion,
   wherein the first driver island, the first peripheral bridge portion, the $n^{th}$ driver island, and the $n^{th}$ peripheral bridge portion are arranged along the same row.

8. The display apparatus of claim 7, wherein, in the first peripheral bridge portion, a same number of output wirings, of the plurality of output wirings, as a total number of stages of the plurality of stages and located in the first driver island portion are located.

9. The display apparatus of claim 7, wherein, in the $n^{th}$ peripheral bridge portion, a same number of output wirings, of the plurality of output wirings, as a total number of stages of the plurality of stages and located in the first driver island portion to the $n^{th}$ driver island portion are located.

10. The display apparatus of claim 7, wherein a width of an output wiring of the plurality of output wirings and located in the $n^{th}$ peripheral bridge portion is less than a width of an output wiring of the plurality of output wirings and located in the $n-1^{th}$ peripheral bridge portion.

11. The display apparatus of claim 7, wherein, in the $n^{th}$ driver island portion, pre-output wirings of the plurality of output wirings and connected to stages of the plurality of stages and located in the first driver island portion to an $n-1^{th}$ driver island portion are located.

12. The display apparatus of claim 11, wherein, in the $n^{th}$ peripheral bridge portion, the pre-output wirings, and an output wiring of the plurality of output wirings and connected to a stage located in the $n^{th}$ driver island portion are located.

13. The display apparatus of claim 11, wherein the pre-output wiring located in the $n^{th}$ driver island portion extends around an outer circumference of a stage of the plurality of stages and located in the $n^{th}$ driver island portion.

14. The display apparatus of claim 13, wherein
   an output wiring of the plurality of output wirings and connected to the stage located in the $n^{th}$ driver island portion is located at a center of the $n^{th}$ peripheral bridge portion, and
   the pre-output wirings are located on an outer side of the $n^{th}$ peripheral bridge portion.

15. The display apparatus of claim 11, wherein the pre-output wiring located in the $n^{th}$ driver island portion extends to pass through a space defined by stages of the plurality of stages and located in the $n^{th}$ driver island portion and spaced apart from each other.

16. The display apparatus of claim 15, wherein
   output wirings of the plurality of output wirings connected to the stages located in the $n^{th}$ driver island portion are located on an outer side of the $n^{th}$ peripheral bridge portion, and the pre-output wirings are located at a center of the $n^{th}$ peripheral bridge portion.

17. The display apparatus of claim 1, wherein the gate driving circuit comprises at least one of an emission control driving circuit, a bypass driving circuit, an initialization driving circuit, and a data write driving circuit.

18. The display apparatus of claim 17, wherein the plurality of output wirings comprises at least one of an emission control output wiring configured to transmit an output signal of the emission control driving circuit, a bypass output wiring configured to transmit an output signal of the bypass driving circuit, an initialization output wiring configured to transmit an output signal of the initialization driving circuit, and a data write output wiring configured to transmit an output signal of the data write driving circuit.

19. The display apparatus of claim 18, wherein, in the gate driving circuit, the emission control driving circuit, the bypass driving circuit, the initialization driving circuit, and the data write driving circuit are sequentially arranged in this order from an outer side of the display apparatus toward the display area.

20. The display apparatus of claim 18, wherein the peripheral bridge portion is provided in plurality, and in a peripheral bridge portion extending toward the display area from among the plurality of peripheral bridge portions and connected to the driver island portion in which the emission control driving circuit is located, the emission control output wiring is located.

21. The display apparatus of claim 18, wherein the peripheral bridge portion is provided in plurality, and in a peripheral bridge portion extending toward the display area from among the plurality of peripheral bridge portions and connected to the driver island portion in which the bypass driving circuit is located, the emission control output wiring and the bypass output wiring are located.

22. The display apparatus of claim 18, wherein the peripheral bridge portion is provided in plurality, and in a peripheral bridge portion extending toward the display area from among the plurality of peripheral bridge portions and connected to the driver island portion in which the initialization driving circuit is located, the emission control output wiring, the bypass output wiring, and the initialization output wiring are located.

23. The display apparatus of claim 18, wherein the peripheral bridge portion is provided in plurality, and in a peripheral bridge portion extending toward the display area from among the plurality of peripheral bridge portions and connected to the driver island portion in which the data write driving circuit is located, the emission control output wiring, the bypass output wiring, the initialization output wiring, and the data write output wiring are located.

24. The display apparatus of claim 18, wherein a width of the emission control output wiring gradually decreases in an order of a driver island portion in which the bypass driving circuit is located, a driver island portion in which the initialization driving circuit is located, and a driver island portion in which the data write driving circuit is located.

25. The display apparatus of claim 17, wherein
two stages of the initialization driving circuit and two stages of the data write driving circuit are located in the driver island portion, and
one stage of the emission control driving circuit and one stage of the bypass driving circuit are located in the driver island portion.

26. The display apparatus of claim 17, wherein
one stage of the initialization driving circuit and one stage of the data write driving circuit each are located in one driver island portion, and
one stage of the emission control driving circuit and one stage of the bypass driving circuit each are located in two driver island portions.

27. The display apparatus of claim 17, wherein a stage of the initialization driving circuit and a stage of the data write driving circuit are located in one driver island portion.

28. The display apparatus of claim 27, wherein the stage of the initialization driving circuit and the stage of the data write driving circuit are configured as one stage.

29. The display apparatus of claim 1, further comprising
a plurality of main island portions spaced apart from each other in the display area; and
a main bridge portion connecting main island portions arranged adjacent to each other from among the plurality of main island portions.

30. The display apparatus of claim 29, wherein a planar area of the peripheral island portion is greater than a planar area of one of the plurality of main island portions.

31. The display apparatus of claim 30, wherein the peripheral bridge portion extends from a center of a side of the peripheral island portion.

32. The display apparatus of claim 30, wherein at least one of the plurality of stages is located in the driver island portion.

33. The display apparatus of claim 29, wherein a planar area of the peripheral island portion is the same as a planar area of one of the plurality of main island portions.

34. The display apparatus of claim 33, wherein the peripheral bridge portion extends from a corner of the peripheral island portion.

35. The display apparatus of claim 33, wherein one of the plurality of stages is located in the driver island portion.

* * * * *